United States Patent
Ma et al.

(10) Patent No.: US 10,784,893 B2
(45) Date of Patent: Sep. 22, 2020

(54) METHOD AND APPARATUS FOR LOW DENSITY PARITY CHECK CHANNEL CODING IN WIRELESS COMMUNICATION SYSTEM

(71) Applicant: Huawei Technologies Co., Ltd., Shenzhen (CN)

(72) Inventors: Liang Ma, Shanghai (CN); Chen Zheng, Shanghai (CN); Xiaojian Liu, Shenzhen (CN); Yuejun Wei, Shanghai (CN); Xin Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/525,076

(22) Filed: Jul. 29, 2019

(65) Prior Publication Data

US 2019/0349006 A1 Nov. 14, 2019

Related U.S. Application Data

(63) Continuation of application No. PCT/CN2018/081003, filed on Mar. 29, 2018.

(30) Foreign Application Priority Data

Jun. 27, 2017 (CN) .......................... 2017 1 0502600
Jul. 13, 2017 (CN) .......................... 2017 1 0572348

(51) Int. Cl.
*H03M 13/11* (2006.01)
*H03M 13/00* (2006.01)
*H04L 1/00* (2006.01)

(52) U.S. Cl.
CPC ..... *H03M 13/1148* (2013.01); *H03M 13/616* (2013.01); *H04L 1/0057* (2013.01); *H04L 1/0076* (2013.01)

(58) Field of Classification Search
CPC ........... H03M 13/1148; H03M 13/616; H03M 13/116; H04L 1/0067; H04L 1/0076; H04L 1/0057
See application file for complete search history.

(56) References Cited

U.S. PATENT DOCUMENTS 10,432,219 B2 * 10/2019 Zheng .................. H03M 13/116
2014/0215285 A1 7/2014 Wu
(Continued)

FOREIGN PATENT DOCUMENTS

| CN | 101834613 A | 9/2010 |
| CN | 104821831 A | 8/2015 |

(Continued)

OTHER PUBLICATIONS

"pCR 45.820 NB M2M—Uplink Forward Error Correction," 3GPP TSG GERAN Adhoc #3, Kista, Sweden, GPC150318, pp. 1-26, 3rd Generation Partnership Project, Valbonne, France (Jun. 29-Jul. 2, 2015).

(Continued)

*Primary Examiner* — Guy J Lamarre
(74) *Attorney, Agent, or Firm* — Leydig, Voit & Mayer, Ltd.

(57) ABSTRACT

A low density parity check (LDPC) channel encoding method for use in a wireless communications system includes a communication device encoding an input bit sequence by using a LDPC matrix to obtain an encoded bit sequence for transmission. The LDPC matrix is obtained based on a lifting factor Z and a base matrix. The encoding method can be used in various communications systems including the fifth generation (5G) telecommunication systems, and can support various encoding requirements for information bit sequences with different code lengths.

28 Claims, 17 Drawing Sheets

(56) References Cited

U.S. PATENT DOCUMENTS

| | | | |
|---|---|---|---|
| 2014/0229789 A1* | 8/2014 | Richardson | H03M 13/1168 714/752 |
| 2014/0298132 A1 | 10/2014 | Wu et al. | |
| 2015/0381205 A1 | 12/2015 | Zhang et al. | |
| 2016/0173132 A1* | 6/2016 | Cho | H03M 13/1154 714/752 |
| 2016/0218750 A1* | 7/2016 | Ma | H03M 13/1102 |
| 2017/0230058 A1 | 8/2017 | Xu et al. | |
| 2018/0323801 A1* | 11/2018 | Hsu | H03M 13/116 |
| 2019/0229751 A1* | 7/2019 | Kim | H03M 13/00 |
| 2019/0245654 A1* | 8/2019 | Richardson | H04L 1/0056 |
| 2019/0393890 A1* | 12/2019 | Montorsi | H03M 13/1157 |

FOREIGN PATENT DOCUMENTS

| | | |
|---|---|---|
| CN | 104868925 A | 8/2015 |
| CN | 106685586 A | 5/2017 |
| CN | 106849958 A | 6/2017 |

OTHER PUBLICATIONS

Gallager, "Low-Density Parity-Check Codes," IRE Transactions on Information Theory, pp. 1-8, IRE Professional Group on Information Theory, New York, New York (1962).

"3rd Generation Partnership Project; Technical Specification Group Radio Access Network; NR; NR and NG-RAN Overall Description; Stage 2 (Release 15)," 3GPP TS 38.300 V0.4.1, pp. 1-55, 3rd Generation Partnership Project, Valbonne, France (Jun. 2017).

"3rd Generation Partnership Project; Technical Specification Group Radio Access Network; NR; Radio Resource Control (RRC); Protocol specification (Release 15)," 3GPP TS 38.331 V0.0.4, pp. 1-22, 3rd Generation Partnership Project, Valbonne, France (Jun. 2017).

"3rd Generation Partnership Project; Technical Specification Group Radio Access Network; NR; Multiplexing and channel coding (Release 15)," 3GPP TS 38.212 V0.0.0, 3rd Generation Partnership Project, Valbonne, France (May 2017).

"3rd Generation Partnership Project; Technical Specification Group Radio Access Network; NR; Physical layer measurements (Release 15)," 3GPP TS 38.215 V0.0.0, pp. 1-6, 3rd Generation Partnership Project, Valbonne, France (May 2017).

"3rd Generation Partnership Project; Technical Specification Group Radio Access Network; NR; Medium Access Control (MAC) protocol specification (Release 15)," 3GPP TS 38.321 V0.0.4, pp. 1-31, 3rd Generation Partnership Project, Valbonne, France (Jun. 2017).

"3rd Generation Partnership Project; Technical Specification Group Radio Access Network; NG Radio Access Network (NG-RAN); NG Application Protocol (NGAP) (Release 15)," 3GPP TS 38.413 V0.1.0, pp. 1-80, 3rd Generation Partnership Project, Valbonne, France (May 2017).

"3rd Generation Partnership Project; Technical Specification Group Radio Access Network; NG Radio Access Network (NG-RAN); Xn application protocol (XnAP) (Release 15)," 3GPP TS 38.423 V0.1.1, pp. 1-53, 3rd Generation Partnership Project, Valbonne, France (Jun. 2017).

"LDPC design for eMBB data," 3GPP TSG RAN WG1 Meeting #89, Hangzhou, China, R1-1706970, pp. 1-11, 3rd Generation Partnership Project, Valbonne, France (May 15-19, 2017).

3rd Generation Partnership Project; Technical Specification Group Radio Access Network; NR; Physical channels and modulation (Release 15), 3GPP TS 38.211 V0.0.1, pp. 1-21, 3rd Generation Partnership Project, Valbonne, France (Jun. 2017).

"WF on LDPC parity check matrices," 3GPP TSG RAN WG1 NR AH#2, Qingdao, China, R1-1711982, pp. 1-2, 3rd Generation Partnership Project, Valbonne, France (Jun. 27-30, 2017).

\* cited by examiner

METHOD AND APPARATUS FOR LOW DENSITY PARITY CHECK CHANNEL CODING IN WIRELESS COMMUNICATION SYSTEM

CROSS-REFERENCE TO RELATED APPLICATIONS

This application is a continuation of International Application No. PCT/CN2018/081003, filed on Mar. 29, 2018, which claims priority to Chinese Patent Application No. 201710572348.1, filed on Jul. 13, 2017 and Chinese Patent Application No. 201710502600.1, filed on Jun. 27, 2017. All of the aforementioned patent applications are hereby incorporated by reference in their entireties.

TECHNICAL FIELD

Embodiments of the present application relate to the communications field, and in particular, to an information processing method and a communications apparatus.

BACKGROUND

Low density parity check (LDPC) code is a type of linear block code with a sparse parity-check matrix, and is characterized by a flexible structure and low decoding complexity. Because decoding the LDPC code uses a partially parallel iterative decoding algorithm, the LDPC code has a higher throughput than a conventional turbo code. The LDPC code may be used as an error-correcting code in a communications system, so as to increase channel transmission reliability and power utilization. LDPC code may be further widely applied to space communication, fiber-optic communication, personal communications systems, Asymmetric Digital Subscriber Line (ADSL), magnetic recording devices, and the like. Currently, LDPC code scheme has been considered as one of channel coding schemes in the 5th generation mobile communication.

In practical applications, LDPC matrices characterized by different special structures may be used. An LDPC matrix H, having a special structure, may be obtained by expanding an LDPC base matrix having a quasi cyclic (QC) structure. A coding scheme using QC-LDPC matrices is suitable for hardware with a high degree of parallelism, and provides a higher throughput. QC-LDPC is suitable for hardware with a high degree of parallelism, and provides a higher throughput. The LDPC matrix may be designed to applicable to channel coding.

SUMMARY

Embodiments of the present application provide an information processing method, and a communications apparatus and system, to support encoding and decoding of information bit sequences of a plurality of lengths.

According to a first aspect, an encoding method and an encoder are provided. The encoder encodes an input sequence by using a low density parity check LDPC matrix.

According to a second aspect, a decoding method and a decoder are provided. The decoder decodes an input sequence by using a low density parity check LDPC matrix.

In a first implementation of the first aspect or the second aspect, the LDPC matrix is obtained based on a lifting factor Z and a base matrix.

Based on the foregoing implementation, a base matrix of a base graph 30a may include row 0 to row 4 and column 0 to column 26 in one of matrices 30b-10, 30b-11, 30b-20, 30b-21, 30b-30, 30b-40, 30b-50, 30b-60, 30b-70, and 30b-80, or the base matrix includes row 0 to row 4 and some of column 0 to column 26 in one of matrices 30b-10, 30b-11, 30b-20, 30b-21, 30b-30, 30b-40, 30b-50, 30b-60, 30b-70, and 30b-80, or the base matrix may be a matrix obtained by performing row/column permutation on a matrix including row 0 to row 4 and column 0 to column 26 in one of matrices 30b-10 to 30b-80, or the base matrix may be a matrix obtained by performing row/column permutation on a matrix including row 0 to row 4 and some of column 0 to column 26 in one of matrices 30b-10, 30b-11, 30b-20, 30b-21, 30b-30, 30b-40, 30b-50, 30b-60, 30b-70, and 30b-80.

Further, the base matrix of the base graph 30a may further include row 0 to row (m−1) and column 0 to column (n−1) in the one of the matrices 30b-10, 30b-11, 30b-20, 30b-21, 30b-30, 30b-40, 30b-50, 30b-60, 30b-70, and 30b-80, or the base matrix may be a matrix obtained by performing row/column permutation on a matrix including row 0 to row (m−1) and column 0 to column (n−1) in the one of the matrices 30b-10, 30b-11, 30b-20, 30b-21, 30b-30, 30b-40, 30b-50, 30b-60, 30b-70, and 30b-80, where $5 \leq m \leq 46$, and $27 \leq n \leq 68$.

To support different code block lengths, an LDPC code needs different lifting factors Z. Based on the foregoing implementation, in a possible implementation, based on the different lifting factors Z, base matrices corresponding to different lifting factors Z are used. For example, $Z = a \times 2^j$, $0 \leq j < 7$, and $a \in \{2,3,5,7,9,11,13,15\}$.

If a=2, the base matrix may include row 0 to row 4 and column 0 to column 26 in the matrix 30b-10 or 30b-11, or the base matrix includes row 0 to row 4 and some of column 0 to column 26 in the matrix 30b-10 or 30b-11. Further, the base matrix further includes row 0 to row (m−1) and column 0 to column (n−1) in the matrix 30b-10 or 30b-11.

If a=3, the base matrix may include row 0 to row 4 and column 0 to column 26 in the matrix 30b-20 or 30b-21, or the base matrix includes row 0 to row 4 and some of column 0 to column 26 in the matrix 30b-20 or 30b-21. Further, the base matrix further includes row 0 to row (m−1) and column 0 to column (n−1) in the matrix 30b-20 or 30b-21.

If a=5, the base matrix may include row 0 to row 4 and column 0 to column 26 in the matrix 30b-30, or the base matrix includes row 0 to row 4 and some of column 0 to column 26 in the matrix 30b-30. Further, the base matrix further includes row 0 to row (m−1) and column 0 to column (n−1) in the matrix 30b-30.

If a=7, the base matrix may include row 0 to row 4 and column 0 to column 26 in the matrix 30b-40, or the base matrix includes row 0 to row 4 and some of column 0 to column 26 in the matrix 30b-40. Further, the base matrix further includes row 0 to row (m−1) and column 0 to column (n−1) in the matrix 30b-40.

If a=9, the base matrix may include row 0 to row 4 and column 0 to column 26 in the matrix 30b-50, or the base matrix includes row 0 to row 4 and some of column 0 to column 26 in the matrix 30b-50. Further, the base matrix further includes row 0 to row (m−1) and column 0 to column (n−1) in the matrix 30b-50.

If a=1, the base matrix may include row 0 to row 4 and column 0 to column 26 in the matrix 30b-60, or the base matrix includes row 0 to row 4 and some of column 0 to column 26 in the matrix 30b-60. Further, the base matrix further includes row 0 to row (m−1) and column 0 to column (n−1) in the matrix 30b-60.

If a=13, the base matrix may include row 0 to row 4 and column 0 to column 26 in the matrix 30b-70, or the base matrix includes row 0 to row 4 and some of column 0 to column 26 in the matrix 30b-70. Further, the base matrix further includes row 0 to row (m−1) and column 0 to column (n−1) in the matrix 30b-70.

If a=15, the base matrix may include row 0 to row 4 and column 0 to column 26 in the matrix 30b-80, or the base matrix includes row 0 to row 4 and some of column 0 to column 26 in the matrix 30b-80. Further, the base matrix further includes row 0 to row (m−1) and column 0 to column (n−1) in the matrix 30b-80.

The base matrix may be a matrix obtained by performing row/column permutation on the aforementioned base matrices.

Further, alternatively, based on the foregoing implementations, the LDPC matrix may be obtained based on the lifting factor Z and a matrix Hs obtained by offsetting each of the foregoing base matrices, or may be obtained based on the lifting factor Z and a matrix obtained by performing row/column permutation on a matrix Hs obtained by offsetting each of the foregoing base matrices. The offsetting each of the foregoing base matrices may comprise: increasing or decreasing shift values greater than or equal to 0 in one or more columns by an offset.

The base graph and the base matrices of the LDPC matrix in the foregoing implementations can meet performance requirements of code blocks of a plurality of block lengths.

Based on any one of the foregoing aspects or the possible implementations of the aspects, in another possible implementation, the method further includes: determining the lifting factor Z. For example, a value of the lifting factor Z is determined based on a length K of the input sequence. A minimum value $Z_0$ that meets $Kb \cdot Z_0 \geq K$ may be determined from a supported lifting factor set as a value of the lifting factor Z. In a possible design, Kb may be a column count of columns corresponding to information bits in a base matrix of the LDPC code. For example, for the base graph 30a, Kb=22. In another possible design, a value of Kb may vary with a value of K, but does not exceed the column count of columns corresponding to information bits in a base matrix of the LDPC code. For example, when K is greater than a first threshold, Kb=22; when K is less than or equal to a first threshold, Kb=21. Alternatively, when K is greater than a first threshold, Kb=22; when K is less than or equal to a first threshold and is greater than a second threshold, Kb=21; when K is less than or equal to a second threshold, Kb=20.

The lifting factor Z may be determined by the encoder or the decoder based on the length K of the input sequence, or may be determined by another component and provided to the encoder or the decoder as an input parameter.

Optionally, the LDPC matrix may be obtained based on the obtained lifting factor Z and a base matrix corresponding to the lifting factor Z.

In a second implementation of the first aspect or the second aspect, the LDPC matrix is obtained based on the lifting factor Z and parameters of the LDPC matrix.

The parameters of the LDPC matrix may include a row index, a column position in which a non-zero-element is located, and a shift value of the non-zero-element, and are stored in terms of Table 3-10, Table 3-11, Table 3-20, Table 3-21, Table 3-30, Table 3-40, Table 3-50, Table 3-60, Table 3-70, and Table 3-80. The parameters may further include a row weight. Column positions in which the non-zero-element is located are in one-to-one correspondence with shift values of the non-zero-element.

Therefore, the encoder encodes the input sequence based on the lifting factor Z and the parameters of the LDPC matrix. Parameters stored based on Table 3-10 are corresponding to the matrix 30b-10, parameters stored based on Table 3-11 are corresponding to the matrix 30b-11, parameters stored based on Table 3-20 are corresponding to the matrix 30b-20, parameters stored based on Table 3-21 are corresponding to the matrix 30b-21, parameters stored based on Table 3-30 are corresponding to the matrix 30b-30, parameters stored based on Table 3-40 are corresponding to the matrix 30b-40, parameters stored based on Table 3-50 are corresponding to the matrix 30b-50, parameters stored based on Table 3-60 are corresponding to the matrix 30b-60, parameters stored based on Table 3-70 are corresponding to the matrix 30b-70, and parameters stored based on Table 3-80 are corresponding to the matrix 30b-80.

For a communications device at a transmit-end, the encoding an input sequence by using an LDPC matrix may include: encoding the input sequence by using the LDPC matrix corresponding to the lifting factor Z; or encoding the input sequence by using a matrix, wherein the matrix is obtained by performing row/column permutation on the LDPC matrix corresponding to the lifting factor Z. In this application, the row/column permutation refers to row permutation, column permutation, or row permutation and column permutation.

For a communications device at a receive-end, the decoding an input sequence by using an LDPC matrix includes: decoding the input sequence by using the LDPC matrix corresponding to the lifting factor Z; or decoding the input sequence by using a matrix, wherein the matrix is obtained by performing row/column permutation on the LDPC matrix corresponding to the lifting factor Z. In this application, the row/column permutation refers to row permutation, column permutation, or row permutation and column permutation.

In a possible implementation, the LDPC matrix may be stored in a memory, and the input sequence is encoded by using the LDPC matrix, or permutation (row/column permutation) or lifting is performed based on the LDPC matrix, to obtain an LDPC matrix that can be used for encoding.

In another possible implementation, one or more parameters may be stored, an LDPC matrix used for encoding or decoding may be obtained based on the one or more parameters, and therefore the input sequence can be encoded or decoded based on the LDPC matrix. The one or more parameters include at least one of the following: a base graph, a base matrix, a permutated matrix obtained by performing row/column permutation based on a base graph or a base matrix, an lifted matrix based on a base graph or a base matrix, a shift value of a non-zero-element in a base matrix, or any parameter related to obtaining of the LDPC matrix.

In still another possible implementation, the base matrix of the LDPC matrix may be stored in a memory.

In still another possible implementation, the base graph of the LDPC matrix may be stored in a memory, and shift values of the non-zero-elements in the base matrix of the LDPC matrix may be stored in the memory.

In still another possible implementation, the parameters of the LDPC matrix are stored in a memory in terms of Table 3-10 to Table 3-80.

Based on the foregoing possible implementations, in a possible design, at least one of a base graph and a base matrix that are used for LDPC encoding or decoding is obtained by performing row permutation, or column permutation, or row permutation and column permutation on at least one of the base graph and the base matrix of the foregoing LDPC matrix.

According to a third aspect, a communications apparatus is provided. The communications apparatus may include a corresponding module configured to perform the foregoing method designs. The module may be software and/or hardware.

In a possible design, the communications apparatus provided in the third aspect includes a processor and a transceiver component. The processor and the transceiver component may be configured to implement functions of the foregoing encoding or decoding method. In the design, if the communications apparatus is a terminal, a base station, or another network device, the transceiver component of the communications apparatus may be a transceiver; if the communications apparatus is a baseband chip or a baseband processing board, the transceiver component of the communications apparatus may be an input/output circuit of the baseband chip or the baseband processing board, and is configured to receive/send an input/output signal. Optionally, the communications apparatus may further include a memory, configured to store data and/or an instruction.

In an implementation, the processor may include the encoder according to the first aspect and a determining unit. The determining unit is configured to determine a lifting factor Z required for encoding an input sequence. The encoder is configured to encode the input sequence by using an LDPC matrix corresponding to the lifting factor Z.

In another implementation, the processor may include the decoder according to the second aspect and an obtaining unit. The obtaining unit is configured to obtain soft values of the LDPC code and a lifting factor Z. The decoder is configured to decode the soft values of the LDPC code based on a base matrix $H_B$ corresponding to the lifting factor Z, to obtain an information bit sequence.

According to a fourth aspect, a communications apparatus is provided, including one or more processors.

In a possible design, the one or more processors may implement functions of the encoder in the first aspect. In another possible design, the encoder in the first aspect may be a part of the processor. The processor may implement other functions in addition to functions of the encoder in the first aspect.

In a possible design, the one or more processors may implement functions of the decoder described in the second aspect. In another possible design, the decoder in the second aspect may be a part of the processor.

Optionally, the communications apparatus may further include a transceiver and an antenna.

Optionally, the communications apparatus may further include a component configured to generate a transport block CRC, a component configured to perform code block segmentation and CRC attachment, an interleaver configured to perform interleaving, a modulator configured to perform modulation processing, or the like.

Optionally, the communications apparatus may further include a demodulator configured to perform demodulation, a deinterleaver configured to perform deinterleaving, a component configured to perform de-rate matching, or the like. Functions of these components may be implemented by using the one or more processors.

In a possible design, functions of these components may be implemented by using the one or more processors.

According to a fifth aspect, an embodiment of the present application provides a communications system. The system includes the communications apparatus described in the third aspect.

According to a sixth aspect, an embodiment of the present application provides a communications system. The system includes one or more communications apparatuses described in the fourth aspect.

According to another aspect, an embodiment of the present application provides a computer storage medium. The computer storage medium stores a program, and when the program is executed on a computer, the computer performs a method according to any of the foregoing aspects.

According to still another aspect of this application, a computer program product including instructions is provided. When the computer program product is executed on a computer, the computer performs a method according to any of the foregoing aspects.

According to the information processing method, the apparatus, the communications device, and the communications system in the embodiments of the present application, flexible code length and code rate requirements of a system can be met in terms of encoding performance and an error floor.

BRIEF DESCRIPTION OF DRAWINGS

FIG. 3a is a schematic diagram of a base graph of an LDPC code according to an embodiment of the present application;

FIG. 3b-1 is a schematic diagram of a base matrix according to an embodiment of the present application;

FIG. 3b-2 is a schematic diagram of another base matrix according to an embodiment of the present application;

FIG. 3b-3 is a schematic diagram of another base matrix according to an embodiment of the present application;

FIG. 3b-4 is a schematic diagram of another base matrix according to an embodiment of the present application;

FIG. 3b-5 is a schematic diagram of another base matrix according to an embodiment of the present application;

FIG. 3b-6 is a schematic diagram of another base matrix according to an embodiment of the present application;

FIG. 3b-7 is a schematic diagram of another base matrix according to an embodiment of the present application;

FIG. 3b-8 is a schematic diagram of another base matrix according to an embodiment of the present application;

FIG. 3b-9 is a schematic diagram of another base matrix according to an embodiment of the present application;

FIG. 3b-10 is a schematic diagram of another base matrix according to an embodiment of the present application;

FIG. 4 is a plot of performance according to an embodiment of the present application;

FIG. 5 is a flowchart of an information processing method according to another embodiment of the present application;

FIG. 6 is a flowchart of an information processing method according to another embodiment of the present application;

FIG. 7 is a schematic structural diagram of an information processing apparatus according to another embodiment of the present application;

FIG. 8 is a schematic diagram of a communications system according to another embodiment of the present application; and FIG. 9 is a schematic diagram of shift values of a base matrix according to another embodiment of the present application.

DESCRIPTION OF EMBODIMENTS

To facilitate understanding, some terms used in this application are described below.

In this application, terms "network" and "system" are usually interchangeably used, and terms "apparatus" and "device" are also usually interchangeably used. A person skilled in the art can understand meanings of the terms. A "communications apparatus" may be a chip (such as a baseband chip, a digital signal processing chip, or a general-purpose chip), a terminal, a base station, or another network device. The terminal is a device having a communication function, and may include a handheld device, an in-vehicle device, a wearable device, a computing device, another processing device connected to a wireless modem, or the like that has a wireless communication function. The terminal may have different names in different networks, for example, user equipment, a mobile station, a subscriber unit, a station, a cellular phone, a personal digital assistant, a wireless modem, a wireless communications device, a handheld device, a laptop computer, a cordless phone, and a wireless local loop station. For ease of description, these devices are briefly referred to as a terminal in this application. A base station (BS) may also be referred to as a base station device, and is a device deployed in a radio access network to provide a wireless communication function. The base station may have different names in different wireless access systems. For example, a base station in a Universal Mobile Telecommunications System (UMTS) network is referred to as a NodeB, a base station in an LTE network is referred to as an evolved NodeB (eNB or eNodeB), a base station in a new radio (NR) network is referred to as a transmission reception point (TRP) or a next generation NodeB (gNB), or a base station in another evolved network may have another name. This is not limited in the present application.

The following describes technical solutions in embodiments of the present application with reference to the accompanying drawings.

Figure 1:
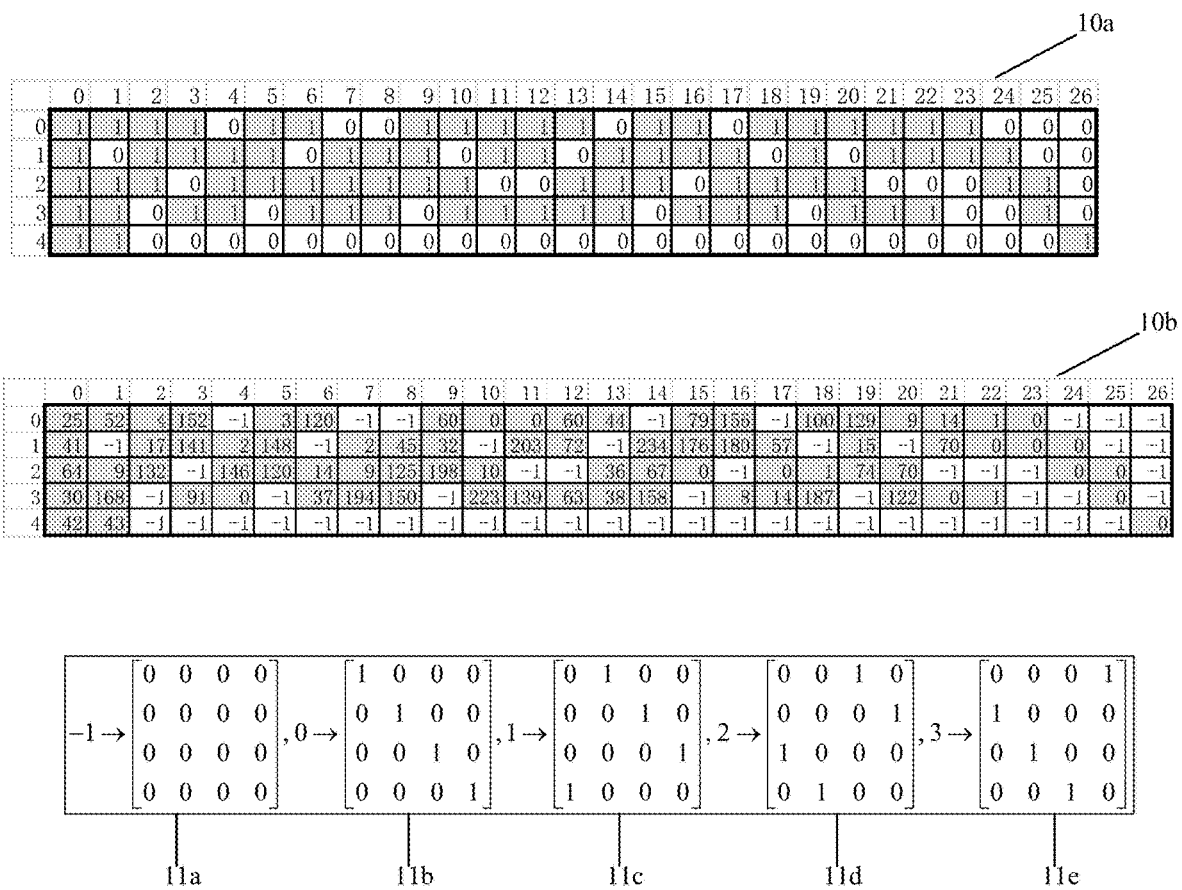
FIG. 1 is a schematic diagram of a base graph, a base matrix, and circular permutation matrices of the base matrix in an LDPC code scheme.

An LDPC code can be defined by using a parity-check matrix H. The parity-check matrix H for the LDPC code may be obtained by using a base graph and shift values. The base graph usually may include m×n matrix entries, and may be represented by using a matrix of m rows and n columns. A value of a matrix element is either 0 or 1. An element whose value is 0 is sometimes referred to as a zero-element, which may be replaced with an all zero matrix (zero matrix) of size Z×Z. An element whose value is 1 is sometimes referred to as a non-zero-element, which may be replaced with a circular permutation matrix of size Z×Z. In other words, each matrix element represents one all zero matrix or one circular permutation matrix. FIG. 1 shows an example 10a of a base graph of an LDPC code in which m=5 and n=27 and that has a QC structure. It should be noted that, in this specification, merely for ease of description, row indexes and column indexes of a base graph and a matrix are all numbered starting from 0. For example, column 0 represents a first column of the base graph and the matrix, and a first column represents a second column of the base graph and the matrix, row 0 represents a first row of the base graph and the matrix, row 1 represents a second row of the base graph and the matrix, and so on.

It may be understood that row indexes and column indexes may alternatively be numbered starting from 1, and in this case, row indexes and column indexes shown in this specification are increased by 1 to obtain corresponding row indexes and column indexes. For example, if row indexes or column indexes are numbered starting from 1, column 1 represents a first column of the base graph and the matrix, column 2 represents a second column of the base graph and the matrix, row 1 represents a first row of the base graph and the matrix, row 2 represents a second row of the base graph and the matrix, and so on. It should be understood that the rows and the columns of the base graph or the base matrix may be numbered by different manners, and the present application is not limited by any particular manner of numbering.

If a value of an element in row i and column j in the base graph is 1, and a shift value of the element is $P_{i,j}$, where $P_{i,j}$ is an integer greater than or equal to 0, it indicates that the element can be replaced with a circular permutation matrix of size Z×Z corresponding to $P_{i,j}$. The circular permutation matrix may be obtained by circularly shifting an identity matrix of size Z×Z to the right for $P_{i,j}$ times. It can be learned that each element whose value is 0 in the base graph is replaced with an all zero matrix of size Z×Z, and each element whose value is 1 is replaced with a circular permutation matrix of size Z×Z corresponding to a shift value of the element, to obtain the parity check matrix of the LDPC code. The base graph may be used to indicate positions of shift values, and each non-zero-element in the base graph is corresponding to a shift value. Z is a positive integer, and may also be referred to as a lifting factor, or sometimes may be referred to as a lifting size, a lifting factor, or the like. Z may be determined based on a code block size supported by a system and size of information data. It can be learned that the parity check matrix H has a size of (m×Z)*(n×Z). For example, if the lifting factor Z is 4, each zero-element is replaced with an all zero matrix of size 4×4 11a. If $P_{2,3}$ is 2, a non-zero-element in row 2 and column 3 is replaced with a 4×4 circular permutation matrix 11d, and the matrix 11d is obtained by circularly shifting a 4×4 identity matrix 11b to the right twice. If $P_{2,4}$ is 0, a non-zero-element in row 2 and column 4 is replaced with the identity matrix 11b. It should be noted that only examples are described herein, and the examples do not constitute a limitation.

Value of $P_{i,j}$ may depend on the lifting factor Z, for an element of 1 (a non-zero-element) in row i and column j of the base graph, $P_{i,j}$ may be different for different lifting factors Z. For ease of implementation, a base matrix of m rows and n columns, which is sometimes referred to as a parity check matrix (PCM), may be defined in the system. Elements in the base matrix are in one-to-one correspondence with elements in the base graph. A zero-element in the base graph has a same position in the base matrix. In the matrix, a zero-element is represented by a value −1 or a null value. A non-zero-element in row i and column j, whose value is 1 in the base graph, corresponds to a non-zero-element at a same position in the base matrix. The non-zero-element is represented by a value $P_{i,j}$, where $P_{i,j}$ may be a shift value defined relative to a preset or a particular lifting factor Z. In the embodiments of this application, the base matrix is sometimes also referred to as a shift matrix of a base graph.

As shown in FIG. 1, 10b is a base matrix corresponding to the base graph 10a.

Generally, the base graph or the base matrix of the LDPC code may further include p columns corresponding to built-in puncture bits, and p may be an integer ranging from 0 to 2. These columns may be used in encoding, but system bits corresponding to the encoding using the columns corresponding to built-in puncture bits are not sent. A code rate of the base matrix of the LDPC code meets R=(n−m) (n−p). Using the base graph 10a as an example, if there are two columns corresponding to built-in puncture bits, a code rate is (27−5)/(27−2)=0.88, which is approximate to 8/9.

An LDPC code used in a wireless communications system is a QC-LDPC code, and a matrix part that is corresponding to parity bits of the QC-LDPC code has a bi-diagonal structure or a raptor-like structure. This can simplify encoding and support incremental redundancy hybrid repeat. In a decoder for the QC-LDPC code, a QC-LDPC shift network (QSN), a Banyan network, or a Benes network is usually used to implement circularly shifting of information.

A base graph of the QC-LDPC code with the raptor-like structure is a matrix of m rows and n columns. The base graph may include five submatrices: A, B, C, D, and E, where a weight of a matrix is determined by a quantity of non-zero-elements, a weight of a row (row weight) refers to a quantity of non-zero-elements in a row, a weight of a column (column weight) refers to a quantity of non-zero-elements in a column. As shown in 200 in FIG. 2:

Submatrix A is a matrix including $m_A$ rows and $n_A$ columns, and a size of the submatrix A is $m_A \times n_A$. Each column is corresponding to Z systematic bits in the LDPC code, and a systematic bit is sometimes referred to as an information bit.

Submatrix B is a matrix including $m_A$ rows and $m_A$ columns, and a size of the submatrix B is $m_A \times m_A$. Each column is corresponding to Z parity bits in the LDPC code. The submatrix B includes a submatrix B' with a bi-diagonal structure and a matrix column whose column weight is 3 (for short, weight-3 column), and the weight-3 column may be located at the left side of the submatrix B', as shown in 20a in FIG. 2. The submatrix B may further include one or more matrix columns whose column weights are 1 (for short, weight-1 column). For example, a possible implementation is shown in 20b or 20c in FIG. 2.

Usually, a matrix generated based on the submatrix A and the submatrix B may be referred to as a core matrix, and may be used to support high code rate encoding.

Submatrix C is an all zero matrix, and has a size of $m_A \times m_D$.

Submatrix E is an identity matrix, and has a size of $m_D \times m_D$.

Submatrix D has a size of $m_D \times (n_A + m_A)$, and may be usually used to generate parity bits for low code rate.

It may be understood that the base graph is described above from a mathematical definition perspective. Because submatrix C is an all zero matrix and E is an identity matrix, in a possible implementation, a matrix including the submatrix A and the submatrix B, or a matrix including the submatrix A, the submatrix B, and the submatrix D may be used to simply represent a base graph of a matrix in encoding or decoding.

Because the submatrix C and the submatrix E have relatively definite structures, structures of the submatrix A, the submatrix B, and the submatrix D are one of factors affecting encoding and decoding performance of the LDPC code.

When an LDPC matrix with a raptor-like structure is used for encoding, in a possible implementation, the matrix including the submatrix A and the submatrix B, in other words, the core matrix, may be first used for encoding to obtain one or more parity bits corresponding to the submatrix B, and then the entire matrix is used for encoding to obtain one or more parity bits corresponding to the submatrix E. Because the submatrix B may include a submatrix B' with the bi-diagonal structure and one or more weight-1 columns, during encoding, parity bits corresponding to the bi-diagonal structure may be first obtained, and then parity bits corresponding to the weight-1 columns may be obtained.

The following provides an exemplary encoding implementation. It is assumed that the core matrix including the submatrix A and the submatrix B is $H_{core}$. A last row and a last column in the $H_{core}$ are removed from $H_{core}$, in other words, a weight-1 column and a row in which a non-zero-element in the weight-1 column is located in the $H_{core}$ are removed from $H_{core}$, to obtain a matrix $H_{core}$-dual. Parity bits part of the $H_{core}$-dual is represented by $H_e = [H_{e1}\ H_{e2}]$. $H_{e1}$ is a weight-3 column, and $H_{e2}$ has a bi-diagonal structure. According to a definition of the LDPC matrix, $H_{core-dual} \cdot [S\ P_e]^T = 0$, where S is an input sequence and is represented by a vector of information bits, $P_e$ is a vector including parity bits, and $[S\ P_e]^T$ represents a transposed matrix formed by the input sequence S and $P_e$. Therefore, parity bits corresponding to $H_{core-dual}$ may be first calculated based on the input sequence S and $H_{core-dual}$, where the input sequence S includes all information bits. Then parity bits corresponding to one or more weight-1 columns in the submatrix B are calculated based on the obtained parity bits corresponding to $H_{core-dual}$ and the input sequence S. In this case, all parity bits corresponding to the submatrix B may be obtained. Then parity bits corresponding to the submatrix E are obtained by encoding the submatrix D and based on the input sequence S and the parity bits corresponding to the submatrix B. Thus all information bits and all parity bits are obtained. These bits form an encoded sequence, in other words, LDPC codeword(s).

Optionally, LDPC code encoding may further include a shortening operation and a puncturing operation. The shortened bits and punctured bits are not sent.

The shortening is usually performed starting from the last bit of information bits, and may be performed in different manners. For example, for a quantity of shortened bits is so, the last so bits in the input sequence S may be set as known bits, for example, set to 0 or null or another value, to obtain an input sequence S', and then the input sequence S' is encoded by using an LDPC matrix. For another example, the last (so mod Z) bits in the input sequence S may be set as known bits, for example, set to 0 or null or another value, to obtain an input sequence S', and the last $$\left\lfloor \frac{s_0}{Z} \right\rfloor$$

columns in the submatrix A are deleted to obtain an LDPC matrix H', and the input sequence S' is encoded by using the LDPC matrix H', or the last $$\left\lfloor \frac{s_0}{Z} \right\rfloor$$

columns in the submatrix A do not participate in encoding of the input sequence S'. After the encoding, the shortened bits are not sent.

The puncturing may be performed on built-in puncture bit(s) or parity bit(s) in an input sequence. Puncturing parity bit(s) is/are usually performed starting from the last bit in parity bits. Alternatively, puncturing parity bit(s) may be performed according to a preset puncturing order of the system. In a possible implementation, an input sequence is first encoded, and then based on a quantity p of bits that need to be punctured, the last p bit(s) in parity bits is/are selected or p bit(s) is/are selected based on the puncturing sequence preset in the system, where the p bit(s) is/are not sent. In another possible implementation, p columns corresponding to punctured bits in a matrix and p rows in which non-zero-elements in these columns are located may be determined, and the rows and the columns do not participate in encoding, and therefore, no corresponding parity bits are generated.

It should be noted that the encoding implementation is merely used as an example herein, and another encoding implementation known to a person skilled in the art may be used based on the base graph and/or the base matrices provided in this application, and no limitation is imposed in this application. Decoding in this application may be performed using a plurality of decoding methods, for example, a min-sum (MS) decoding method or a belief propagation decoding method. The MS decoding method is sometimes also referred to as a flood MS decoding method. For example, an input sequence is initialized and an iteration is performed on the initialized input sequence. Hard decision detection is performed after the iteration, and a hard decision result is checked. If the decoding result meets a parity check equation, decoding succeeds, iteration processing ends, and the decision result is output. If a decoding result does not meet a parity check equation, an iteration is performed again within a maximum quantity of iteration times. If the check still fails when the maximum quantity of iteration times is reached, the decoding fails. It may be understood that a person skilled in the art may understand a principle of the MS decoding is conventionally known, and details are not described herein.

It should be noted that the decoding method is merely used as an example herein, and another known decoding method to a person skilled in the art may be used based on the base graph and/or the base matrix provided in this application, and no limitation is imposed in this application.

Figure 3A:
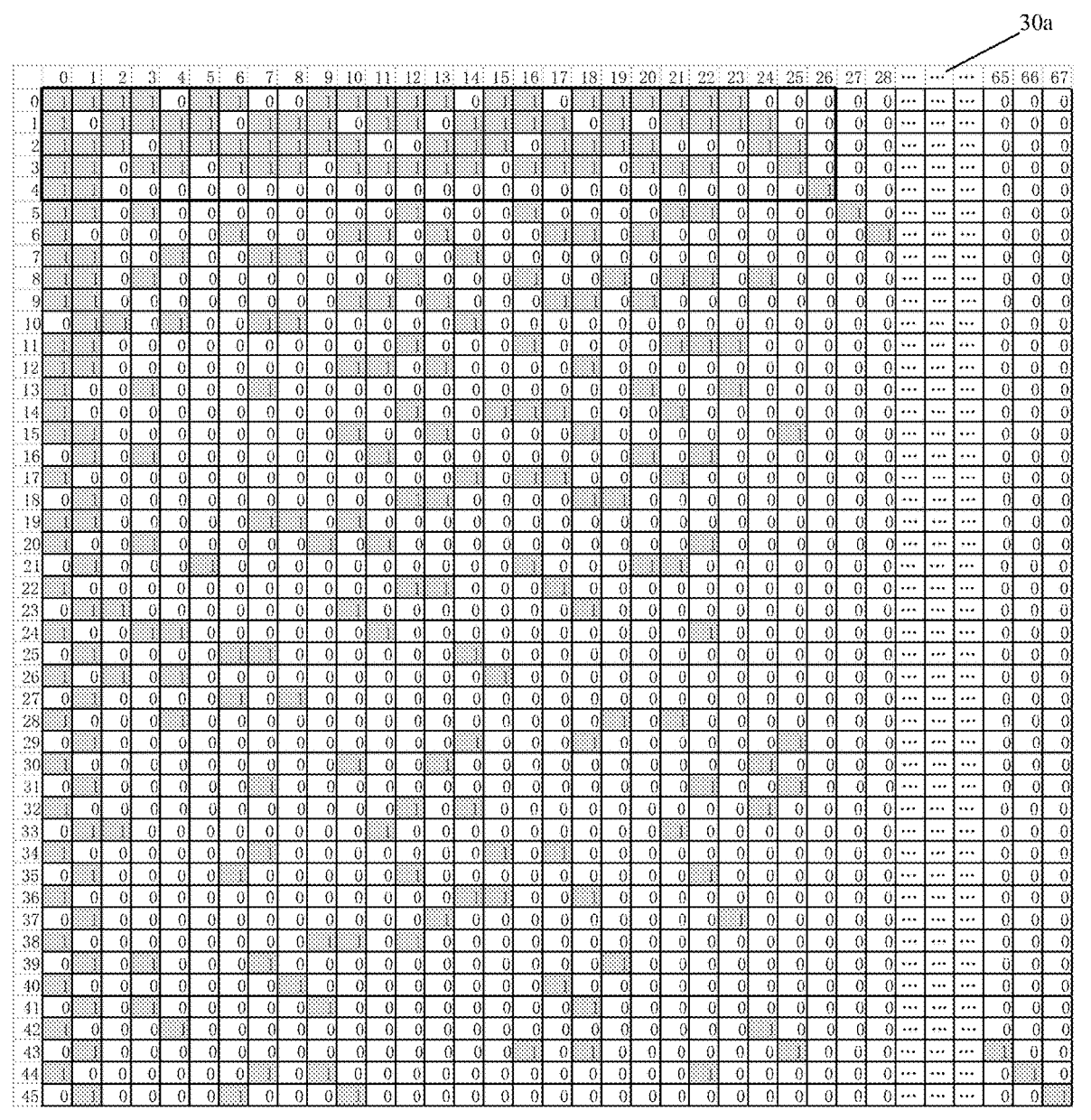

An LDPC code may be usually obtained based on a design of a base graph or a base matrix. For example, an upper limit of performance of the LDPC code may be determined by performing density evolution on the base graph or the base matrix, and an error floor of the LDPC code is determined based on shift values in the base matrix. Improving encoding or decoding performance, and lowering the error floor are some objectives of designing the base graph and the base matrix. Code lengths are widely varied in a wireless communications system. For example, a code length may be 2560 bits, 38400 bits, or the like. FIG. 3a shows an example of a base graph 30a of an LDPC code. FIG. 3b-1 to FIG. 3b-10 are examples of base matrices of the base graph 30a, and performance requirements of various block lengths can be met. For ease of description and understanding, row indexes and column indexes are separately shown on the uppermost side and the leftmost side in FIG. 3a, and FIG. 3b-1 to 3b-10.

FIG. 3a shows an example of a base graph 30a of an LDPC code. In the figure, 0 to 67 (that is, column 0 to column 67) in the uppermost row indicate column indexes, and 0 to 45 (that is, row 0 to row 45) in the leftmost column indicate row indexes. That is, the base graph has a size of 46 rows and 68 columns.

In an implementation, submatrix A and submatrix B may be considered as a core matrix of the base graph of the LDPC code, and may be used for high code rate encoding. A matrix including 5 rows and 27 columns as shown in the base graph 10a may be a core matrix of the base graph, which is a matrix including 5 rows and 27 columns.

In an implementation, the submatrix A may include one or more columns corresponding to built-in puncture bits, for example, may include two columns corresponding to built-in puncture bits. After the puncturing, a code rate that can be supported by the core matrix is 0.88.

The submatrix B may include a weight-3 column, that is, a column weight of column 0 of the submatrix B (column 22 of the core matrix) is 3. The submatrix B has a bi-diagonal structure which includes column 1 to column 3 (column 23 to column 25 of the core matrix) and row 0 to row 3 of the submatrix, and the submatrix B further includes a weight-1 column (column 26 of the core matrix).

In an implementation, submatrix A may be corresponding to systematic bits. The systematic bits are sometimes referred to as information bits. The submatrix A has a size of $m_A$ rows and 22 columns, if $m_A=5$, and the submatrix A includes elements in row 0 to row 4 and column 0 to column 21 in the base graph 30a.

In an implementation, the submatrix B may be corresponding to parity bits, the submatrix B has a size of $m_A$ rows and $m_A$ columns, and includes elements in row 0 to row 4 and column 22 to column 26 in the base graph 30a.

To obtain flexible code rates, a submatrix C, a submatrix D, and a submatrix E of corresponding sizes may be added based on the core matrix, to obtain different code rates. The submatrix C is an all zero matrix. The submatrix E is an identity matrix, sizes of the matrices are determined according to a code rate, and structures of the matrices are relatively fixed. Therefore, encoding performance and decoding performance are mainly affected by the core matrix and the submatrix D. Rows and columns are added based on the core matrix to form corresponding C, D, and E, so that different code rates can be obtained.

A column count $m_D$ of the submatrix D is a sum of a column count of the submatrix A and a column count of the submatrix B, and a row count of the submatrix D is mainly related to a code rate. The base graph 30a is used as an example. A column count of the submatrix D is 27 columns. If a code rate supported by an LDPC code is $R_m$, a base graph or a base matrix of the LDPC code has a size of m rows and n columns, where n=n+P, and $m=n-n_A=n_A/R_m+p-n_A$. If a minimum code rate $R_m$ is 1/3, and a quantity p of columns corresponding to built-in puncture bits is 2, in the example of the base graph 30a, n=68, m=46, a row count $m_D$ of the submatrix D may be up to $m-m_A=46-5=41$, and $0 \leq m_D \leq 41$.

The base graph 30a is used as an example. The submatrix D may include $m_D$ rows in row 5 to row 41 in the base graph 30a.

In this application, if there is at most one non-zero-element in a same column for two adjacent rows in a base graph, the two rows are mutually orthogonal. In other columns different from some columns for two adjacent rows in the base graph, if there is at most one non-zero-element in a same column of the other columns for two adjacent rows, the two rows are quasi-orthogonal. For example, for two adjacent rows, if there is only one non-zero element in a column other than columns corresponding to built-in puncture bits, the two adjacent rows are quasi-orthogonal.

Row 5 to row 41 in the base graph 30a may include a plurality of rows with a quasi-orthogonal structure and at least two rows with an orthogonal structure. For example, row 5 to row 41 in the base graph 30a include at least 15 rows that meet the quasi-orthogonal structure. There is at most one non-zero-element in a same column in columns other than columns corresponding to built-in puncture bits in any two adjacent rows of the 15 rows. Row 5 to row 41 in the base graph 30*a* may further include 10 to 26 rows that meet the orthogonal structure. In other words, in these rows, there is at most one non-zero-element in a same column for any two adjacent rows. In other words, there is also at most one non-zero-element in a column corresponding to the built-in puncture bits.

If $m_D$=15, the submatrix D in the base graph of the LDPC code has a size of 15 rows and 27 columns. The submatrix D may be a matrix constituted by row 5 to row 19 and column 0 to column 26 in the base graph 30*a*. A corresponding code rate supported by the LDPC code is 22/40=0.55. At this code rate, the base graph of the LDPC code is corresponding to a matrix constituted by row 0 to row 19 and column 0 to column 41 in the base graph 30*a*. The submatrix E is an identity matrix of 15 rows and 15 columns, and the submatrix C is an all zero matrix of 5 rows and 15 columns.

If $m_D$=19, the submatrix D in the base graph of the LDPC code has a size of 19 rows and 27 columns. The submatrix D may be a matrix constituted by row 5 to row 23 and column 0 to column 26 in the base graph 30*a*. A corresponding code rate supported by the LDPC code is 22/44=1/2. At this code rate, the base graph of the LDPC code is corresponding to a matrix formed by row 0 to row 23 and column 0 to column 45 in the base graph 30*a*. The submatrix E is an identity matrix of 19 rows and 19 columns, and the submatrix C is an all zero matrix of 5 rows and 19 columns.

The same is true if $m_D$ is another value, and details are not redundantly described.

In a design, row/column permutation may be performed on the base graph and/or the base matrix. In other words, row permutation, or column permutation, or row permutation and column permutation may be performed. The operation of row/column permutation does not change a row weight or a column weight, and does not change a quantity of non-zero-elements either. Therefore, a base graph and/or a base matrix obtained by row/column permutation have/has limited impact on system performance. As a whole, the impact on the system performance due to the row/column permutation is acceptable and is within a tolerable range. For example, in some scenarios or in some ranges, the performance is lowered in an allowable range, while in some scenarios or in some ranges, the performance is improved. On the whole, and overall performance is not greatly affected.

For example, row 34 and row 36 in the base graph 30*a* may be interchanged, and column 44 and column 45 may be interchanged. For another example, the submatrix D includes $m_D$ rows in a matrix F, row permutation may not be performed on the $m_D$ rows, or row permutation may be performed on one or more rows of the $m_D$ rows; and the submatrix E still has a diagonal structure, and no row permutation or column permutation is performed on the submatrix E. For example, row 27 and row 29 in the matrix F are interchanged, the submatrix D includes $m_D$ rows in the submatrix F, and the submatrix E still has a diagonal structure. It may be understood that if the base graph or the base matrix includes the submatrix D, when column interchange is performed on columns in the core matrix, column interchange needs to be performed correspondingly on the submatrix D.

Matrices 30*b*-10 to 30*b*-80 shown in FIG. 3*b*-1 to FIG. 3*b*-10 are respectively designs of a plurality of base matrices of the base graph 30*a*. A position of a non-zero-element in row i and column j, in the base graph 30*a*, in each of the matrices 30*b*-10 to 30*b*-80 is not changed, and a value of the non-zero-element in row i and column j in each of the matrices is a shift value $V_{i,j}$, and a zero-element is represented by −1 or null in the base matrix. A corresponding part of the submatrix D in the base matrices may include $m_D$ rows in row 5 to row 45 of any one of the base matrices, and a value of $m_D$ may be selected based on different code rates. It may be understood that, if the base graph is a matrix obtained by performing row/column transformation on the base graph 30*a*, the base matrix is also a matrix obtained by performing row/column transformation on any one of the matrices 30*b*-10 to 30*b*-80.

In a possible design, the base matrix of the LDPC code may include row 0 to row 4 and column 0 to column 26 in any one of the matrices 30*b*-10 to 30*b*-80 shown in FIG. 3*b*-1 to FIG. 3*b*-10. In this case, a matrix including row 0 to row 4 and column 0 to column 26 of the matrix shown in FIG. 3*b*-1 to FIG. 3*b*-10 may be used as a core matrix part of the base matrix. In this design, a structure of another part of the base matrix of the LDPC code, for example, the matrix C, the matrix D, or the matrix E, is not limited. For example, any structure shown in FIG. 3*b*-1 to FIG. 3*b*-10 may be used, or other matrix designs may be used.

In another possible design, the base matrix of the LDPC code may include: a matrix including row 0 to row (m−1) and column 0 to column (n−1) in any one of the matrices 30*b*-10 to 30*b*-80 shown in FIG. 3*b*-1 to FIG. 3*b*-10, where 5≤m≤46, m is an integer, 27≤n≤68, and n is an integer.

In this design, a structure of another part of the base matrix of the LDPC code is not limited. For example, any structure shown in FIG. 3*b*-1 to FIG. 3*b*-10 may be used, or other matrix designs may be used.

In another possible design, the base matrix of the LDPC code may include: row 0 to row 4 and some of column 0 to column 26 in any one of the matrices 30*b*-10 to 30*b*-80 shown in FIG. 3*b*-1 to FIG. 3*b*-10. For example, shortening and/or puncturing may be performed on a core matrix part (row 0 to row 4 and column 0 to column 26) of a matrix shown in FIG. 3*b*-1 to FIG. 3*b*-10. In an implementation, the base matrix of the LDPC code may not include a column corresponding to shortened and/or punctured bits.

In this design, another part of the base matrix of the LDPC code is not limited. For example, structures shown in FIG. 3*b*-1 to FIG. 3*b*-10 may be referenced, or other structures may be used.

In another possible design, the base matrix of the LDPC code may include: a matrix including row 0 to row (m−1) and some of column 0 to column (n−1) in any one of the matrices 30*b*-10 to 30*b*-80 shown in FIG. 3*b*-1 to FIG. 3*b*-10, where 5≤m≤46, m is an integer, 27≤n≤68, and n is an integer. For example, shortening and/or puncturing may be performed on row 0 to row (m−1) and column 0 to column (n−1) in any one of the matrices 30*b*-10 to 30*b*-80 shown in FIG. 3*b*-1 to FIG. 3*b*-10. In an implementation, the base matrix of the LDPC code may not include column(s) corresponding to shortened and/or punctured bit(s). In this design, another part of the base matrix of the LDPC code is not limited. For example, structures shown in FIG. 3*b*-1 to FIG. 3*b*-10 may be referenced, or another structure may be used.

In an implementation, the operation of shortening may be performed on information bits. For example, any matrix shown in FIG. 3*b*-1 to FIG. 3*b*-10 is used as an example. If one or more columns of column 0 to column 21 are shortened, the base matrix of the LDPC code may not include the one or more shortened columns of the matrices shown in FIG. 3*b*-1 to FIG. 3*b*-10. For example, if column 21 is shortened, the base matrix of the LDPC code may include: column 0 to column 20 and column 22 to column 26 in any one of the matrices 30b-10 to 30b-80. For a matrix including row 0 to row 4, column 0 to column 20, and column 22 to column 26 in any one of the matrices 30b-10 to 30b-80, a code rate supported by the matrix in this case is 7/8.

In another implementation, the puncturing may be performed on parity bits. For example, any matrix shown in FIG. 3b-1 to FIG. 3b-10 is used as an example, and one or more columns of column 22 to column 26 are punctured. The base matrix of the LDPC code may not include the punctured one or more columns in the matrices shown in FIG. 3b-1 to FIG. 3b-10. For example, if column 26 is punctured, the base matrix of the LDPC code may include: column 0 to column 25 in any one of the matrices 30b-10 to 30b-80.

Different lifting factors Z are designed for the LDPC code, to support information bit sequences of different lengths. In a possible design, different base matrices may be used for different lifting factors, to obtain relatively high performance. For example, lifting factors $Z=a \times 2^j$, where $0 \leq j < 7$, and $a \in \{2,3,5,7,9,11,13,15\}$. Table 1 is a lifting factor set {2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384} that is possibly supported. Each cell except for the uppermost row and the leftmost column represents a value of Z corresponding to corresponding values of a and j. For example, for a column in which a=2 and a row in which j=1, Z=4. For another example, for a=11 and j=3, Z=88. By analogy, details are not redundantly described.

TABLE 1

| Z | a = 2 | a = 3 | a = 5 | a = 7 | a = 9 | a = 11 | a = 13 | a = 15 |
|---|---|---|---|---|---|---|---|---|
| j = 0 | 2 | 3 | 5 | 7 | 9 | 11 | 13 | 15 |
| j = 1 | 4 | 6 | 10 | 14 | 18 | 22 | 26 | 30 |
| j = 2 | 8 | 12 | 20 | 28 | 36 | 44 | 52 | 60 |
| j = 3 | 16 | 24 | 40 | 56 | 72 | 88 | 104 | 120 |
| j = 4 | 32 | 48 | 80 | 112 | 144 | 176 | 208 | 240 |
| j = 5 | 64 | 96 | 160 | 224 | 288 | 352 | | |
| j = 6 | 128 | 192 | 320 | | | | | |
| j = 7 | 256 | 384 | | | | | | |

A lifting factor set supported by a base graph may be all or some of the lifting factors in Table 1, for example, may be {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}, in which Z is greater than or equal to 24. For another example, the lifting factor set may be a union set of one or more of {2, 3, 4, 5, 6, 7, 8, 9, 10, 11, 12, 13, 14, 15, 16, 18, 20, 22} and {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}. It should be noted that only examples are provided herein. The lifting factor set supported by the base graph may be divided into different subsets based on a value of a. For example, if a=2, a subset of the lifting factor Z may include one or more of {2, 4, 8, 16, 32, 64, 128, 256}. For another example, if a=3, a subset of the lifting factor Z may include one or more of {3, 6, 12, 24, 48, 96, 192, 384}, and so on.

The lifting factor set supported by the base graph may be divided based on different values of a, and a corresponding base matrix is determined.

If a=2, or a value of the lifting factor Z is one of {2, 4, 8, 16, 32, 64, 128, 256}, the base matrix may include row 0 to row 4 and column 0 to column 26 in the matrix 30b-10 or 30b-11; or the base matrix includes row 0 to row (m−1) and column 0 to column (n−1) in the matrix 30b-10 or 30b-11, where 5≤m≤46, m is an integer, 27≤n≤68, and n is an integer; or the base matrix includes row 0 to row (m−1) and some of column 0 to column (n−1) in the matrix 30b-10 or 30b-11, where 5≤m≤46, m is an integer, 27≤n≤68, and n is an integer.

If a=3, or a value of the lifting factor Z is one of {3, 6, 12, 24, 48, 96, 192, 384}, the base matrix may include row 0 to row 4 and column 0 to column 26 in the matrix 30b-20 or 30b-21; or the base matrix includes row 0 to row (m−1) and column 0 to column (n−1) in the matrix 30b-20 or 30b-21, where 5≤m≤46, m is an integer, 27≤n≤68, and n is an integer; or the base matrix includes row 0 to row (m−1) and some of column 0 to column (n−1) in the matrix 30b-20 or 30b-21, where 5≤m≤46, m is an integer, 27≤n≤68, and n is an integer.

If a=5, or a value of the lifting factor Z is one of {5, 10, 20, 40, 80, 160, 320}, the base matrix may include row 0 to row 4 and column 0 to column 26 in the matrix 30b-30; or the base matrix includes row 0 to row (m−1) and column 0 to column (n−1) in the matrix 30b-30, where 5≤m≤46, m is integer, 27≤n≤68, and n is an integer; or the base matrix includes row 0 to row (m−1) and some of column 0 to column (n−1) in the matrix 30b-30, where 5≤m≤46, m is an integer, 27≤n≤68, and n is an integer.

If a=7, or a value of the lifting factor Z is one of {7, 14, 28, 56, 112, 224}, the base matrix may include row 0 to row 4 and column 0 to column 26 in the matrix 30b-40; or the base matrix includes row 0 to row (m−1) and column 0 to column (n−1) in the matrix 30b-40, where 5≤m≤46, m is integer, 27≤n≤68, and n is an integer; or the base matrix includes row 0 to row (m−1) and some of column 0 to column (n−1) in the matrix 30b-40, where 5≤m≤46, m is an integer, 27≤n≤68, and n is an integer.

If a=9, or a value of the lifting factor Z is one of {9, 18, 36, 72, 144, 288}, the base matrix may include row 0 to row 4 and column 0 to column 26 in the matrix 30b-50; or the base matrix includes row 0 to row (m−1) and column 0 to column (n−1) in the matrix 30b-50, where 5≤m≤46, m is integer, 27≤n≤68, and n is an integer; or the base matrix includes row 0 to row (m−1) and some of column 0 to column (n−1) in the matrix 30b-50, where 5≤m≤46, m is an integer, 27≤n≤68, and n is an integer.

If a=11, or a value of the lifting factor Z is one of {11, 22, 44, 88, 176, 352}, the base matrix may include row 0 to row 4 and column 0 to column 26 in the matrix 30b-60; or the base matrix includes row 0 to row (m−1) and column 0 to column (n−1) in the matrix 30b-60, where 5≤m≤46, m is integer, 27≤n≤68, and n is an integer; or the base matrix includes row 0 to row (m−1) and some of column 0 to column (n−1) in the matrix 30b-60, where 5≤m≤46, m is an integer, 27≤n≤68, and n is an integer.

If a=13, or a value of the lifting factor Z is one of {13, 26, 52, 104, 208}, the base matrix may include row 0 to row 4 and column 0 to column 26 in the matrix 30b-70; or the base matrix includes row 0 to row (m−1) and column 0 to column (n−1) in the matrix 30b-70, where 5≤m≤46, m is integer, 27≤n≤68, and n is an integer; or the base matrix includes row 0 to row (m−1) and some of column 0 to column (n−1) in the matrix 30b-70, where 5≤m≤46, m is an integer, 27≤n≤68, and n is an integer.

If a=15, or a value of the lifting factor Z is one of {15, 30, 60, 120, 240}, the base matrix may include row 0 to row 4 and column 0 to column 26 in the matrix 30b-80; or the base matrix includes row 0 to row (m−1) and column 0 to column (n−1) in the matrix 30b-80, where 5≤m≤46, m is integer, 27≤n≤68, and n is an integer; or the base matrix includes row 0 to row (m−1) and some of column 0 to column (n−1) in the matrix 30b-80, where 5≤m≤46, m is an integer, 27≤n≤68, and n is an integer.

Optionally, for a base matrix for an LDPC code, shift values of non-zero-elements in one or more columns in the matrix may be increased or decreased by an offset $Offset_s$, without greatly affecting the system performance. $Offset_s$ of non-zero-elements in different columns may be the same or may be different. For example, to compensate one or more columns in the matrix, compensation values for different columns may be the same or may be different. This is not limited in this application.

Not greatly affecting the system performance means that the impact on the system performance is acceptable and is within a tolerable range as a whole. For example, the performance decreases within a tolerance range in some scenarios or in some ranges. However, in some scenarios or in some ranges, the performance improves to some extent. Overall performance is not greatly affected.

For example, each shift value greater than or equal to 0 in column s in any one of the matrices 30b-10 to 30b-80 is increased or decreased by an offset $Offset_s$, so that an offset matrix Hs of the matrix may be obtained, where $Offset_s$ is an integer greater than or equal to 0, and 0≤s≤23. $Offset_s$ of one or more columns may be the same or may be different.

Figure 4:
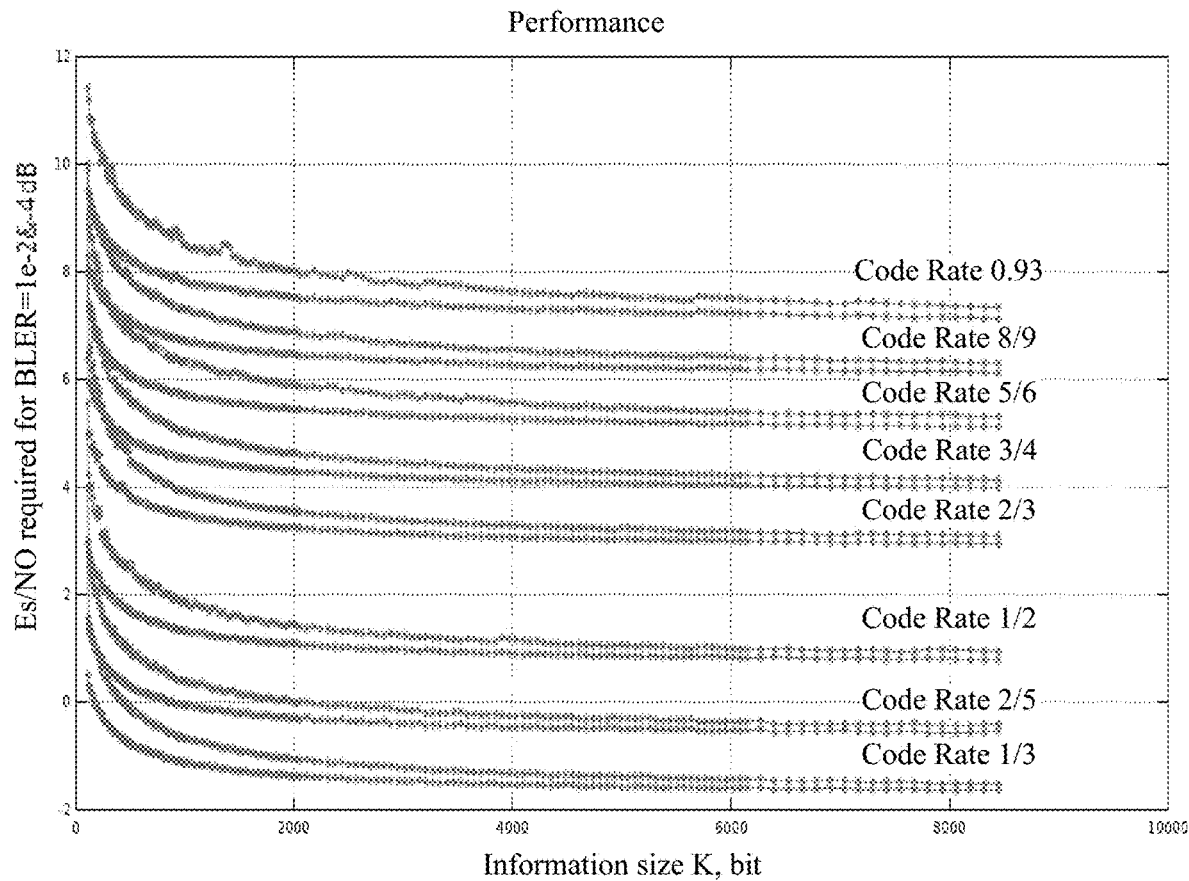

In a performance diagram shown in FIG. 4, performance curves of LDPC codes encoded based on the matrices 30b-10 to 30b-80 are shown. A horizontal coordinate represents a length of an information bit sequence, and a unit of the length is bit. A vertical coordinate is a symbol signal-to-noise ratio (Es/N0) required for reaching a corresponding BLER. Two lines of each code rate respectively are corresponding to two cases when BLERs are 0.01 and 0.0001. At a same code rate, the case when the BLER is 0.01 is corresponding to an upper curve, and the case when the BLER is 0.0001 is corresponding to a lower curve. If each curve is smooth, it indicates that the matrix has relatively good performance in cases of different code lengths.

FIG. 1 to FIG. 3a and FIG. 3b-1 to FIG. 3b-10 show structures of a base graph and a base matrix of an LDPC code. To describe designs of the base graph and/or the base matrices in the implementations of the present application, the designs may be further described in Table 2-10 and Table 2-11.

In a design, the base graph 10a in FIG. 1 is a matrix of 5 rows and 27 columns, and related parameters may be expressed in Table 2-10.

TABLE 2-10

| Row index (row index) | Row weight (row degree/ row weight) | Column index of non-zero-element (column position of non-zero element in row) |
|---|---|---|
| 0 | 19 | 0, 1, 2, 3, 5, 6, 9, 10, 11, 12, 13, 15, 16, 18, 19, 20, 21, 22, 23 |
| 1 | 19 | 0, 2, 3, 4, 5, 7, 8, 9, 11, 12, 14, 15, 16, 17, 19, 21, 22, 23, 24 |
| 2 | 19 | 0, 1, 2, 4, 5, 6, 7, 8, 9, 10, 13, 14, 15, 17, 18, 19, 20, 24, 25 |

TABLE 2-10-continued

| Row index (row index) | Row weight (row degree/ row weight) | Column index of non-zero-element (column position of non-zero element in row) |
|---|---|---|
| 3 | 19 | 0, 1, 3, 4, 6, 7, 8, 10, 11, 12, 13, 14, 16, 17, 18, 20, 21, 22, 25 |
| 4 | 3 | 0, 1, 26 |

In a design, the base matrix shown in 10b in FIG. 1 is a matrix of 5 rows and 27 columns, and related parameters may be expressed in Table 2-11.

TABLE 2-11

| Row index (row index) | Row weight (row degree/ row weight) | Column index of non-zero-element (column position of non-zero element in row) | Shift value of non-zero-element (shift value of non-zero-element in row) |
|---|---|---|---|
| 0 | 19 | 0, 1, 2, 3, 5, 6, 9, 10, 11, 12, 13, 15, 16, 18, 19, 20, 21, 22, 23 | 172, 143, 247, 249, 15, 169, 234, 136, 138, 70, 6, 207, 120, 164, 7, 218, 128, 1, 0 |
| 1 | 19 | 0, 2, 3, 4, 5, 7, 8, 9, 11, 12, 14, 15, 16, 17, 19, 21, 22, 23, 24 | 213, 67, 0, 145, 144, 21, 135, 153, 151, 88, 185, 151, 189, 13, 193, 196, 0, 0, 0 |
| 2 | 19 | 0, 1, 2, 4, 5, 6, 7, 8, 9, 10, 13, 14, 15, 17, 18, 19, 20, 24, 25 | 141, 0, 199, 140, 3, 0, 19, 1, 224, 224, 226, 156, 157, 18, 1, 0, 195, 0, 0 |
| 3 | 19 | 0, 1, 3, 4, 6, 7, 8, 10, 11, 12, 13, 14, 16, 17, 18, 20, 21, 22, 25 | 69, 27, 157, 128, 144, 0, 211, 218, 200, 128, 101, 155, 11, 55, 39, 95, 173, 1, 0 |
| 4 | 3 | 0, 1, 26 | 166, 244, 0 |

Figure 3B-1:
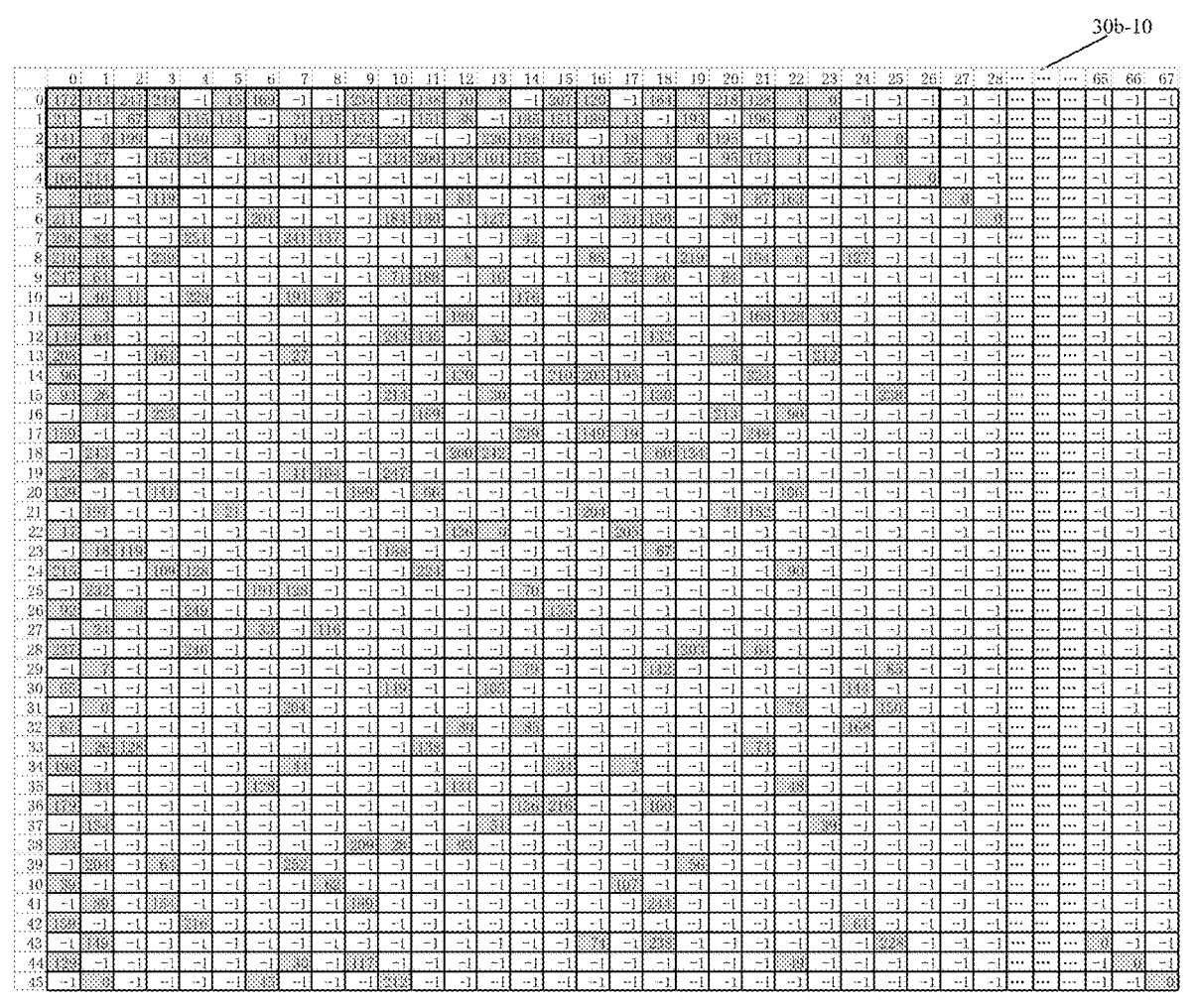
Figure 3B-2:
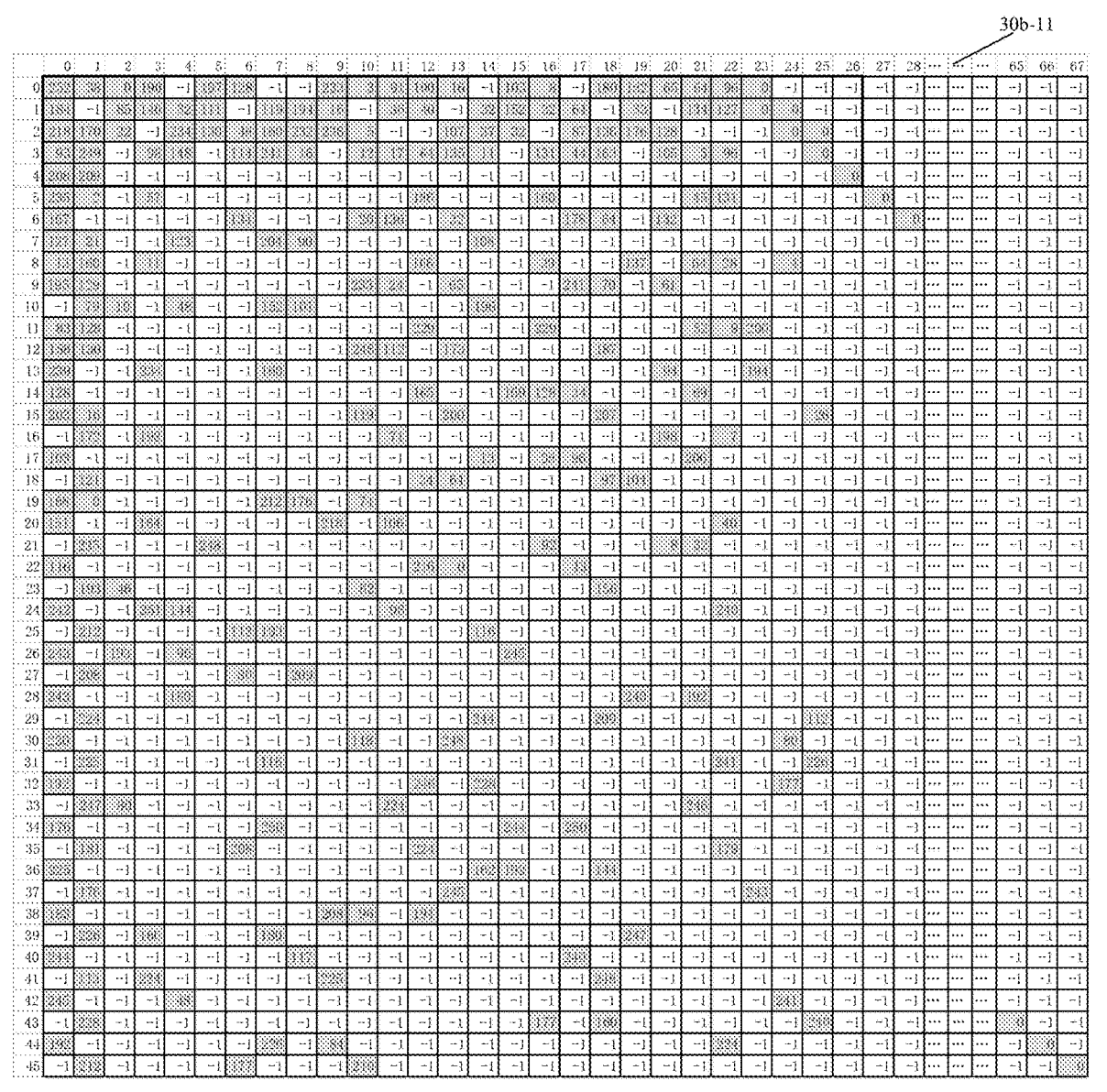
Figure 3B-3:
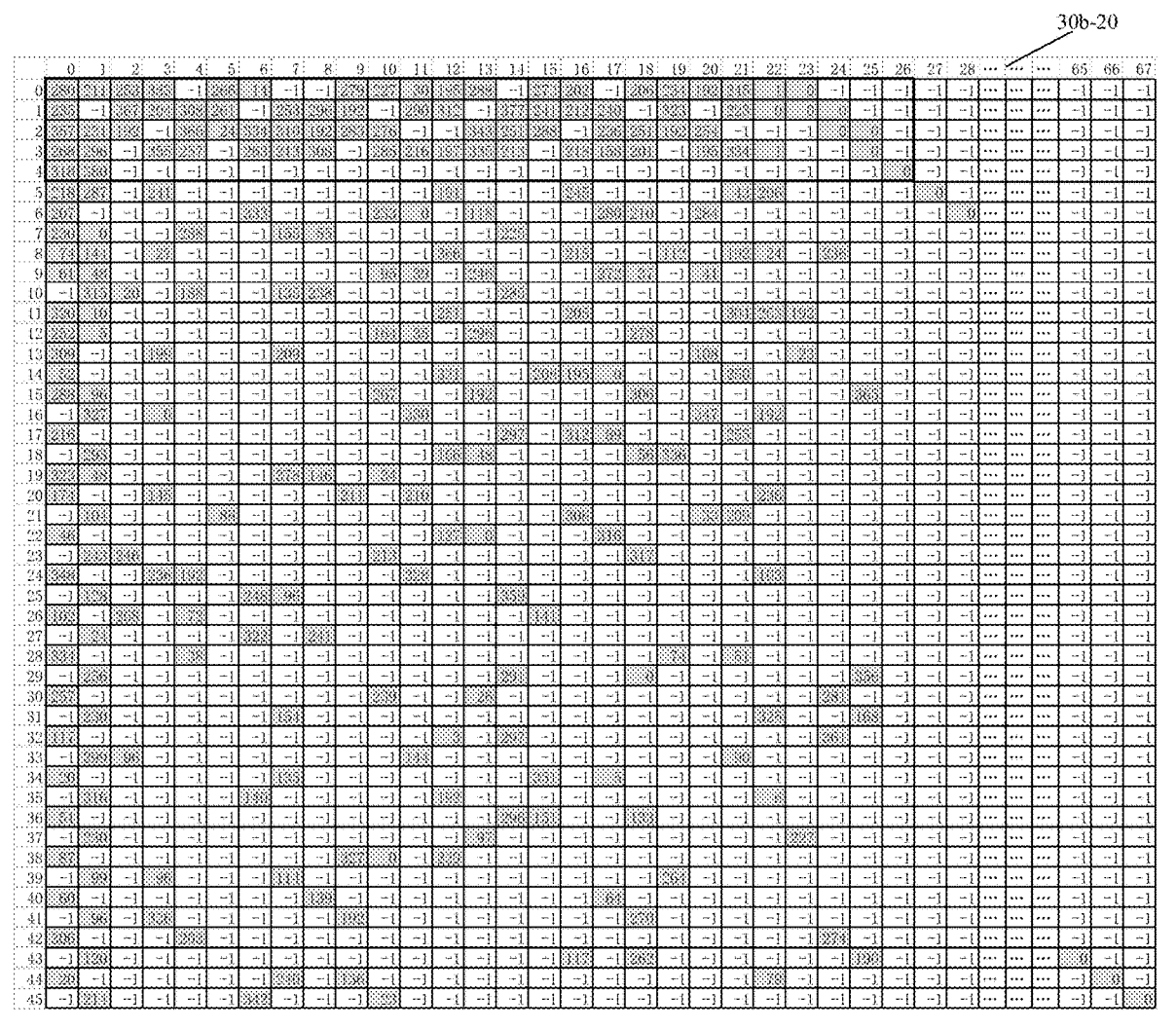
Figure 3B-4:
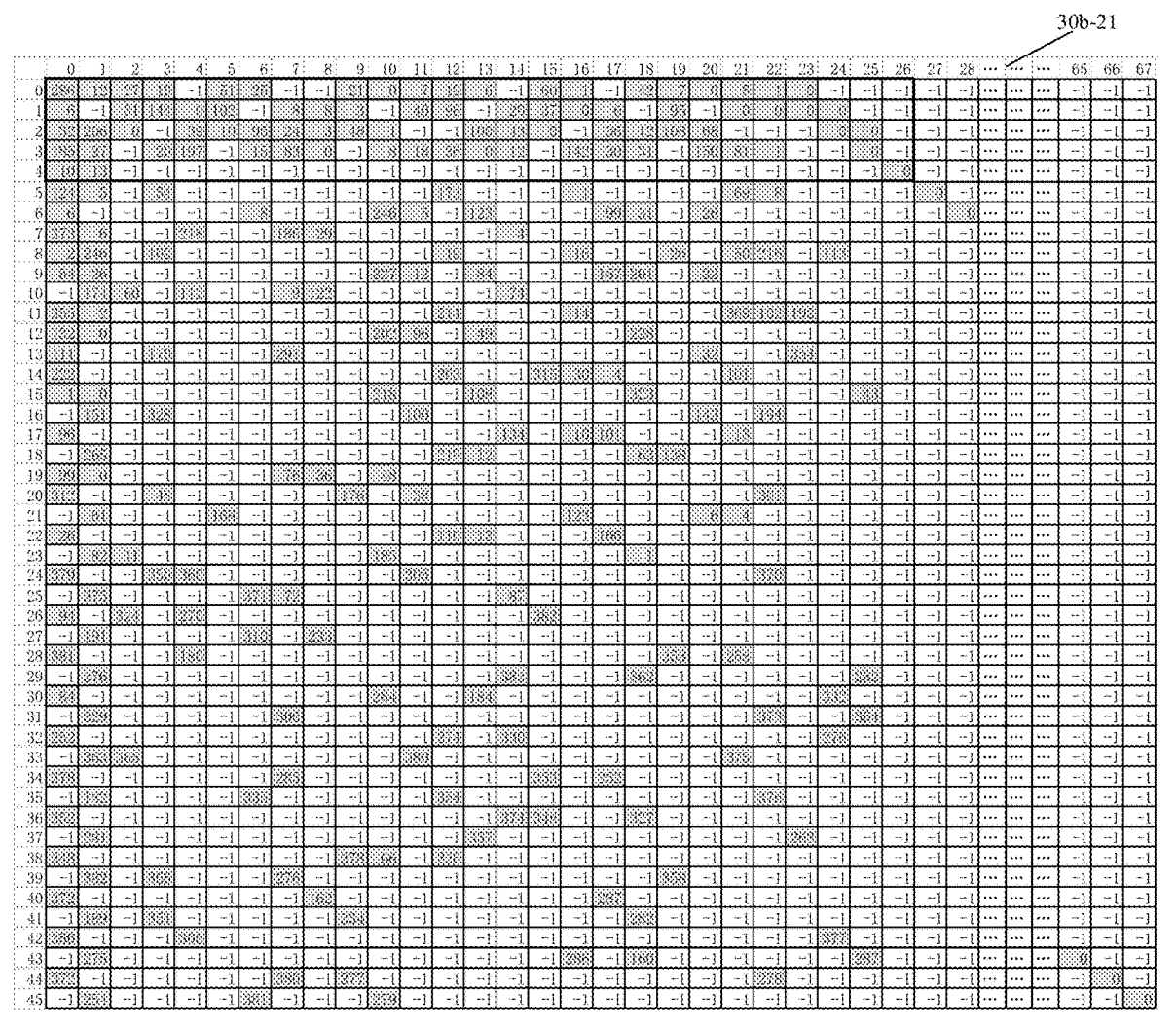
Figure 3B-5:
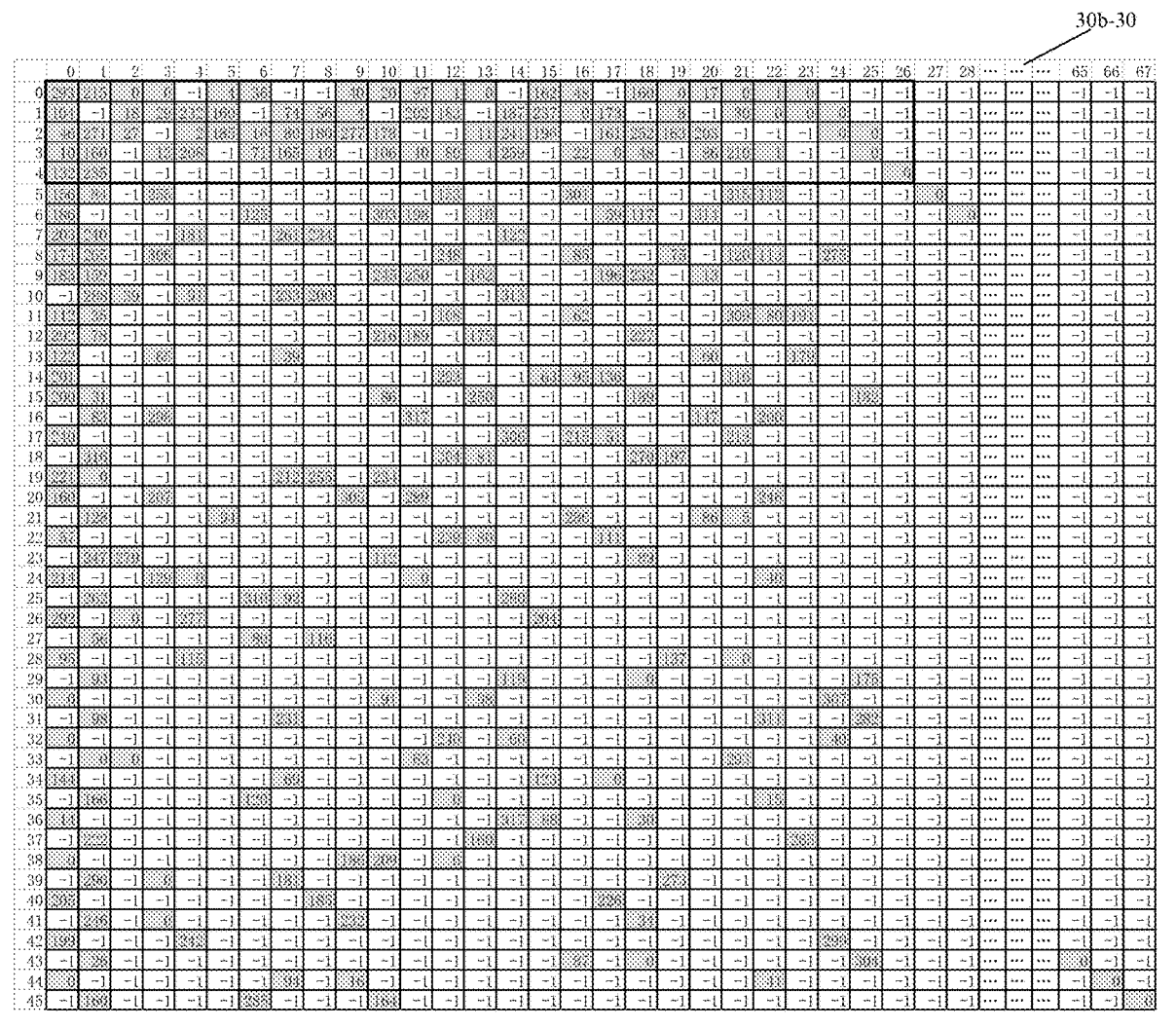
Figure 3B-6:
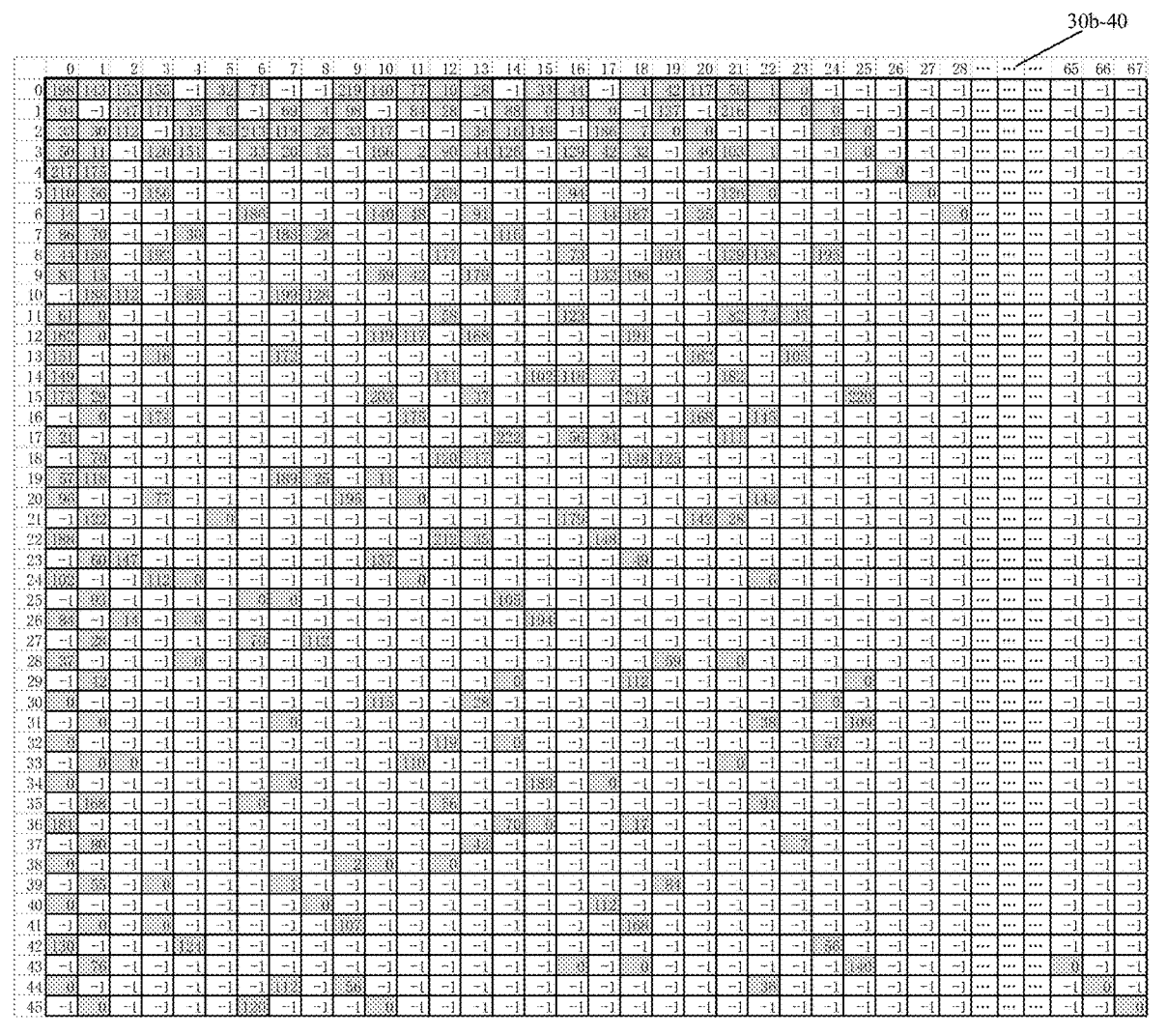
Figure 3B-7:
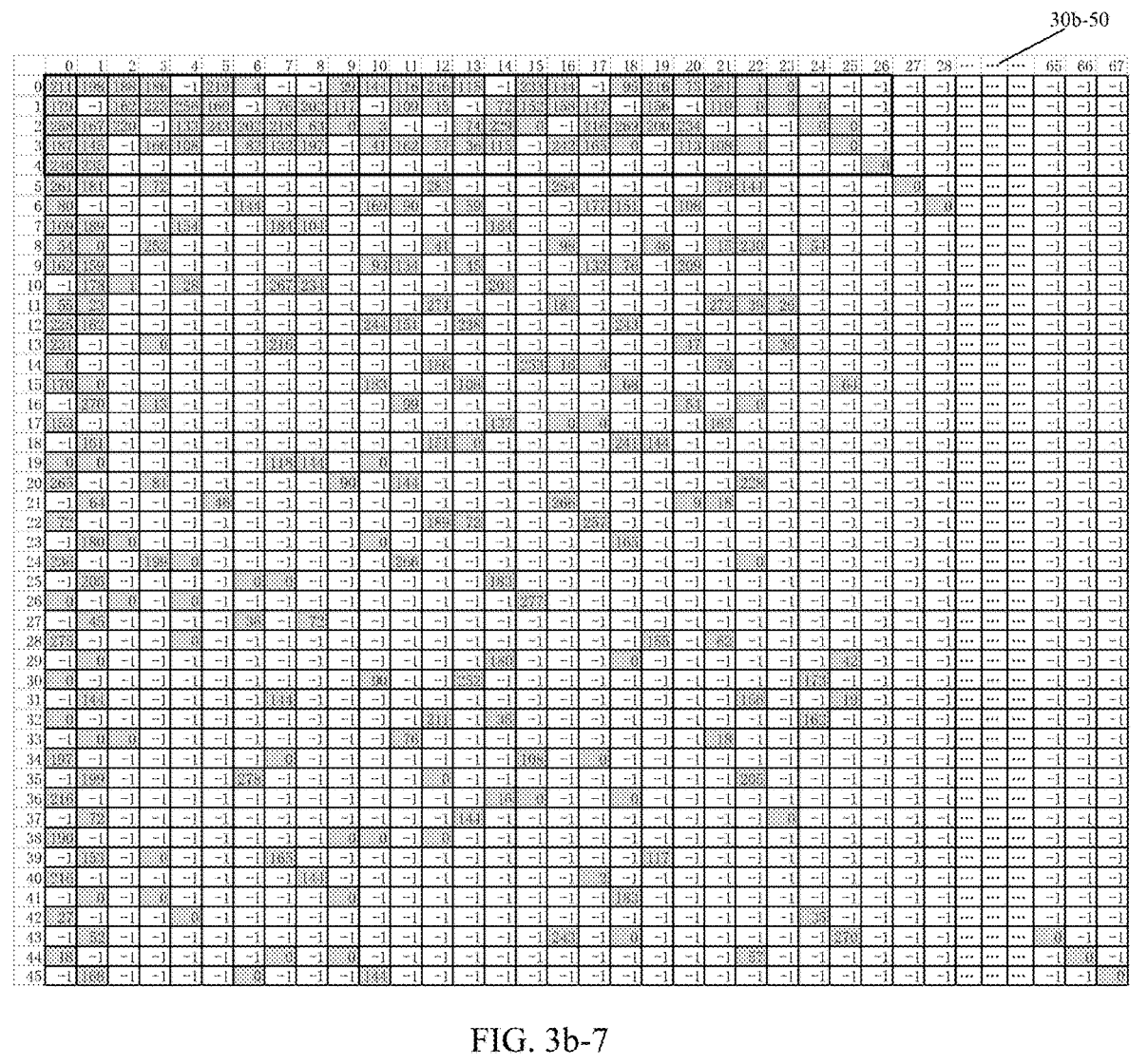
Figure 3B-8:
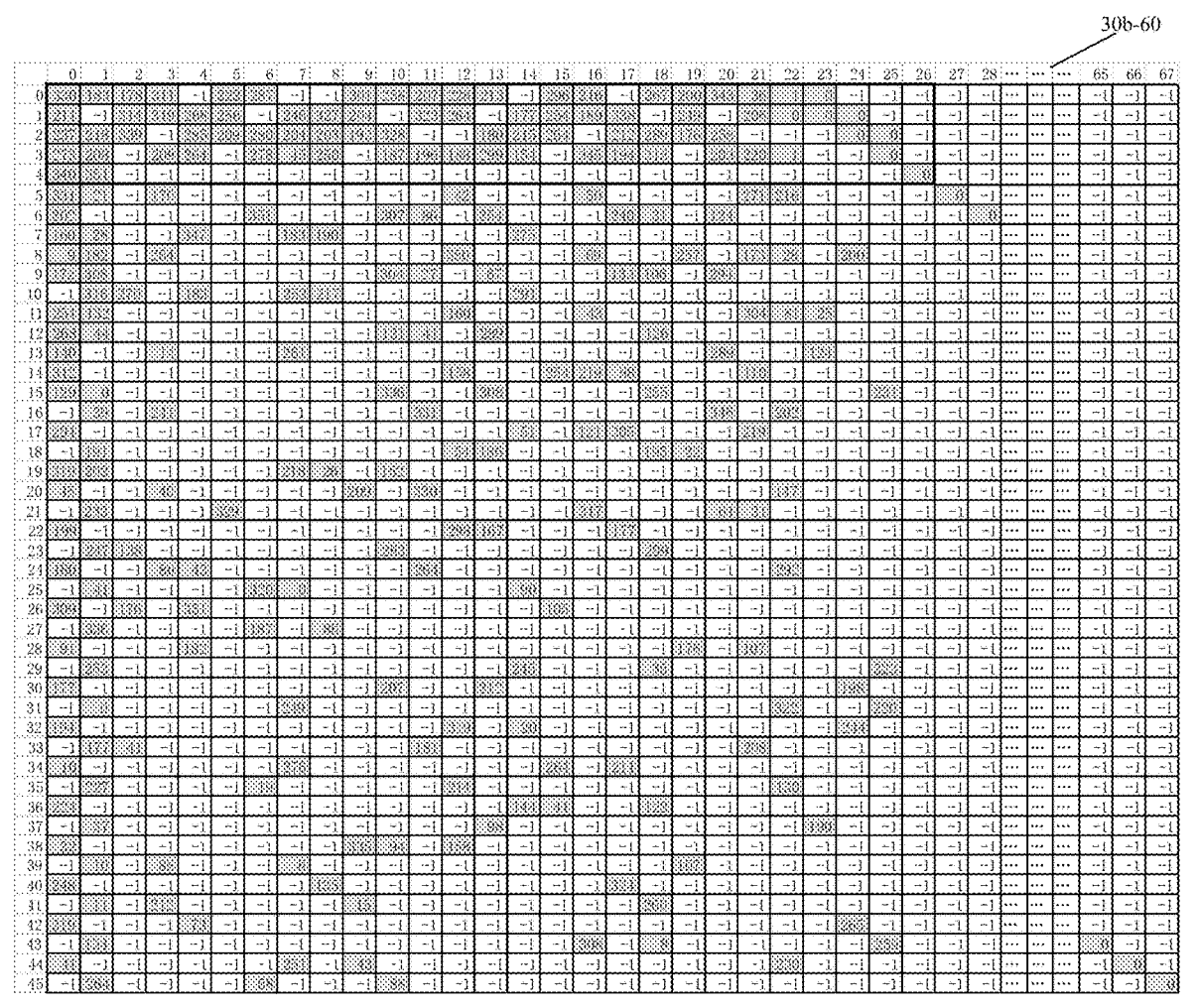
Figure 3B-9:
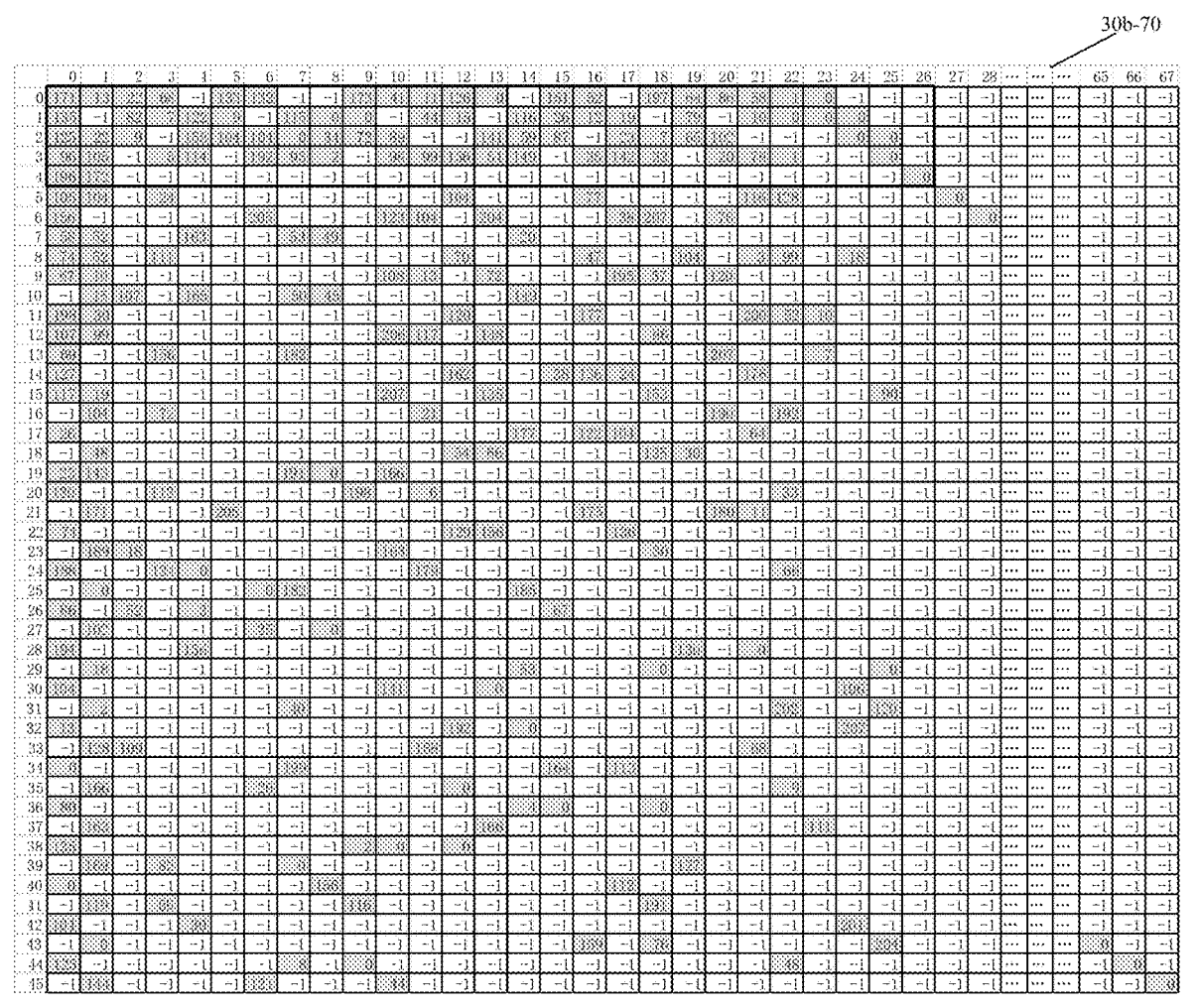
Figure 3B-10:
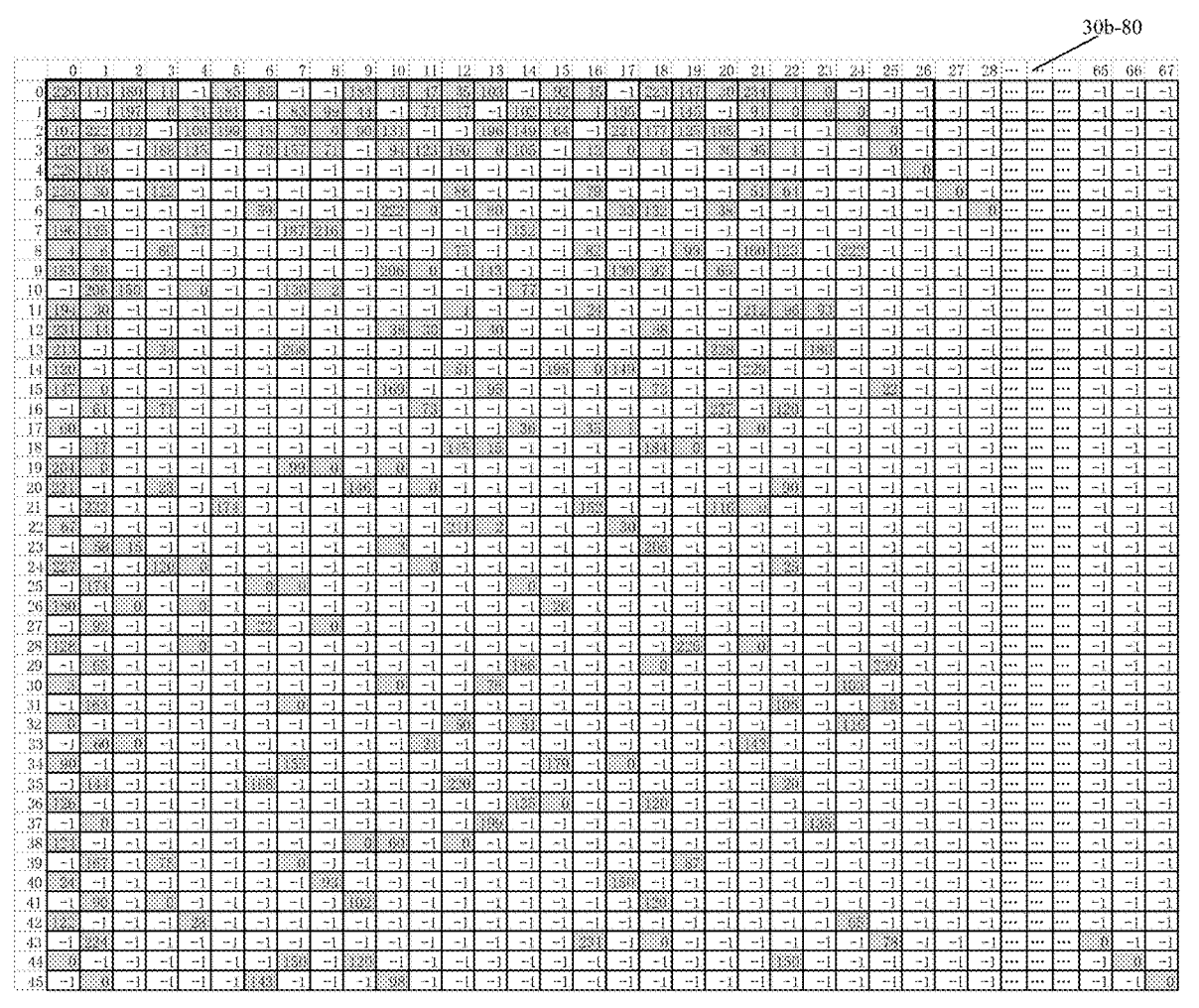

In a design, the matrix 30b-10 in FIG. 3b-1 may be expressed in Table 3-10.

TABLE 3-10

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 172, 143, 247, 249, 15, 169, 234, 136, 138, 70, 6, 207, 120, 164, 7, 218, 128, 1, 0 |
| 1 | 19 | 0, 2, 3, 4, 5, 7, 8, 9, 11, 12, 14, 15, 16, 17, 19, 21, 22, 23, 24 | 213, 67, 0, 145, 144, 21, 135, 153, 151, 88, 185, 151, 189, 13, 193, 196, 0, 0, 0 |
| 2 | 19 | 0, 1, 2, 4, 5, 6, 7, 8, 9, 10, 13, 14, 15, 17, 18, 19, 20, 24, 25 | 141, 0, 199, 140, 3, 0, 19, 1, 224, 224, 226, 156, 157, 18, 1, 0, 195, 0, 0 |
| 3 | 19 | 0, 1, 3, 4, 6, 7, 8, 10, 11, 12, 13, 14, 16, 17, 18, 20, 21, 22, 25 | 69, 27, 157, 128, 144, 0, 211, 218, 200, 128, 101, 155, 11, 55, 39, 95, 173, 1, 0 |
| 4 | 3 | 0, 1, 26 | 166, 244, 0 |
| 5 | 8 | 0, 1, 3, 12, 16, 21, 22, 27 | 2, 123, 119, 84, 49, 87, 163, 0 |

TABLE 3-10-continued

| Row index | Row weight | Column index of non-zero-element | Shift value of non-zero-element |
|---|---|---|---|
| 6 | 9 | 0, 6, 10, 11, 13, 17, 18, 20, 28 | 211, 201, 184, 180, 127, 31, 150, 30, 0 |
| 7 | 7 | 0, 1, 4, 7, 8, 14, 29 | 236, 83, 251, 241, 137, 42, 0 |
| 8 | 10 | 0, 1, 3, 12, 16, 19, 21, 22, 24, 30 | 210, 18, 239, 8, 85, 219, 104, 6, 127, 0 |
| 9 | 9 | 0, 1, 10, 11, 13, 17, 18, 20, 31 | 247, 64, 71, 188, 16, 72, 80, 84, 0 |
| 10 | 7 | 1, 2, 4, 7, 8, 14, 32 | 46, 11, 229, 191, 97, 176, 0 |
| 11 | 8 | 0, 1, 12, 16, 21, 22, 23, 33 | 87, 3, 190, 20, 168, 128, 93, 0 |
| 12 | 7 | 0, 1, 10, 11, 13, 18, 34 | 149, 64, 243, 135, 52, 132, 0 |
| 13 | 6 | 0, 3, 7, 20, 23, 35 | 208, 161, 27, 5, 212, 0 |
| 14 | 7 | 0, 12, 15, 16, 17, 21, 36 | 96, 120, 210, 203, 195, 224, 0 |
| 15 | 7 | 0, 1, 10, 13, 18, 25, 37 | 93, 26, 214, 30, 130, 238, 0 |
| 16 | 6 | 1, 3, 11, 20, 22, 38 | 14, 225, 159, 213, 90, 0 |
| 17 | 6 | 0, 14, 16, 17, 21, 39 | 159, 239, 149, 19, 249, 0 |
| 18 | 6 | 1, 12, 13, 18, 19, 40 | 243, 200, 242, 60, 134, 0 |
| 19 | 6 | 0, 1, 7, 8, 10, 41 | 23, 38, 41, 104, 247, 0 |
| 20 | 6 | 0, 3, 9, 11, 22, 42 | 139, 141, 199, 66, 106, 0 |
| 21 | 6 | 1, 5, 16, 20, 21, 43 | 197, 21, 204, 31, 152, 0 |
| 22 | 5 | 0, 12, 13, 17, 44 | 17, 136, 0, 205, 0 |
| 23 | 5 | 1, 2, 10, 18, 45 | 18, 119, 188, 67, 0 |
| 24 | 6 | 0, 3, 4, 11, 22, 46 | 215, 109, 128, 224, 90, 0 |
| 25 | 5 | 1, 6, 7, 14, 47 | 232, 191, 128, 70, 0 |
| 26 | 5 | 0, 2, 4, 15, 48 | 92, 0, 249, 135, 0 |
| 27 | 4 | 1, 6, 8, 49 | 24, 33, 116, 0 |
| 28 | 5 | 0, 4, 19, 21, 50 | 227, 246, 203, 64, 0 |
| 29 | 5 | 1, 14, 18, 25, 51 | 7, 79, 142, 85, 0 |
| 30 | 5 | 0, 10, 13, 24, 52 | 65, 149, 105, 144, 0 |
| 31 | 5 | 1, 7, 22, 25, 53 | 0, 204, 75, 150, 0 |
| 32 | 5 | 0, 12, 14, 24, 54 | 67, 80, 85, 168, 0 |
| 33 | 5 | 1, 2, 11, 21, 55 | 26, 128, 138, 74, 0 |
| 34 | 5 | 0, 7, 15, 17, 56 | 196, 44, 34, 2, 0 |
| 35 | 5 | 1, 6, 12, 22, 57 | 34, 128, 131, 48, 0 |
| 36 | 5 | 0, 14, 15, 18, 58 | 179, 136, 216, 160, 0 |
| 37 | 4 | 1, 13, 23, 59 | 134, 51, 39, 0 |
| 38 | 5 | 0, 9, 10, 12, 60 | 33, 209, 28, 93, 0 |
| 39 | 5 | 1, 3, 7, 19, 61 | 204, 64, 252, 56, 0 |
| 40 | 4 | 0, 8, 17, 62 | 39, 62, 107, 0 |
| 41 | 5 | 1, 3, 9, 18, 63 | 89, 154, 189, 244, 0 |
| 42 | 4 | 0, 4, 24, 64 | 159, 216, 61, 0 |
| 43 | 5 | 1, 16, 18, 25, 65 | 149, 74, 238, 228, 0 |
| 44 | 5 | 0, 7, 9, 22, 66 | 129, 30, 117, 49, 0 |
| 45 | 4 | 1, 6, 10, 67 | 0, 45, 212, 0 |

Figure 2:
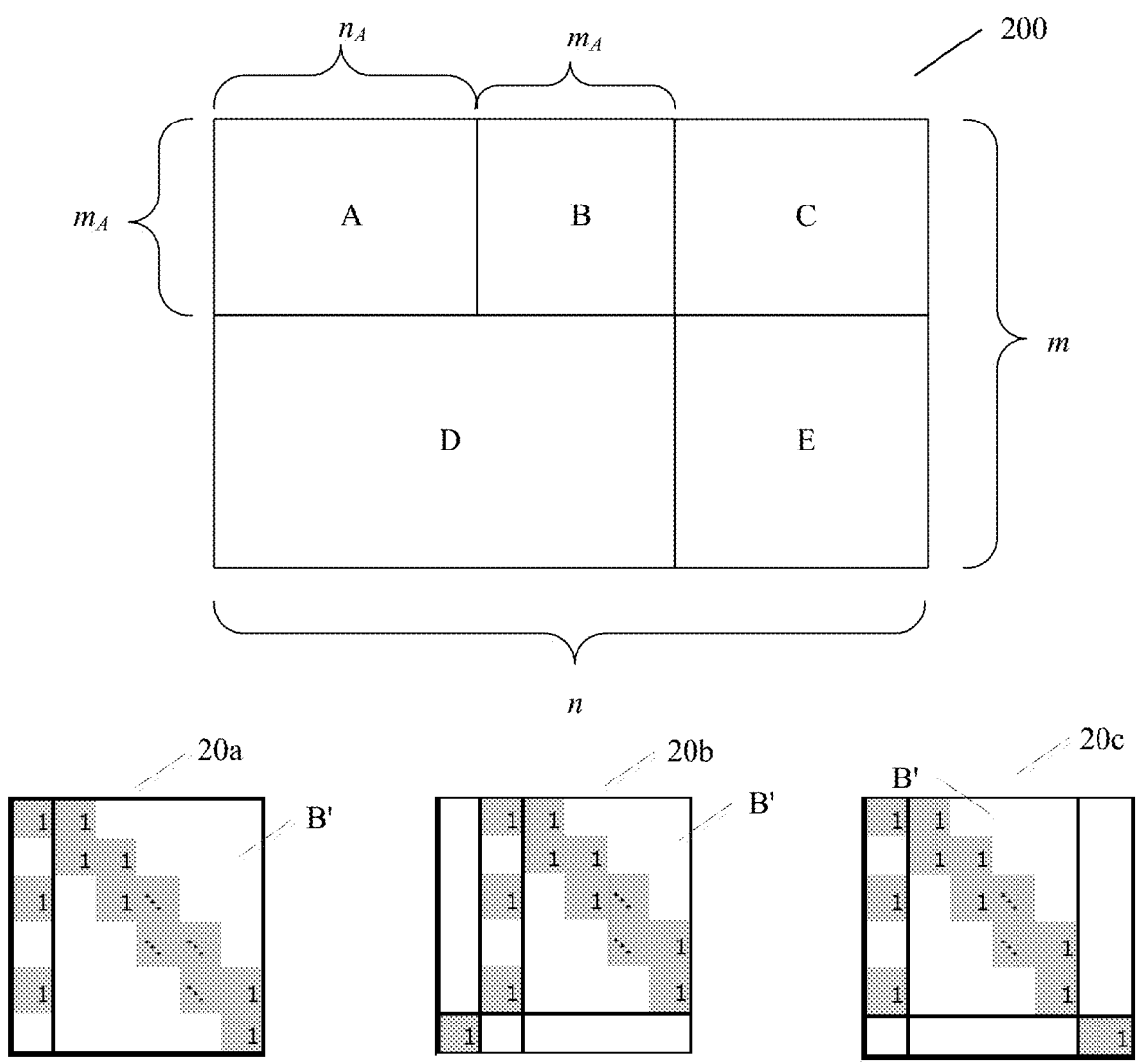
FIG. 2 is a schematic structural diagram of a base graph of an LDPC code.

In a design, the matrix 30b-11 in FIG. 3b-2 may be expressed in Table 3-11.

TABLE 3-11

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 252, 38, 0, 190, 197, 128, 233, 3, 91, 100, 16, 103, 8, 180, 182, 65, 64, 96, 0 |
| 1 | 19 | 0, 2, 3, 4, 5, 7, 8, 9, 11, 12, 14, 15, 16, 17, 19, 21, 22, 23, 24 | 184, 85, 140, 32, 111, 119, 194, 16, 36, 40, 32, 152, 32, 64, 33, 134, 127, 0, 0 |
| 2 | 19 | 0, 1, 2, 4, 5, 6, 7, 8, 9, 10, 13, 14, 15, 17, 18, 19, 20, 24, 25 | 218, 170, 22, 234, 130, 48, 160, 232, 236, 5, 107, 37, 32, 87, 136, 176, 128, 0, 0 |
| 3 | 19 | 0, 1, 3, 4, 6, 7, 8, 10, 11, 12, 13, 14, 16, 17, 18, 20, 21, 22, 25 | 93, 249, 98, 148, 114, 241, 16, 12, 17, 64, 135, 11, 131, 44, 163, 105, 5, 96, 0 |
| 4 | 3 | 0, 1, 26 | 208, 209, 0 |
| 5 | 8 | 0, 1, 3, 12, 16, 21, 22, 27 | 235, 2, 57, 186, 160, 45, 131, 0 |
| 6 | 9 | 0, 6, 10, 11, 13, 17, 18, 20, 28 | 167, 134, 20, 136, 32, 178, 64, 132, 0 |
| 7 | 7 | 0, 1, 4, 7, 8, 14, 29 | 127, 21, 123, 204, 90, 108, 0 |
| 8 | 10 | 0, 1, 3, 12, 16, 19, 21, 22, 24, 30 | 13, 160, 11, 166, 39, 137, 64, 28, 4, 0 |
| 9 | 9 | 0, 1, 10, 11, 13, 17, 18, 20, 31 | 195, 129, 233, 24, 65, 241, 70, 61, 0 |
| 10 | 7 | 1, 2, 4, 7, 8, 14, 32 | 79, 10, 48, 152, 101, 196, 0 |
| 11 | 8 | 0, 1, 12, 16, 21, 22, 23, 33 | 83, 128, 229, 229, 52, 9, 200, 0 |
| 12 | 7 | 0, 1, 10, 11, 13, 18, 34 | 158, 130, 246, 112, 173, 187, 0 |
| 13 | 6 | 0, 3, 7, 20, 23, 35 | 239, 234, 160, 94, 194, 0 |
| 14 | 7 | 0, 12, 15, 16, 17, 21, 36 | 128, 165, 169, 128, 34, 69, 0 |
| 15 | 7 | 0, 1, 10, 13, 18, 25, 37 | 203, 16, 119, 200, 207, 26, 0 |
| 16 | 6 | 1, 3, 11, 20, 22, 38 | 172, 192, 71, 198, 7, 0 |
| 17 | 6 | 0, 14, 16, 17, 21, 39 | 103, 13, 98, 96, 206, 0 |
| 18 | 6 | 1, 12, 13, 18, 19, 40 | 121, 34, 64, 97, 104, 0 |
| 19 | 6 | 0, 1, 7, 8, 10, 41 | 168, 0, 212, 176, 74, 0 |
| 20 | 6 | 0, 3, 9, 11, 22, 42 | 151, 164, 218, 106, 40, 0 |
| 21 | 6 | 1, 5, 16, 20, 21, 43 | 235, 248, 92, 8, 32, 0 |
| 22 | 5 | 0, 12, 13, 17, 44 | 116, 216, 0, 43, 0 |
| 23 | 5 | 1, 2, 10, 18, 45 | 193, 46, 82, 156, 0 |
| 24 | 6 | 0, 3, 4, 11, 22, 46 | 242, 251, 144, 96, 240, 0 |
| 25 | 5 | 1, 6, 7, 14, 47 | 212, 112, 193, 116, 0 |
| 26 | 5 | 0, 2, 4, 15, 48 | 243, 193, 96, 245, 0 |
| 27 | 4 | 1, 6, 8, 49 | 208, 80, 209, 0 |
| 28 | 5 | 0, 4, 19, 21, 50 | 243, 180, 240, 192, 0 |
| 29 | 5 | 1, 14, 18, 25, 51 | 224, 244, 209, 112, 0 |
| 30 | 5 | 0, 10, 13, 24, 52 | 230, 118, 248, 80, 0 |
| 31 | 5 | 1, 7, 22, 25, 53 | 225, 116, 241, 226, 0 |
| 32 | 5 | 0, 12, 14, 24, 54 | 192, 246, 228, 177, 0 |
| 33 | 5 | 1, 2, 11, 21, 55 | 247, 80, 224, 246, 0 |
| 34 | 5 | 0, 7, 15, 17, 56 | 176, 250, 244, 250, 0 |
| 35 | 5 | 1, 6, 12, 22, 57 | 181, 208, 224, 179, 0 |
| 36 | 5 | 0, 14, 15, 18, 58 | 225, 162, 192, 144, 0 |
| 37 | 4 | 1, 13, 23, 59 | 176, 245, 243, 0 |
| 38 | 5 | 0, 9, 10, 12, 60 | 183, 208, 96, 194, 0 |
| 39 | 5 | 1, 3, 7, 19, 61 | 226, 160, 180, 247, 0 |
| 40 | 4 | 0, 8, 17, 62 | 244, 117, 240, 0 |
| 41 | 5 | 1, 3, 9, 18, 63 | 113, 224, 225, 248, 0 |
| 42 | 4 | 0, 4, 24, 64 | 245, 48, 241, 0 |
| 43 | 5 | 1, 16, 18, 25, 65 | 228, 177, 160, 240, 0 |
| 44 | 5 | 0, 7, 9, 22, 66 | 192, 226, 84, 224, 0 |
| 45 | 4 | 1, 6, 10, 67 | 212, 177, 210, 0 |

In a design, the matrix 30b-20 in FIG. 3b-3 may be expressed in Table 3-20.

TABLE 3-20

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 280, 211, 253, 383, 266, 14, 279, 227, 30, 195, 288, 273, 202, 206, 234, 192, 245, 1, 0 |
| 1 | 19 | 0, 2, 3, 4, 5, 7, 8, 9, 11, 12, 14, 15, 16, 17, 19, 21, 22, 23, 24 | 235, 367, 204, 308, 261, 253, 296, 192, 290, 312, 377, 241, 212, 240, 323, 223, 0, 0, 0 |
| 2 | 19 | 0, 1, 2, 4, 5, 6, 7, 8, 9, 10, 13, 14, 15, 17, 18, 19, 20, 24, 25 | 357, 231, 192, 366, 24, 334, 310, 192, 283, 276, 343, 251, 288, 236, 251, 192, 254, 0, 0 |
| 3 | 19 | 0, 1, 3, 4, 6, 7, 8, 10, 11, 12, 13, 14, 16, 17, 18, 20, 21, 22, 25 | 268, 296, 355, 257, 263, 213, 308, 285, 216, 197, 335, 213, 218, 158, 201, 195, 334, 1, 0 |
| 4 | 3 | 0, 1, 26 | 318, 380, 0 |
| 5 | 8 | 0, 1, 3, 12, 16, 21, 22, 27 | 218, 287, 241, 191, 245, 43, 206, 0 |
| 6 | 9 | 0, 6, 10, 11, 13, 17, 18, 20, 28 | 207, 333, 233, 0, 118, 280, 210, 284, 0 |
| 7 | 7 | 0, 1, 4, 7, 8, 14, 29 | 230, 0, 288, 155, 55, 225, 0 |
| 8 | 10 | 0, 1, 3, 12, 16, 19, 21, 22, 24, 30 | 74, 144, 27, 366, 215, 112, 192, 24, 236, 0 |
| 9 | 9 | 0, 1, 10, 11, 13, 17, 18, 20, 31 | 61, 48, 95, 39, 246, 272, 37, 41, 0 |
| 10 | 7 | 1, 2, 4, 7, 8, 14, 32 | 315, 20, 188, 135, 238, 285, 0 |
| 11 | 8 | 0, 1, 12, 16, 21, 22, 23, 33 | 320, 10, 251, 205, 304, 263, 192, 0 |
| 12 | 7 | 0, 1, 10, 11, 13, 18, 34 | 252, 5, 164, 35, 296, 278, 0 |
| 13 | 6 | 0, 3, 7, 20, 23, 35 | 309, 199, 209, 108, 23, 0 |
| 14 | 7 | 0, 12, 15, 16, 17, 21, 36 | 52, 331, 208, 195, 0, 250, 0 |
| 15 | 7 | 0, 1, 10, 13, 18, 25, 37 | 288, 96, 267, 192, 306, 365, 0 |
| 16 | 6 | 1, 3, 11, 20, 22, 38 | 327, 0, 330, 347, 192, 0 |
| 17 | 6 | 0, 14, 16, 17, 21, 39 | 216, 297, 312, 89, 255, 0 |
| 18 | 6 | 1, 12, 13, 18, 19, 40 | 293, 166, 48, 56, 336, 0 |
| 19 | 6 | 0, 1, 7, 8, 10, 41 | 323, 48, 378, 146, 34, 0 |
| 20 | 6 | 0, 3, 9, 11, 22, 42 | 174, 145, 211, 210, 236, 0 |
| 21 | 6 | 1, 5, 16, 20, 21, 43 | 104, 88, 308, 33, 209, 0 |
| 22 | 5 | 0, 12, 13, 17, 44 | 46, 127, 0, 316, 0 |
| 23 | 5 | 1, 2, 10, 18, 45 | 243, 246, 213, 317, 0 |
| 24 | 6 | 0, 3, 4, 11, 22, 46 | 348, 236, 192, 328, 103, 0 |
| 25 | 5 | 1, 6, 7, 14, 47 | 128, 248, 96, 359, 0 |
| 26 | 5 | 0, 2, 4, 15, 48 | 102, 268, 72, 141, 0 |
| 27 | 4 | 1, 6, 8, 49 | 24, 322, 241, 0 |
| 28 | 5 | 0, 4, 19, 21, 50 | 334, 38, 74, 51, 0 |
| 29 | 5 | 1, 14, 18, 25, 51 | 256, 291, 0, 356, 0 |
| 30 | 5 | 0, 10, 13, 24, 52 | 257, 239, 26, 281, 0 |
| 31 | 5 | 1, 7, 22, 25, 53 | 230, 154, 325, 168, 0 |
| 32 | 5 | 0, 12, 14, 24, 54 | 117, 3, 297, 361, 0 |
| 33 | 5 | 1, 2, 11, 21, 55 | 299, 96, 144, 90, 0 |
| 34 | 5 | 0, 7, 15, 17, 56 | 20, 135, 351, 5, 0 |
| 35 | 5 | 1, 6, 12, 22, 57 | 316, 140, 192, 6, 0 |
| 36 | 5 | 0, 14, 15, 18, 58 | 51, 296, 151, 133, 0 |
| 37 | 4 | 1, 13, 23, 59 | 230, 97, 227, 0 |
| 38 | 5 | 0, 9, 10, 12, 60 | 87, 327, 0, 239, 0 |
| 39 | 5 | 1, 3, 7, 19, 61 | 99, 96, 114, 264, 0 |
| 40 | 4 | 0, 8, 17, 62 | 60, 139, 64, 0 |
| 41 | 5 | 1, 3, 9, 18, 63 | 96, 336, 192, 270, 0 |
| 42 | 4 | 0, 4, 24, 64 | 306, 203, 274, 0 |
| 43 | 5 | 1, 16, 18, 25, 65 | 120, 117, 262, 190, 0 |
| 44 | 5 | 0, 7, 9, 22, 66 | 20, 240, 136, 79, 0 |
| 45 | 4 | 1, 6, 10, 67 | 214, 342, 23, 0 |

In a design, the matrix 30b-21 in FIG. 3b-4 may be expressed in Table 3-21.

TABLE 3-21

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 286, 12, 27, 10, 51, 25, 21, 0, 7, 19, 6, 60, 1, 42, 7, 0, 5, 1, 0 |
| 1 | 19 | 0, 2, 3, 4, 5, 7, 8, 9, 11, 12, 14, 15, 16, 17, 19, 21, 22, 23, 24 | 6, 31, 144, 0, 102, 8, 8, 3, 40, 96, 29, 37, 0, 6, 95, 0, 0, 0, 0 |
| 2 | 19 | 0, 1, 2, 4, 5, 6, 7, 8, 9, 10, 13, 14, 15, 17, 18, 19, 20, 24, 25 | 32, 206, 0, 39, 10, 96, 24, 3, 48, 1, 100, 43, 0, 36, 12, 108, 68, 0, 0 |
| 3 | 19 | 0, 1, 3, 4, 6, 7, 8, 10, 11, 12, 13, 14, 16, 17, 18, 20, 21, 22, 25 | 185, 27, 20, 197, 15, 83, 0, 8, 18, 36, 0, 12, 142, 30, 31, 150, 81, 1, 0 |
| 4 | 3 | 0, 1, 26 | 10, 13, 0 |
| 5 | 8 | 0, 1, 3, 12, 16, 21, 22, 27 | 124, 5, 54, 173, 1, 69, 8, 0 |
| 6 | 9 | 0, 6, 10, 11, 13, 17, 18, 20, 28 | 6, 8, 246, 5, 123, 99, 31, 26, 0 |
| 7 | 7 | 0, 1, 4, 7, 8, 14, 29 | 373, 6, 218, 186, 29, 4, 0 |
| 8 | 10 | 0, 1, 3, 12, 16, 19, 21, 22, 24, 30 | 2, 246, 102, 19, 16, 26, 50, 216, 113, 0 |
| 9 | 9 | 0, 1, 10, 11, 13, 17, 18, 20, 31 | 54, 26, 227, 12, 84, 157, 201, 22, 0 |
| 10 | 7 | 1, 2, 4, 7, 8, 14, 32 | 174, 60, 112, 9, 122, 74, 0 |
| 11 | 8 | 0, 1, 12, 16, 21, 22, 23, 33 | 355, 2, 214, 14, 369, 102, 192, 0 |
| 12 | 7 | 0, 1, 10, 11, 13, 18, 34 | 132, 0, 202, 96, 49, 228, 0 |
| 13 | 6 | 0, 3, 7, 20, 23, 35 | 111, 170, 291, 32, 354, 0 |
| 14 | 7 | 0, 12, 15, 16, 17, 21, 36 | 222, 203, 315, 30, 4, 101, 0 |
| 15 | 7 | 0, 1, 10, 13, 18, 25, 37 | 1, 0, 218, 108, 323, 43, 0 |
| 16 | 6 | 1, 3, 11, 20, 22, 38 | 151, 328, 100, 143, 194, 0 |
| 17 | 6 | 0, 14, 16, 17, 21, 39 | 96, 134, 10, 101, 13, 0 |
| 18 | 6 | 1, 12, 13, 18, 19, 40 | 265, 219, 12, 63, 138, 0 |
| 19 | 6 | 0, 1, 7, 8, 10, 41 | 99, 0, 76, 36, 48, 0 |
| 20 | 6 | 0, 3, 9, 11, 22, 42 | 312, 48, 176, 38, 301, 0 |
| 21 | 6 | 1, 5, 16, 20, 21, 43 | 61, 168, 123, 6, 4, 0 |
| 22 | 5 | 0, 12, 13, 17, 44 | 26, 110, 12, 166, 0 |
| 23 | 5 | 1, 2, 10, 18, 45 | 82, 11, 185, 1, 0 |
| 24 | 6 | 0, 3, 4, 11, 22, 46 | 379, 350, 360, 305, 370, 0 |
| 25 | 5 | 1, 6, 7, 14, 47 | 375, 371, 72, 87, 0 |
| 26 | 5 | 0, 2, 4, 15, 48 | 94, 324, 270, 382, 0 |
| 27 | 4 | 1, 6, 8, 49 | 191, 310, 233, 0 |
| 28 | 5 | 0, 4, 19, 21, 50 | 381, 180, 358, 258, 0 |
| 29 | 5 | 1, 14, 18, 25, 51 | 376, 383, 362, 282, 0 |
| 30 | 5 | 0, 10, 13, 24, 52 | 84, 284, 184, 332, 0 |
| 31 | 5 | 1, 7, 22, 25, 53 | 329, 306, 373, 364, 0 |
| 32 | 5 | 0, 12, 14, 24, 54 | 252, 274, 330, 276, 0 |
| 33 | 5 | 1, 2, 11, 21, 55 | 363, 365, 380, 375, 0 |

TABLE 3-21-continued

| Row index | Row weight | Column index of non-zero-element | Shift value of non-zero-element |
|---|---|---|---|
| 34 | 5 | 0, 7, 15, 17, 56 | 378, 285, 353, 252, 0 |
| 35 | 5 | 1, 6, 12, 22, 57 | 182, 335, 354, 376, 0 |
| 36 | 5 | 0, 14, 15, 18, 58 | 352, 374, 348, 327, 0 |
| 37 | 4 | 1, 13, 23, 59 | 281, 357, 262, 0 |
| 38 | 5 | 0, 9, 10, 12, 60 | 348, 378, 66, 236, 0 |
| 39 | 5 | 1, 3, 7, 19, 61 | 382, 366, 276, 358, 0 |
| 40 | 4 | 0, 8, 17, 62 | 372, 162, 287, 0 |
| 41 | 5 | 1, 3, 9, 18, 63 | 189, 351, 334, 282, 0 |
| 42 | 4 | 0, 4, 24, 64 | 356, 306, 377, 0 |
| 43 | 5 | 1, 16, 18, 25, 65 | 275, 286, 160, 287, 0 |
| 44 | 5 | 0, 7, 9, 22, 66 | 372, 380, 277, 278, 0 |
| 45 | 4 | 1, 6, 10, 67 | 254, 381, 279, 0 |

In a design, the matrix 30b-30 in FIG. 3b-5 may be expressed in Table 3-30.

TABLE 3-30

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 293, 215, 0, 0, 4, 36, 40, 20, 97, 1, 0, 162, 48, 160, 0, 17, 0, 1, 0 |
| 1 | 19 | 0, 2, 3, 4, 5, 7, 8, 9, 11, 12, 14, 15, 16, 17, 19, 21, 22, 23, 24 | 104, 18, 29, 232, 160, 74, 56, 4, 202, 183, 187, 237, 0, 173, 8, 30, 0, 0, 0 |
| 2 | 19 | 0, 1, 2, 4, 5, 6, 7, 8, 9, 10, 13, 14, 15, 17, 18, 19, 20, 24, 25 | 46, 271, 27, 2, 185, 16, 80, 180, 277, 178, 11, 241, 196, 161, 252, 163, 203, 0, 0 |
| 3 | 19 | 0, 1, 3, 4, 6, 7, 8, 10, 11, 12, 13, 14, 16, 17, 18, 20, 21, 22, 25 | 10, 160, 13, 208, 71, 165, 10, 106, 40, 80, 4, 259, 22, 0, 48, 86, 210, 1, 0 |
| 4 | 3 | 0, 1, 26 | 132, 235, 0 |
| 5 | 8 | 0, 1, 3, 12, 16, 21, 22, 27 | 156, 84, 255, 153, 301, 315, 112, 0 |
| 6 | 9 | 0, 6, 10, 11, 13, 17, 18, 20, 28 | 186, 125, 303, 198, 10, 59, 117, 314, 0 |
| 7 | 7 | 0, 1, 4, 7, 8, 14, 29 | 203, 240, 181, 261, 234, 122, 0 |
| 8 | 10 | 0, 1, 3, 12, 16, 19, 21, 22, 24, 30 | 174, 265, 306, 248, 85, 75, 120, 113, 275, 0 |
| 9 | 9 | 0, 1, 10, 11, 13, 17, 18, 20, 31 | 183, 159, 245, 250, 162, 196, 232, 13, 0 |
| 10 | 7 | 1, 2, 4, 7, 8, 14, 32 | 288, 39, 91, 233, 200, 313, 0 |
| 11 | 8 | 0, 1, 12, 16, 21, 22, 23, 33 | 112, 35, 108, 62, 309, 80, 191, 0 |
| 12 | 7 | 0, 1, 10, 11, 13, 18, 34 | 292, 78, 216, 189, 175, 227, 0 |
| 13 | 6 | 0, 3, 7, 20, 23, 35 | 122, 65, 39, 60, 179, 0 |
| 14 | 7 | 0, 12, 15, 16, 17, 21, 36 | 201, 293, 63, 95, 136, 116, 0 |
| 15 | 7 | 0, 1, 10, 13, 18, 25, 37 | 200, 31, 86, 250, 189, 182, 0 |
| 16 | 6 | 1, 3, 11, 20, 22, 38 | 83, 298, 317, 147, 200, 0 |
| 17 | 6 | 0, 14, 16, 17, 21, 39 | 240, 306, 215, 51, 218, 0 |
| 18 | 6 | 1, 12, 13, 18, 19, 40 | 316, 304, 81, 270, 197, 0 |
| 19 | 6 | 0, 1, 7, 8, 10, 41 | 221, 0, 212, 255, 234, 0 |
| 20 | 6 | 0, 3, 9, 11, 22, 42 | 160, 207, 305, 289, 246, 0 |
| 21 | 6 | 1, 5, 16, 20, 21, 43 | 128, 94, 286, 86, 5, 0 |
| 22 | 5 | 0, 12, 13, 17, 44 | 57, 239, 80, 111, 0 |
| 23 | 5 | 1, 2, 10, 18, 45 | 247, 279, 112, 89, 0 |
| 24 | 6 | 0, 3, 4, 11, 22, 46 | 214, 129, 0, 0, 40, 0 |
| 25 | 5 | 1, 6, 7, 14, 47 | 262, 310, 92, 280, 0 |
| 26 | 5 | 0, 2, 4, 15, 48 | 292, 0, 277, 204, 0 |
| 27 | 4 | 1, 6, 8, 49 | 56, 80, 116, 0 |
| 28 | 5 | 0, 4, 19, 21, 50 | 95, 115, 137, 0, 0 |
| 29 | 5 | 1, 14, 18, 25, 51 | 93, 119, 0, 175, 0 |
| 30 | 5 | 0, 10, 13, 24, 52 | 0, 91, 98, 307, 0 |
| 31 | 5 | 1, 7, 22, 25, 53 | 98, 231, 311, 282, 0 |
| 32 | 5 | 0, 12, 14, 24, 54 | 0, 240, 60, 40, 0 |
| 33 | 5 | 1, 2, 11, 21, 55 | 0, 0, 63, 293, 0 |
| 34 | 5 | 0, 7, 15, 17, 56 | 144, 69, 123, 0, 0 |
| 35 | 5 | 1, 6, 12, 22, 57 | 166, 120, 0, 15, 0 |
| 36 | 5 | 0, 14, 15, 18, 58 | 14, 317, 88, 30, 0 |
| 37 | 4 | 1, 13, 23, 59 | 222, 160, 265, 0 |
| 38 | 5 | 0, 9, 10, 12, 60 | 0, 186, 209, 6, 0 |
| 39 | 5 | 1, 3, 7, 19, 61 | 290, 0, 181, 273, 0 |
| 40 | 4 | 0, 8, 17, 62 | 205, 185, 226, 0 |
| 41 | 5 | 1, 3, 9, 18, 63 | 246, 0, 232, 34, 0 |
| 42 | 4 | 0, 4, 24, 64 | 199, 242, 299, 0 |
| 43 | 5 | 1, 16, 18, 25, 65 | 26, 87, 0, 304, 0 |
| 44 | 5 | 0, 7, 9, 22, 66 | 0, 94, 16, 41, 0 |
| 45 | 4 | 1, 6, 10, 67 | 160, 285, 164, 0 |

In a design, the matrix 30b-40 in FIG. 3b-6 may be expressed in Table 3-40.

TABLE 3-40

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 198, 143, 153, 155, 32, 71, 219, 140, 77, 10, 28, 33, 44, 1, 42, 117, 56, 1, 0 |
| 1 | 19 | 0, 2, 3, 4, 5, 7, 8, 9, 11, 12, 14, 15, 16, 17, 19, 21, 22, 23, 24 | 94, 147, 171, 35, 0, 69, 4, 98, 84, 28, 88, 0, 14, 0, 137, 216, 0, 0, 0 |
| 2 | 19 | 0, 1, 2, 4, 5, 6, 7, 8, 9, 10, 13, 14, 15, 17, 18, 19, 20, 24, 25 | 33, 30, 112, 132, 85, 213, 119, 28, 33, 117, 36, 16, 149, 186, 7, 0, 0, 0, 0 |
| 3 | 19 | 0, 1, 3, 4, 6, 7, 8, 10, 11, 12, 13, 14, 16, 17, 18, 20, 21, 22, 25 | 50, 11, 120, 151, 33, 20, 43, 166, 2, 90, 44, 126, 129, 42, 32, 46, 103, 1, 0 |
| 4 | 3 | 0, 1, 26 | 217, 175, 0 |
| 5 | 8 | 0, 1, 3, 12, 16, 21, 22, 27 | 110, 56, 156, 208, 94, 126, 0, 0 |
| 6 | 9 | 0, 6, 10, 11, 13, 17, 18, 20, 28 | 14, 186, 140, 48, 91, 14, 187, 35, 0 |
| 7 | 7 | 0, 1, 4, 7, 8, 14, 29 | 86, 70, 30, 188, 28, 116, 0 |
| 8 | 10 | 0, 1, 3, 12, 16, 19, 21, 22, 24, 30 | 44, 150, 192, 177, 73, 103, 129, 138, 195, 0 |
| 9 | 9 | 0, 1, 10, 11, 13, 17, 18, 20, 31 | 81, 15, 59, 42, 179, 132, 196, 5, 0 |
| 10 | 7 | 1, 2, 4, 7, 8, 14, 32 | 188, 112, 65, 199, 128, 7, 0 |
| 11 | 8 | 0, 1, 12, 16, 21, 22, 23, 33 | 61, 0, 58, 123, 82, 73, 35, 0 |
| 12 | 7 | 0, 1, 10, 11, 13, 18, 34 | 162, 0, 149, 117, 168, 191, 0 |
| 13 | 6 | 0, 3, 7, 20, 23, 35 | 151, 16, 172, 162, 105, 0 |
| 14 | 7 | 0, 12, 15, 16, 17, 21, 36 | 149, 171, 102, 118, 7, 182, 0 |
| 15 | 7 | 0, 1, 10, 13, 18, 25, 37 | 173, 29, 203, 37, 215, 220, 0 |
| 16 | 6 | 1, 3, 11, 20, 22, 38 | 0, 174, 175, 168, 145, 0 |
| 17 | 6 | 0, 14, 16, 17, 21, 39 | 21, 222, 56, 94, 111, 0 |
| 18 | 6 | 1, 12, 13, 18, 19, 40 | 70, 120, 17, 148, 125, 0 |
| 19 | 6 | 0, 1, 7, 8, 10, 41 | 57, 118, 189, 25, 11, 0 |
| 20 | 6 | 0, 3, 9, 11, 22, 42 | 96, 77, 195, 0, 143, 0 |
| 21 | 6 | 1, 5, 16, 20, 21, 43 | 122, 0, 179, 142, 28, 0 |
| 22 | 5 | 0, 12, 13, 17, 44 | 188, 212, 35, 148, 0 |

TABLE 3-40-continued

| Row index | Row weight | Column index of non-zero-element | Shift value of non-zero-element |
|---|---|---|---|
| 23 | 5 | 1, 2, 10, 18, 45 | 60, 147, 137, 49, 0 |
| 24 | 6 | 0, 3, 4, 11, 22, 46 | 102, 112, 0, 0, 6, 0 |
| 25 | 5 | 1, 6, 7, 14, 47 | 93, 0, 0, 105, 0 |
| 26 | 5 | 0, 2, 4, 15, 48 | 84, 14, 0, 194, 0 |
| 27 | 4 | 1, 6, 8, 49 | 28, 70, 112, 0 |
| 28 | 5 | 0, 4, 19, 21, 50 | 37, 0, 59, 0, 0 |
| 29 | 5 | 1, 14, 18, 25, 51 | 42, 0, 112, 0, 0 |
| 30 | 5 | 0, 10, 13, 24, 52 | 0, 115, 28, 0, 0 |
| 31 | 5 | 1, 7, 22, 25, 53 | 0, 0, 38, 109, 0 |
| 32 | 5 | 0, 12, 14, 24, 54 | 0, 119, 0, 57, 0 |
| 33 | 5 | 1, 2, 11, 21, 55 | 0, 0, 110, 0, 0 |
| 34 | 5 | 0, 7, 15, 17, 56 | 0, 0, 189, 0, 0 |
| 35 | 5 | 1, 6, 12, 22, 57 | 168, 0, 56, 91, 0 |
| 36 | 5 | 0, 14, 15, 18, 58 | 181, 70, 0, 17, 0 |
| 37 | 4 | 1, 13, 23, 59 | 80, 42, 7, 0 |
| 38 | 5 | 0, 9, 10, 12, 60 | 0, 2, 0, 0, 0 |
| 39 | 5 | 1, 3, 7, 19, 61 | 55, 0, 1, 84, 0 |
| 40 | 4 | 0, 8, 17, 62 | 0, 0, 112, 0 |
| 41 | 5 | 1, 3, 9, 18, 63 | 0, 0, 107, 168, 0 |
| 42 | 4 | 0, 4, 24, 64 | 130, 124, 56, 0 |
| 43 | 5 | 1, 16, 18, 25, 65 | 76, 0, 0, 140, 0 |
| 44 | 5 | 0, 7, 9, 22, 66 | 0, 112, 56, 36, 0 |
| 45 | 4 | 1, 6, 10, 67 | 0, 120, 0, 0 |

In a design, the matrix 30b-50 in FIG. 3b-7 may be expressed in Table 3-50.

TABLE 3-50

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 211, 198, 188, 186, 219, 4, 29, 144, 116, 216, 115, 233, 144, 95, 216, 73, 261, 1, 0 |
| 1 | 19 | 0, 2, 3, 4, 5, 7, 8, 9, 11, 12, 14, 15, 16, 17, 19, 21, 22, 23, 24 | 179, 162, 223, 256, 160, 76, 202, 117, 109, 15, 72, 152, 158, 147, 156, 119, 0, 0, 0 |
| 2 | 19 | 0, 1, 2, 4, 5, 6, 7, 8, 9, 10, 13, 14, 15, 17, 18, 19, 20, 24, 25 | 258, 167, 220, 133, 243, 202, 218, 63, 0, 3, 74, 229, 0, 216, 269, 200, 234, 0, 0 |
| 3 | 19 | 0, 1, 3, 4, 6, 7, 8, 10, 11, 12, 13, 14, 16, 17, 18, 20, 21, 22, 25 | 187, 145, 166, 108, 82, 132, 197, 41, 162, 57, 36, 115, 242, 165, 0, 113, 108, 1, 0 |
| 4 | 3 | 0, 1, 26 | 246, 235, 0 |
| 5 | 8 | 0, 1, 3, 12, 16, 21, 22, 27 | 261, 181, 72, 283, 254, 79, 144, 0 |
| 6 | 9 | 0, 6, 10, 11, 13, 17, 18, 20, 28 | 80, 144, 169, 90, 59, 177, 151, 108, 0 |
| 7 | 7 | 0, 1, 4, 7, 8, 14, 29 | 169, 189, 154, 184, 104, 164, 0 |
| 8 | 10 | 0, 1, 3, 12, 16, 19, 21, 22, 24, 30 | 54, 0, 252, 41, 98, 46, 15, 230, 54, 0 |
| 9 | 9 | 0, 1, 10, 11, 13, 17, 18, 20, 31 | 162, 159, 93, 134, 45, 132, 76, 209, 0 |
| 10 | 7 | 1, 2, 4, 7, 8, 14, 32 | 178, 1, 28, 267, 234, 201, 0 |
| 11 | 8 | 0, 1, 12, 16, 21, 22, 23, 33 | 55, 23, 274, 181, 273, 39, 26, 0 |
| 12 | 7 | 0, 1, 10, 11, 13, 18, 34 | 225, 162, 244, 151, 238, 243, 0 |
| 13 | 6 | 0, 3, 7, 20, 23, 35 | 231, 0, 216, 47, 36, 0 |
| 14 | 7 | 0, 12, 15, 16, 17, 21, 36 | 0, 186, 253, 16, 0, 79, 0 |
| 15 | 7 | 0, 1, 10, 13, 18, 25, 37 | 170, 0, 183, 108, 68, 64, 0 |
| 16 | 6 | 1, 3, 11, 20, 22, 38 | 270, 13, 99, 54, 0, 0 |
| 17 | 6 | 0, 14, 16, 17, 21, 39 | 153, 137, 0, 0, 162, 0 |
| 18 | 6 | 1, 12, 13, 18, 19, 40 | 161, 151, 0, 241, 144, 0 |

TABLE 3-50-continued

| Row index | Row weight | Column index of non-zero-element | Shift value of non-zero-element |
|---|---|---|---|
| 19 | 6 | 0, 1, 7, 8, 10, 41 | 0, 0, 118, 144, 0, 0 |
| 20 | 6 | 0, 3, 9, 11, 22, 42 | 265, 81, 90, 144, 228, 0 |
| 21 | 6 | 1, 5, 16, 20, 21, 43 | 64, 46, 266, 9, 18, 0 |
| 22 | 5 | 0, 12, 13, 17, 44 | 72, 189, 72, 257, 0 |
| 23 | 5 | 1, 2, 10, 18, 45 | 180, 0, 0, 165, 0 |
| 24 | 6 | 0, 3, 4, 11, 22, 46 | 236, 199, 0, 266, 0, 0 |
| 25 | 5 | 1, 6, 7, 14, 47 | 205, 0, 0, 183, 0 |
| 26 | 5 | 0, 2, 4, 15, 48 | 0, 0, 0, 277, 0 |
| 27 | 4 | 1, 6, 8, 49 | 45, 36, 72, 0 |
| 28 | 5 | 0, 4, 19, 21, 50 | 275, 0, 155, 62, 0 |
| 29 | 5 | 1, 14, 18, 25, 51 | 0, 180, 0, 42, 0 |
| 30 | 5 | 0, 10, 13, 24, 52 | 0, 90, 252, 173, 0 |
| 31 | 5 | 1, 7, 22, 25, 53 | 144, 144, 166, 19, 0 |
| 32 | 5 | 0, 12, 14, 24, 54 | 0, 211, 36, 162, 0 |
| 33 | 5 | 1, 2, 11, 21, 55 | 0, 0, 76, 18, 0 |
| 34 | 5 | 0, 7, 15, 17, 56 | 197, 0, 108, 0, 0 |
| 35 | 5 | 1, 6, 12, 22, 57 | 199, 278, 0, 205, 0 |
| 36 | 5 | 0, 14, 15, 18, 58 | 216, 16, 0, 0, 0 |
| 37 | 4 | 1, 13, 23, 59 | 72, 144, 0, 0 |
| 38 | 5 | 0, 9, 10, 12, 60 | 190, 0, 0, 0, 0 |
| 39 | 5 | 1, 3, 7, 19, 61 | 153, 0, 165, 117, 0 |
| 40 | 4 | 0, 8, 17, 62 | 216, 144, 2, 0 |
| 41 | 5 | 1, 3, 9, 18, 63 | 0, 0, 0, 183, 0 |
| 42 | 4 | 0, 4, 24, 64 | 27, 0, 35, 0 |
| 43 | 5 | 1, 16, 18, 25, 65 | 52, 243, 0, 270, 0 |
| 44 | 5 | 0, 7, 9, 22, 66 | 18, 0, 0, 57, 0 |
| 45 | 4 | 1, 6, 10, 67 | 168, 0, 144, 0 |

In a design, the matrix 30b-60 in FIG. 3b-8 may be expressed in Table 3-60.

TABLE 3-60

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 330, 183, 178, 311, 222, 287, 301, 258, 207, 228, 213, 296, 216, 267, 200, 343, 36, 1, 0 |
| 1 | 19 | 0, 2, 3, 4, 5, 7, 8, 9, 11, 12, 14, 15, 16, 17, 19, 21, 22, 23, 24 | 211, 314, 319, 268, 256, 246, 327, 204, 323, 264, 177, 254, 189, 338, 249, 206, 0, 0, 0 |
| 2 | 19 | 0, 1, 2, 4, 5, 6, 7, 8, 9, 10, 13, 14, 15, 17, 18, 19, 20, 24, 25 | 237, 218, 339, 285, 209, 280, 204, 203, 193, 328, 180, 215, 264, 212, 289, 176, 258, 0, 0 |
| 3 | 19 | 0, 1, 3, 4, 6, 7, 8, 10, 11, 12, 13, 14, 16, 17, 18, 20, 21, 22, 25 | 273, 208, 209, 264, 278, 45, 250, 187, 196, 188, 299, 154, 345, 194, 318, 203, 220, 1, 0 |
| 4 | 3 | 0, 1, 26 | 340, 351, 0 |
| 5 | 8 | 0, 1, 3, 12, 16, 21, 22, 27 | 331, 21, 170, 42, 50, 271, 216, 0 |
| 6 | 9 | 0, 6, 10, 11, 13, 17, 18, 20, 28 | 202, 351, 307, 86, 254, 240, 31, 124, 0 |
| 7 | 7 | 0, 1, 4, 7, 8, 14, 29 | 160, 28, 347, 183, 190, 275, 0 |
| 8 | 10 | 0, 1, 3, 12, 16, 19, 21, 22, 24, 30 | 9, 182, 264, 350, 69, 257, 173, 28, 200, 0 |
| 9 | 9 | 0, 1, 10, 11, 13, 17, 18, 20, 31 | 172, 308, 304, 27, 67, 133, 106, 294, 0 |
| 10 | 7 | 1, 2, 4, 7, 8, 14, 32 | 316, 270, 183, 252, 217, 291, 0 |
| 11 | 8 | 0, 1, 12, 16, 21, 22, 23, 33 | 251, 132, 160, 43, 304, 81, 25, 0 |
| 12 | 7 | 0, 1, 10, 11, 13, 18, 34 | 268, 44, 131, 41, 289, 126, 0 |
| 13 | 6 | 0, 3, 7, 20, 23, 35 | 140, 14, 261, 289, 124, 0 |
| 14 | 7 | 0, 12, 15, 16, 17, 21, 36 | 312, 158, 254, 219, 88, 110, 0 |
| 15 | 7 | 0, 1, 10, 13, 18, 25, 37 | 129, 0, 336, 308, 255, 231, 0 |
| 16 | 6 | 1, 3, 11, 20, 22, 38 | 39, 241, 331, 346, 202, 0 |
| 17 | 6 | 0, 14, 16, 17, 21, 39 | 294, 51, 121, 305, 219, 0 |
| 18 | 6 | 1, 12, 13, 18, 19, 40 | 191, 54, 186, 195, 22, 0 |
| 19 | 6 | 0, 1, 7, 8, 10, 41 | 319, 202, 218, 26, 152, 0 |

TABLE 3-60-continued

| Row index | Row weight | Column index of non-zero-element | Shift value of non-zero-element |
|---|---|---|---|
| 20 | 6 | 0, 3, 9, 11, 22, 42 | 45, 40, 209, 330, 147, 0 |
| 21 | 6 | 1, 5, 16, 20, 21, 43 | 233, 329, 317, 61, 31, 0 |
| 22 | 5 | 0, 12, 13, 17, 44 | 199, 298, 167, 177, 0 |
| 23 | 5 | 1, 2, 10, 18, 45 | 247, 138, 283, 299, 0 |
| 24 | 6 | 0, 3, 4, 11, 22, 46 | 180, 80, 43, 264, 292, 0 |
| 25 | 5 | 1, 6, 7, 14, 47 | 41, 320, 0, 90, 0 |
| 26 | 5 | 0, 2, 4, 15, 48 | 309, 176, 351, 105, 0 |
| 27 | 4 | 1, 6, 8, 49 | 336, 187, 88, 0 |
| 28 | 5 | 0, 4, 19, 21, 50 | 91, 182, 176, 107, 0 |
| 29 | 5 | 1, 14, 18, 25, 51 | 253, 245, 35, 323, 0 |
| 30 | 5 | 0, 10, 13, 24, 52 | 177, 207, 212, 198, 0 |
| 31 | 5 | 1, 7, 22, 25, 53 | 0, 249, 322, 220, 0 |
| 32 | 5 | 0, 12, 14, 24, 54 | 194, 319, 20, 244, 0 |
| 33 | 5 | 1, 2, 11, 21, 55 | 177, 41, 181, 208, 0 |
| 34 | 5 | 0, 7, 15, 17, 56 | 10, 276, 264, 211, 0 |
| 35 | 5 | 1, 6, 12, 22, 57 | 227, 19, 214, 130, 0 |
| 36 | 5 | 0, 14, 15, 18, 58 | 224, 144, 41, 122, 0 |
| 37 | 4 | 1, 13, 23, 59 | 37, 98, 190, 0 |
| 38 | 5 | 0, 9, 10, 12, 60 | 32, 335, 94, 158, 0 |
| 39 | 5 | 1, 3, 7, 19, 61 | 10, 88, 8, 107, 0 |
| 40 | 4 | 0, 8, 17, 62 | 248, 135, 324, 0 |
| 41 | 5 | 1, 3, 9, 18, 63 | 11, 212, 15, 260, 0 |
| 42 | 4 | 0, 4, 24, 64 | 319, 73, 265, 0 |
| 43 | 5 | 1, 16, 18, 25, 65 | 134, 308, 8, 259, 0 |
| 44 | 5 | 0, 7, 9, 22, 66 | 41, 251, 43, 230, 0 |
| 45 | 4 | 1, 6, 10, 67 | 264, 68, 88, 0 |

In a design, the matrix 30b-70 in FIG. 3b-9 may be expressed in Table 3-70.

TABLE 3-70

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 171, 13, 22, 68, 133, 132, 173, 41, 11, 126, 0, 151, 52, 197, 64, 86, 58, 1, 0 |
| 1 | 19 | 0, 2, 3, 4, 5, 7, 8, 9, 11, 12, 14, 15, 16, 17, 19, 21, 22, 23, 24 | 135, 82, 7, 122, 9, 115, 0, 0, 44, 15, 116, 26, 12, 19, 79, 10, 0, 0, 0 |
| 2 | 19 | 0, 1, 2, 4, 5, 6, 7, 8, 9, 10, 13, 14, 15, 17, 18, 19, 20, 24, 25 | 125, 22, 9, 158, 104, 104, 0, 34, 72, 89, 141, 59, 87, 23, 7, 65, 102, 0, 0 |
| 3 | 19 | 0, 1, 3, 4, 6, 7, 8, 10, 11, 12, 13, 14, 16, 17, 18, 20, 21, 22, 25 | 96, 105, 5, 114, 192, 95, 2, 98, 99, 156, 51, 149, 35, 142, 32, 20, 78, 1, 0 |
| 4 | 3 | 0, 1, 26 | 196, 172, 0 |
| 5 | 8 | 0, 1, 3, 12, 16, 21, 22, 27 | 105, 104, 24, 104, 77, 116, 128, 0 |
| 6 | 9 | 0, 6, 10, 11, 13, 17, 18, 20, 28 | 156, 205, 123, 104, 204, 38, 207, 76, 0 |
| 7 | 7 | 0, 1, 4, 7, 8, 14, 29 | 58, 52, 163, 53, 49, 20, 0 |
| 8 | 10 | 0, 1, 3, 12, 16, 19, 21, 22, 24, 30 | 74, 52, 111, 70, 47, 104, 3, 99, 18, 0 |
| 9 | 9 | 0, 1, 10, 11, 13, 17, 18, 20, 31 | 67, 10, 108, 13, 72, 195, 57, 120, 0 |
| 10 | 7 | 1, 2, 4, 7, 8, 14, 32 | 15, 107, 165, 50, 45, 149, 0 |
| 11 | 8 | 0, 1, 12, 16, 21, 22, 23, 33 | 198, 30, 120, 177, 200, 52, 10, 0 |
| 12 | 7 | 0, 1, 10, 11, 13, 18, 34 | 107, 99, 206, 117, 148, 86, 0 |
| 13 | 6 | 0, 3, 7, 20, 23, 35 | 69, 156, 182, 207, 7, 0 |
| 14 | 7 | 0, 12, 15, 16, 17, 21, 36 | 127, 162, 38, 136, 24, 176, 0 |
| 15 | 7 | 0, 1, 10, 13, 18, 25, 37 | 117, 19, 207, 135, 153, 90, 0 |
| 16 | 6 | 1, 3, 11, 20, 22, 38 | 104, 72, 21, 190, 192, 0 |
| 17 | 6 | 0, 14, 16, 17, 21, 39 | 26, 177, 122, 104, 64, 0 |
| 18 | 6 | 1, 12, 13, 18, 19, 40 | 48, 54, 66, 135, 30, 0 |
| 19 | 6 | 0, 1, 7, 8, 10, 41 | 23, 143, 191, 0, 166, 0 |
| 20 | 6 | 0, 3, 9, 11, 22, 42 | 120, 112, 198, 6, 33, 0 |

TABLE 3-70-continued

| Row index | Row weight | Column index of non-zero-element | Shift value of non-zero-element |
|---|---|---|---|
| 21 | 6 | 1, 5, 16, 20, 21, 43 | 171, 205, 175, 180, 11, 0 |
| 22 | 5 | 0, 12, 13, 17, 44 | 74, 129, 156, 136, 0 |
| 23 | 5 | 1, 2, 10, 18, 45 | 189, 18, 163, 30, 0 |
| 24 | 6 | 0, 3, 4, 11, 22, 46 | 188, 124, 0, 179, 66, 0 |
| 25 | 5 | 1, 6, 7, 14, 47 | 0, 0, 182, 185, 0 |
| 26 | 5 | 0, 2, 4, 15, 48 | 86, 52, 3, 67, 0 |
| 27 | 4 | 1, 6, 8, 49 | 102, 25, 0, 0 |
| 28 | 5 | 0, 4, 19, 21, 50 | 194, 156, 130, 0, 0 |
| 29 | 5 | 1, 14, 18, 25, 51 | 18, 53, 0, 0, 0 |
| 30 | 5 | 0, 10, 13, 24, 52 | 104, 141, 0, 106, 0 |
| 31 | 5 | 1, 7, 22, 25, 53 | 2, 40, 202, 120, 0 |
| 32 | 5 | 0, 12, 14, 24, 54 | 13, 192, 0, 207, 0 |
| 33 | 5 | 1, 2, 11, 21, 55 | 128, 109, 168, 68, 0 |
| 34 | 5 | 0, 7, 15, 17, 56 | 0, 199, 164, 113, 0 |
| 35 | 5 | 1, 6, 12, 22, 57 | 166, 26, 0, 9, 0 |
| 36 | 5 | 0, 14, 15, 18, 58 | 80, 4, 0, 0, 0 |
| 37 | 4 | 1, 13, 23, 59 | 163, 166, 111, 0 |
| 38 | 5 | 0, 9, 10, 12, 60 | 135, 2, 0, 0, 0 |
| 39 | 5 | 1, 3, 7, 19, 61 | 169, 83, 0, 127, 0 |
| 40 | 4 | 0, 8, 17, 62 | 0, 156, 112, 0 |
| 41 | 5 | 1, 3, 9, 18, 63 | 119, 69, 116, 191, 0 |
| 42 | 4 | 0, 4, 24, 64 | 104, 30, 201, 0 |
| 43 | 5 | 1, 16, 18, 25, 65 | 0, 159, 76, 204, 0 |
| 44 | 5 | 0, 7, 9, 22, 66 | 125, 8, 0, 48, 0 |
| 45 | 4 | 1, 6, 10, 67 | 144, 121, 44, 0 |

In a design, the matrix 30b-80 in FIG. 3b-10 may be expressed in Table 3-80.

TABLE 3-80

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 226, 113, 180, 11, 85, 65, 183, 15, 47, 35, 103, 92, 45, 223, 147, 30, 234, 1, 0 |
| 1 | 19 | 0, 2, 3, 4, 5, 7, 8, 9, 11, 12, 14, 15, 16, 17, 19, 21, 22, 23, 24 | 24, 197, 0, 21, 181, 83, 99, 44, 71, 17, 102, 142, 1, 195, 145, 91, 0, 0, 0 |
| 2 | 19 | 0, 1, 2, 4, 5, 6, 7, 8, 9, 10, 13, 14, 15, 17, 18, 19, 20, 24, 25 | 107, 222, 112, 100, 199, 15, 30, 0, 90, 131, 196, 149, 64, 221, 177, 125, 105, 0, 0 |
| 3 | 19 | 0, 1, 3, 4, 6, 7, 8, 10, 11, 12, 13, 14, 16, 17, 18, 20, 21, 22, 25 | 120, 90, 188, 135, 70, 157, 71, 94, 123, 150, 0, 105, 13, 0, 6, 36, 95, 1, 0 |
| 4 | 3 | 0, 1, 26 | 228, 119, 0 |
| 5 | 8 | 0, 1, 3, 12, 16, 21, 22, 27 | 235, 30, 122, 88, 79, 51, 64, 0 |
| 6 | 9 | 0, 6, 10, 11, 13, 17, 18, 20, 28 | 7, 59, 222, 0, 80, 33, 132, 38, 0 |
| 7 | 7 | 0, 1, 4, 7, 8, 14, 29 | 196, 125, 37, 187, 216, 152, 0 |
| 8 | 10 | 0, 1, 3, 12, 16, 19, 21, 22, 24, 30 | 4, 6, 60, 75, 82, 99, 160, 123, 222, 0 |
| 9 | 9 | 0, 1, 10, 11, 13, 17, 18, 20, 31 | 183, 60, 206, 0, 143, 130, 97, 65, 0 |
| 10 | 7 | 1, 2, 4, 7, 8, 14, 32 | 206, 150, 0, 130, 2, 77, 0 |
| 11 | 8 | 0, 1, 12, 16, 21, 22, 23, 33 | 194, 30, 1, 24, 212, 96, 93, 0 |
| 12 | 7 | 0, 1, 10, 11, 13, 18, 34 | 231, 14, 38, 30, 40, 88, 0 |
| 13 | 6 | 0, 3, 7, 20, 23, 35 | 213, 34, 208, 228, 180, 0 |
| 14 | 7 | 0, 12, 15, 16, 17, 21, 36 | 120, 51, 195, 0, 149, 229, 0 |
| 15 | 7 | 0, 1, 10, 13, 18, 25, 37 | 147, 0, 169, 95, 73, 22, 0 |
| 16 | 6 | 1, 3, 11, 20, 22, 38 | 61, 71, 73, 227, 120, 0 |

TABLE 3-80-continued

| Row index | Row weight | Column index of non-zero-element | Shift value of non-zero-element |
|---|---|---|---|
| 17 | 6 | 0, 14, 16, 17, 21, 39 | 60, 36, 35, 1, 0, 0 |
| 18 | 6 | 1, 12, 13, 18, 19, 40 | 17, 145, 15, 184, 0, 0 |
| 19 | 6 | 0, 1, 7, 8, 10, 41 | 204, 0, 99, 0, 0, 0 |
| 20 | 6 | 0, 3, 9, 11, 22, 42 | 221, 23, 146, 0, 90, 0 |
| 21 | 6 | 1, 5, 16, 20, 21, 43 | 222, 174, 152, 116, 0, 0 |
| 22 | 5 | 0, 12, 13, 17, 44 | 67, 211, 2, 30, 0 |
| 23 | 5 | 1, 2, 10, 18, 45 | 58, 15, 3, 205, 0 |
| 24 | 6 | 0, 3, 4, 11, 22, 46 | 227, 120, 0, 0, 25, 0 |
| 25 | 5 | 1, 6, 7, 14, 47 | 174, 0, 0, 0, 0 |
| 26 | 5 | 0, 2, 4, 15, 48 | 180, 0, 0, 26, 0 |
| 27 | 4 | 1, 6, 8, 49 | 92, 22, 0, 0 |
| 28 | 5 | 0, 4, 19, 21, 50 | 128, 0, 226, 0, 0 |
| 29 | 5 | 1, 14, 18, 25, 51 | 65, 186, 0, 239, 0 |
| 30 | 5 | 0, 10, 13, 24, 52 | 3, 0, 78, 103, 0 |
| 31 | 5 | 1, 7, 22, 25, 53 | 163, 0, 105, 15, 0 |
| 32 | 5 | 0, 12, 14, 24, 54 | 0, 50, 51, 116, 0 |
| 33 | 5 | 1, 2, 11, 21, 55 | 60, 0, 21, 142, 0 |
| 34 | 5 | 0, 7, 15, 17, 56 | 90, 155, 179, 0, 0 |
| 35 | 5 | 1, 6, 12, 22, 57 | 144, 168, 220, 20, 0 |
| 36 | 5 | 0, 14, 15, 18, 58 | 126, 135, 0, 120, 0 |
| 37 | 4 | 1, 13, 23, 59 | 0, 199, 135, 0 |
| 38 | 5 | 0, 9, 10, 12, 60 | 124, 0, 60, 0, 0 |
| 39 | 5 | 1, 3, 7, 19, 61 | 167, 75, 0, 87, 0 |
| 40 | 4 | 0, 8, 17, 62 | 24, 93, 150, 0 |
| 41 | 5 | 1, 3, 9, 18, 63 | 90, 0, 102, 120, 0 |
| 42 | 4 | 0, 4, 24, 64 | 122, 28, 65, 0 |
| 43 | 5 | 1, 16, 18, 25, 65 | 224, 231, 0, 78, 0 |
| 44 | 5 | 0, 7, 9, 22, 66 | 0, 150, 120, 150, 0 |
| 45 | 4 | 1, 6, 10, 67 | 0, 143, 98, 0 |

It may be understood that FIG. 1 to FIG. 3a, FIG. 3b-1 to FIG. 3b-10, Table 2-10, Table 2-11, and Tables 3-10 to Table 3-80 are to help understand the designs of the base graph and the matrix, and expression forms of the designs are not limited to expression forms in FIG. 1 to FIG. 3a, FIG. 3b-1 to FIG. 3b-10, or Table 2-10, Table 2-11, and Table 3-10 to Table 3-80. Another possible variation may be included.

In an implementation, the parameter "row weight" in Table 2-10, Table 2-11, and Table 3-10 to Table 3-80 may alternatively be omitted. A quantity of non-zero-elements in a row may be learned according to column positions of the non-zero-elements in the row. Therefore, a row weight is also learned.

In an implementation, parameter values in "column index of non-zero-element" in Table 2-10, Table 2-11, and Table 3-10 to Table 3-80 may not be sorted in ascending order provided that a column position of a non-zero-element can be retrieved by using the parameter values. In addition, parameter values in "shift value of non-zero-element" in Table 2-10, Table 2-11, and Table 3-10 to Table 3-80 may not be sorted based on a column order either provided that the parameter values in "shift value of non-zero-element" are in one-to-one correspondence with the parameter values in "column index of non-zero-element".

In a design, to save storage space, a position of a non-zero-element in a part with a relatively definite structure in a base graph or a base matrix may be calculated based on a row position or a column position, and may not be stored.

For example, submatrix E is a diagonal matrix, and includes non-zero-elements only on a diagonal of the matrix. Shift values of these non-zero-elements on the diagonal are 0. A column index of a non-zero element in the submatrix E may be calculated based on a row index, or a row index of a non-zero-element may be calculated based on a column index. Using the matrix 30b-50 in FIG. 3b-7 as an example, a column index of a non-zero-element in row $m_B$ is column $(m_e+K_b)$, where $m_e \geq 4$, and $K_b=22$. For example, a column index of a non-zero-element in row 7 is column 29, and a shift value of the non-zero-element is 0.

For another example, a bi-diagonal structure B' in a submatrix B is located in row 0 to row 3 and column 23 to column 25 in the matrix 30b-50. A column index of a non-zero-element in the bi-diagonal structure B' may be calculated based on a row index, or a row position of a non-zero-element may be calculated based on a column index. Column indexes of non-zero-elements in row $m_B$ include column $(m_B+K_b)$ and column $(m_B+K_b+1)$, where $0<m_B<3$. A column indexes of a non-zero element in row $m_B$ includes column $(m_B+K_b)$, where $m_B=0$ or $m_B=3$. A shift value of a non-zero-element in the bi-diagonal structure of the submatrix B is also 0. It can be also learned that, a matrix part including column 23 to column 25 that belongs to a submatrix D, column indexes of non-zero-elements in row 5 to row 47 are not fixed, shift values of the non-zero-elements are not 0, and the positions and the shift values of the non-zero elements still need to be stored.

For another example, for a weight-1 column in a submatrix B, in other words, column 26 in the matrix 30b-50, a column index of a non-zero-element in row $m_B$ includes column $(m_B+K_b)$, where $m_B=4$, and a shift value of the non-zero-element is also 0.

Table 3-90 shows parameters related to the rows in the matrix 30b-50. Column indexes of non-zero-elements in column 0 to column 25 may be stored, whereas column indexes of non-zero-elements in column 26 to column 68 are not stored. In other words, column indexes of non-zero-elements in weight-1 columns in the submatrix E and the submatrix B are not stored.

TABLE 3-90

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 211, 198, 188, 186, 219, 4, 29, 144, 116, 216, 115, 233, 144, 95, 216, 73, 261, 1, 0 |
| 1 | 19 | 0, 2, 3, 4, 5, 7, 8, 9, 11, 12, 14, 15, 16, 17, 19, 21, 22, 23, 24 | 179, 162, 223, 256, 160, 76, 202, 117, 109, 15, 72, 152, 158, 147, 156, 119, 0, 0, 0 |
| 2 | 19 | 0, 1, 2, 4, 5, 6, 7, 8, 9, 10, 13, 14, 15, 17, 18, 19, 20, 24, 25 | 258, 167, 220, 133, 243, 202, 218, 63, 0, 3, 74, 229, 0, 216, 269, 200, 234, 0, 0 |
| 3 | 19 | 0, 1, 3, 4, 6, 7, 8, 10, 11, 12, 13, 14, 16, 17, 18, 20, 21, 22, 25 | 187, 145, 166, 108, 82, 132, 197, 41, 162, 57, 36, 115, 242, 165, 0, 113, 108, 1, 0 |
| 4 | 2 | 0, 1 | 246, 235 |
| 5 | 7 | 0, 1, 3, 12, 16, 21, 22 | 261, 181, 72, 283, 254, 79, 144 |
| 6 | 8 | 0, 6, 10, 11, 13, 17, 18, 20 | 80, 144, 169, 90, 59, 177, 151, 108 |
| 7 | 6 | 0, 1, 4, 7, 8, 14 | 169, 189, 154, 184, 104, 164 |
| 8 | 9 | 0, 1, 3, 12, 16, 19, 21, 22, 24 | 54, 0, 252, 41, 98, 46, 15, 230, 54 |
| 9 | 8 | 0, 1, 10, 11, 13, 17, 18, 20 | 162, 159, 93, 134, 45, 132, 76, 209 |
| 10 | 6 | 1, 2, 4, 7, 8, 14 | 178, 1, 28, 267, 234, 201 |
| 11 | 7 | 0, 1, 12, 16, 21, 22 | 55, 23, 274, 181, 273, 39, 26 |
| 12 | 6 | 0, 1, 10, 11, 13, 18 | 225, 162, 244, 151, 238, 243 |
| 13 | 5 | 0, 3, 7, 20, 23 | 231, 0, 216, 47, 36 |
| 14 | 6 | 0, 12, 15, 16, 17, 21 | 0, 186, 253, 16, 0, 79 |
| 15 | 6 | 0, 1, 10, 13, 18, 25 | 170, 0, 183, 108, 68, 64 |

TABLE 3-90-continued

| Row index | Row weight | Column index of non-zero-element | Shift value of non-zero-element |
|---|---|---|---|
| 16 | 5 | 1, 3, 11, 20, 22 | 270, 13, 99, 54, 0 |
| 17 | 5 | 0, 14, 16, 17, 21 | 153, 137, 0, 0, 162 |
| 18 | 5 | 1, 12, 13, 18, 19 | 161, 151, 0, 241, 144 |
| 19 | 5 | 0, 1, 7, 8, 10 | 0, 0, 118, 144, 0 |
| 20 | 5 | 0, 3, 9, 11, 22 | 265, 81, 90, 144, 228 |
| 21 | 5 | 1, 5, 16, 20, 21 | 64, 46, 266, 9, 18 |
| 22 | 4 | 0, 12, 13, 17 | 72, 189, 72, 257 |
| 23 | 4 | 1, 2, 10, 18 | 180, 0, 0, 165 |
| 24 | 5 | 0, 3, 4, 11, 22 | 236, 199, 0, 266, 0 |
| 25 | 4 | 1, 6, 7, 14 | 205, 0, 0, 183 |
| 26 | 4 | 0, 2, 4, 15 | 0, 0, 0, 277 |
| 27 | 3 | 1, 6, 8 | 45, 36, 72 |
| 28 | 4 | 0, 4, 19, 21 | 275, 0, 155, 62 |
| 29 | 4 | 1, 14, 18, 25 | 0, 180, 0, 42 |
| 30 | 4 | 0, 10, 13, 24 | 0, 90, 252, 173 |
| 31 | 4 | 1, 7, 22, 25 | 144, 144, 166, 19 |
| 32 | 4 | 0, 12, 14, 24 | 0, 211, 36, 162 |
| 33 | 4 | 1, 2, 11, 21 | 0, 0, 76, 18 |
| 34 | 4 | 0, 7, 15, 17 | 197, 0, 108, 0 |
| 35 | 4 | 1, 6, 12, 22 | 199, 278, 0, 205 |
| 36 | 4 | 0, 14, 15, 18 | 216, 16, 0, 0 |
| 37 | 3 | 1, 13, 23 | 72, 144, 0 |
| 38 | 4 | 0, 9, 10, 12 | 190, 0, 0, 0 |
| 39 | 4 | 1, 3, 7, 19 | 153, 0, 165, 117 |
| 40 | 3 | 0, 8, 17 | 216, 144, 2 |
| 41 | 4 | 1, 3, 9, 18 | 0, 0, 0, 183 |
| 42 | 3 | 0, 4, 24 | 27, 0, 35 |
| 43 | 4 | 1, 16, 18, 25 | 52, 243, 0, 270 |
| 44 | 4 | 0, 7, 9, 22 | 18, 0, 0, 57 |
| 45 | 3 | 1, 6, 10 | 168, 0, 144 |

Table 3-91 shows parameters related to the rows in the matrix 30b-50. Column positions of non-zero-elements in column 0 to column 26 may be stored, whereas column positions of non-zero-elements in column 27 to column 68 are not stored. In other words, column positions of non-zero-elements in the submatrix E are not stored.

TABLE 3-91

| Row index | Row weight | Column index of non-zero-element | Shift value of non-zero-element |
|---|---|---|---|
| 0 | 19 | 0, 1, 2, 3, 5, 6, 9, 10, 11, 12, 13, 15, 16, 18, 19, 20, 21, 22, 23 | 211, 198, 188, 186, 219, 4, 29, 144, 116, 216, 115, 233, 144, 95, 216, 73, 261, 1, 0 |
| 1 | 19 | 0, 2, 3, 4, 5, 7, 8, 9, 11, 12, 14, 15, 16, 17, 19, 21, 22, 23, 24 | 179, 162, 223, 256, 160, 76, 202, 117, 109, 15, 72, 152, 158, 147, 156, 119, 0, 0, 0 |
| 2 | 19 | 0, 1, 2, 4, 5, 6, 7, 8, 9, 10, 13, 14, 15, 17, 18, 19, 20, 24, 25 | 258, 167, 220, 133, 243, 202, 218, 63, 0, 3, 74, 229, 0, 216, 269, 200, 234, 0, 0 |
| 3 | 19 | 0, 1, 3, 4, 6, 7, 8, 10, 11, 12, 13, 14, 16, 17, 18, 20, 21, 22, 25 | 187, 145, 166, 108, 82, 132, 197, 41, 162, 57, 36, 115, 242, 165, 0, 113, 108, 1, 0 |
| 4 | 2 | 0, 1, 26 | 246, 235, 0 |
| 5 | 7 | 0, 1, 3, 12, 16, 21, 22 | 261, 181, 72, 283, 254, 79, 144 |
| 6 | 8 | 0, 6, 10, 11, 13, 17, 18, 20 | 80, 144, 169, 90, 59, 177, 151, 108 |
| 7 | 6 | 0, 1, 4, 7, 8, 14 | 169, 189, 154, 184, 104, 164 |
| 8 | 9 | 0, 1, 3, 12, 16, 19, 21, 22, 24 | 54, 0, 252, 41, 98, 46, 15, 230, 54 |
| 9 | 8 | 0, 1, 10, 11, 13, 17, 18, 20 | 162, 159, 93, 134, 45, 132, 76, 209 |
| 10 | 6 | 1, 2, 4, 7, 8, 14 | 178, 1, 28, 267, 234, 201 |
| 11 | 7 | 0, 1, 12, 16, 21, 22 | 55, 23, 274, 181, 273, 39, 26 |
| 12 | 6 | 0, 1, 10, 11, 13, 18 | 225, 162, 244, 151, 238, 243 |
| 13 | 5 | 0, 3, 7, 20, 23 | 231, 0, 216, 47, 36 |
| 14 | 6 | 0, 12, 15, 16, 17, 21 | 0, 186, 253, 16, 0, 79 |
| 15 | 6 | 0, 1, 10, 13, 18, 25 | 170, 0, 183, 108, 68, 64 |
| 16 | 5 | 1, 3, 11, 20, 22 | 270, 13, 99, 54, 0 |
| 17 | 5 | 0, 14, 16, 17, 21 | 153, 137, 0, 0, 162 |
| 18 | 5 | 1, 12, 13, 18, 19 | 161, 151, 0, 241, 144 |
| 19 | 5 | 0, 1, 7, 8, 10 | 0, 0, 118, 144, 0 |
| 20 | 5 | 0, 3, 9, 11, 22 | 265, 81, 90, 144, 228 |
| 21 | 5 | 1, 5, 16, 20, 21 | 64, 46, 266, 9, 18 |
| 22 | 4 | 0, 12, 13, 17 | 72, 189, 72, 257 |
| 23 | 4 | 1, 2, 10, 18 | 180, 0, 0, 165 |
| 24 | 5 | 0, 3, 4, 11, 22 | 236, 199, 0, 266, 0 |
| 25 | 4 | 1, 6, 7, 14 | 205, 0, 0, 183 |
| 26 | 4 | 0, 2, 4, 15 | 0, 0, 0, 277 |
| 27 | 3 | 1, 6, 8 | 45, 36, 72 |
| 28 | 4 | 0, 4, 19, 21 | 275, 0, 155, 62 |
| 29 | 4 | 1, 14, 18, 25 | 0, 180, 0, 42 |
| 30 | 4 | 0, 10, 13, 24 | 0, 90, 252, 173 |
| 31 | 4 | 1, 7, 22, 25 | 144, 144, 166, 19 |
| 32 | 4 | 0, 12, 14, 24 | 0, 211, 36, 162 |
| 33 | 4 | 1, 2, 11, 21 | 0, 0, 76, 18 |
| 34 | 4 | 0, 7, 15, 17 | 197, 0, 108, 0 |
| 35 | 4 | 1, 6, 12, 22 | 199, 278, 0, 205 |
| 36 | 4 | 0, 14, 15, 18 | 216, 16, 0, 0 |
| 37 | 3 | 1, 13, 23 | 72, 144, 0 |
| 38 | 4 | 0, 9, 10, 12 | 190, 0, 0, 0 |
| 39 | 4 | 1, 3, 7, 19 | 153, 0, 165, 117 |
| 40 | 3 | 0, 8, 17 | 216, 144, 2 |
| 41 | 4 | 1, 3, 9, 18 | 0, 0, 0, 183 |
| 42 | 3 | 0, 4, 24 | 27, 0, 35 |
| 43 | 4 | 1, 16, 18, 25 | 52, 243, 0, 270 |
| 44 | 4 | 0, 7, 9, 22 | 18, 0, 0, 57 |
| 45 | 3 | 1, 6, 10 | 168, 0, 144 |

In Table 3-10 to Table 3-91, a row weight is optional, and a row index and column indexes of non-zero-elements indicate column positions of non-zero-elements in each row, which is also referred to information about a base graph of an LDPC matrix. In a design, information about a base graph and shift values of an LDPC matrix may be stored based on manners in Table 3-10 to Table 3-91.

In another design, the base graph of the LDPC matrix and the shift values of the LDPC matrix may be separately stored. The information about the shift values of the LDPC matrix may be stored by using row indexes and shift values of non-zero-elements in Table 3-10 to Table 3-91. The base graph of the LDPC matrix may be stored in a plurality of manners, for example, may be stored in a matrix form of the base graph 30a shown in FIG. 3a, or may be stored based on the row indexes and positions of the non-zero-elements in Table 3-10 to Table 3-91, or may be stored in a manner in which 1 and 0 in each row or each column in a base graph may be considered as binary numerals, and the base graph is stored in a form of decimal numerals or hexadecimal numerals to save storage space. The base graph 30a is used as an example. In each row, positions of non-zero-elements in the first 26 columns or the first 27 columns may be stored in four hexadecimal numerals. For example, if the first 26 columns in row 0 are 11110110 01111101 10111111 00, positions of non-zero-elements in row 0 may be denoted as 0xF6, 0x7D, 0xBF, and 0x00. To be specific, every eight columns form one hexadecimal numeral. 0 may be padded into the last two or three columns to obtain eight digits, so that a corresponding hexadecimal numeral is obtained. The same is true for another row, and details are not redundantly described herein again.

Figure 9:
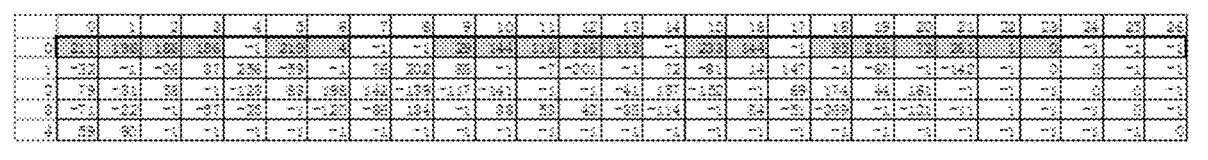

Optionally, in the foregoing various designs, the shift values of the LDPC may be stored in another transformation. For example, to facilitate processing of circularly shifting, a difference between a shift value and a previous shift value in a column in which the shift value is located may be stored. FIG. 9 shows shift values of row 0 to row 4 and column 0 to column 26 in the matrix 3b-50 after transformation. In the example shown in FIG. 9, row 0 is a start row, and shift values in row 0 do not change. Zero-elements in each row do not change, and a shift value of a non-zero-element in each row is a difference between a shift value in a same position in the matrix 30b-50 and a previous non-zero-element in the matrix 30b-50 in a column in which the shift value is located. If there is no non-zero-element before a row in which the shift value is located and in a column in which the shift value is located, the shift value does not change. For example, a shift value in row 1 and column 0 of the matrix 30b-50 is 179, and a shift value in row 1 and column 0 in FIG. 9 is a difference −32 between 179 and a previous shift value 211 in column 0. Because an element in row 0 and column 4 in FIG. 9 is a zero-element, a shift value in row 1 and column 4 in FIG. 9 is the same as a shift value in row 1 and column 4 in the matrix 30b-50. An element in row 2 and column 3 in FIG. 9 is a zero-element, and an element in row 1 and column 3 is a non-zero-element, and therefore a shift value in row 3 and column 3 is a difference −57 between a shift value 166 in row 3 and column 3 in the matrix 30b-50 and a shift value 223 in row 1 and column 3, and so on. Due to limited space, other rows of the matrix 30b-50 are not shown in FIG. 9. The same is true for the other rows, and details are not redundantly described herein again. When a difference of a shift value herein is a positive number, circularly shifting to right is performed on an identity matrix; when a difference is a negative number, circularly shifting to left is performed on an identity matrix. Correspondingly, a shift value obtained after permutation, in other words, a difference of a shift value, may be stored in "shift values of non-zero-elements" in Table 3-10 to Table 3-91. Only examples are provided above, and the examples do not constitute a limitation.

Figure 5:
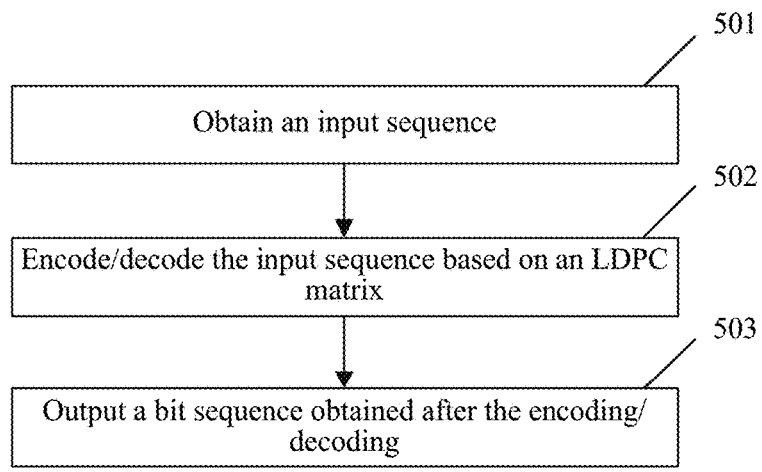

FIG. 5 is a design of a data processing process. The data processing process may be implemented by using a communications apparatus. The communications apparatus may be a base station, a terminal, or another entity such as a communications chip or an encoder/a decoder.

Part 501: Obtain an input sequence.

In an implementation, an input sequence for encoding may be an information bit sequence. The information bit sequence is sometimes referred to as a code block, for example, may be an output sequence obtained after code block segmentation is performed on a transport block. Optionally, the input sequence may include at least one of the following: filler bits or cyclic redundancy check (CRC) bits. In a possible design, an information bit sequence may be inserted into filler bits to obtain an input sequence, so that a length of the input sequence is $K=K_b \cdot Z$, and $Z=K/K_b$. The information bit sequence may be inserted into filler bits during code block segmentation, or may be inserted after code block segmentation.

In a possible design, values of filler bits may be null, 0, or other values agreed in a system. In this way, after encoding, these filler bits can be identified and are not sent. The present application is not limited thereto.

In an implementation, an input sequence for decoding may be a soft value sequence of an LDPC code.

Part 502: Encode/decode the input sequence based on an LDPC matrix, where a base matrix of the LDPC matrix may be any base matrix in the foregoing examples.

In an implementation, the LDPC matrix H may be obtained based on a lifting factor Z and a base matrix.

In an implementation, parameters related to the LDPC matrix H may be stored, and the parameters include one or more of the following:

(a) parameter used to obtain any base matrix described in the foregoing implementations. The base matrix may be obtained based on the parameters, and for example, the parameters may be one or more of the following: row index, row weight, column index, column weight, positions of a non-zero-element (such as row indexes of non-zero-elements or column indexes of non-zero-elements), shift values of a base matrix, shift values of the non-zero-elements and corresponding positions, an offset, a lifting factor, a base graph, a code rate, and the like;

(b) A base matrix, which is one of any base matrices described in the foregoing implementations;

(c) an offset matrix Hs obtained by offsetting at least one column of any base matrix listed in the foregoing implementations;

(d) a matrix obtained by lifting the base matrix or by lifting an offset matrix Hs of the base matrix;

(e) a base matrix obtained by performing row/column transformation on any base matrix listed in the foregoing implementations or on an offset matrix Hs;

(f) a matrix obtained by lifting a row/column transformed base matrix or a row/column transformed offset matrix Hs of the base matrix; and (g) a matrix obtained by shortening or puncturing any base matrix or an offset matrix Hs of the base matrix described in the foregoing implementations.

In a possible implementation, the input sequence may be encoded/decoded based on the low-density parity-check LDPC matrix in an encoding/decoding process in one or more of the following manners:

i. Obtain the base matrix based on (a); and perform encoding/decoding based on the obtained base matrix, or perform row/column permutation based on the obtained base matrix, and perform encoding/decoding based on a base matrix obtained by performing row/column permutation, or perform encoding/decoding based on an offset matrix of the obtained base matrix, or perform encoding/decoding on a matrix obtained by performing row/column permutation based on an offset matrix Hs of the obtained base matrix. Optionally, performing encoding/decoding based on the base matrix or the offset matrix Hs herein may further include: performing encoding/decoding based on a lifted matrix of the base matrix or a lifted matrix of the offset matrix Hs, or performing encoding/decoding based on a matrix obtained by shortening or puncturing the base matrix or the offset matrix.

ii. Perform encoding/decoding based on the base matrix (the stored base matrix H or Hs, or the stored base matrix obtained by performing row/column permutation on the base matrix H or Hs) stored in (b), (c), (d), or (e); or perform row/column permutation based on the stored base matrix, and perform encoding/decoding based on a base matrix obtained by performing row/column permutation. Optionally, performing encoding/decoding based on the base matrix or the offset matrix Hs herein may further include: performing encoding/decoding based on a lifted matrix of the base matrix or an lifted matrix of the offset matrix Hs, or performing encoding/decoding based on a matrix obtained by shortening or puncturing the base matrix or the offset matrix.

iii. Perform encoding/decoding based on (d), (f), or (g).

Part 503: Output a bit sequence obtained after the encoding/decoding.

Figure 6:
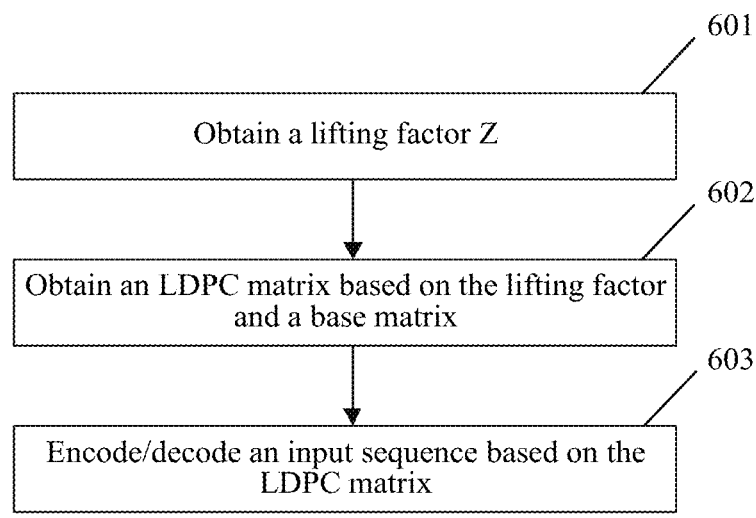

FIG. 6 is a design of obtaining a data processing process, and the design can be applied to part 502 in FIG. 5.

Part 601: Obtain a lifting factor Z.

In an implementation, the lifting factor Z may be determined based on a length K of an input sequence. For example, a minimum value $Z_0$ may be found in a supported lifting factor set, and is used as the value of the lifting factor Z, where $K_b \cdot Z_0 \geq K$ is met. In a possible design, $K_b$ may be a column count of columns of information bits in a base matrix of an LDPC code. For a base graph 30a, a column count of columns of information bits is $Kb_{max}=22$, and it is assumed that a lifting factor set supported by the base graph 30a is {24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

If the length K of the input sequence is 529 bits, then Z is 26; if the length K of the input sequence is 5000 bits, then Z is 240. It should be noted that only examples are provided herein, and the examples do not constitute a limitation.

For another example, a value of $K_b$ may vary based on a value of K, but does not exceed a column count of columns of information bits in a base matrix of an LDPC code. For example, when K is greater than a first threshold, $K_b=22$; when K is less than or equal to a first threshold, $K_b=21$. Alternatively, when K is greater than a first threshold, $K_b=22$; when K is less than or equal to a first threshold and is greater than a second threshold, $K_b=21$; when K is less than or equal to a second threshold, $K_b=20$. It should be noted that only examples are provided herein, and the examples do not constitute a limitation.

In addition, based on any one of the foregoing implementations, for a specified information length K, for example, when $104 \leq K \leq 512$, Z may be selected based on a system-defined rule. When K is a length other than $104 \leq K \leq 512$, Z is still selected based on any one of the foregoing implementations, for example, a minimum value $Z_0$ that meets $K_b \cdot Z_0 \geq K$ is selected, where the value of $K_b$ is 22 or is determined based on a threshold.

In a design, when $104 \leq K \leq 512$, a value of Z is shown in Table 4-1. For other lengths, Z is selected based on any one of the foregoing implementations.

TABLE 4-1

| Value range of K | Lifting factor Z |
| --- | --- |
| 104-111 | 7 |
| 112-127 | 8 |
| 128-135 | 6 |
| 136-143 | 9 |
| 144-183 | 8 |
| 184-223 | 10 |
| 224-247 | 11 |
| 248-287 | 13 |
| 288-335 | 15 |
| 336-359 | 16 |
| 360-399 | 18 |
| 400-447 | 20 |
| 448-487 | 22 |
| 488-512 | 24 |

In another possible design, a minimum value $Z_0$ that meets $K_b \cdot Z_0 \geq K$ is selected. When $104 \leq K \leq 512$, the value of $K_b$ may vary based on the value of K, for example, as shown in Table 4-2. When K is a length other than $104 \leq K \leq 512$, $K_b$ is selected based on any one of the foregoing implementations, for example, $K_b=22$ or $K_b$ is determined based on a threshold.

TABLE 4-2

| Value of K | Kb |
| --- | --- |
| 112 | 14 |
| 104, 120 | 15 |
| 136 | 16 |
| 144 | 18 |
| 152, 184 | 19 |
| 160, 192, 200, 248, 256, 288, 296, 360, 400 | 20 |
| 168, 208, 224, 264, 272, 304, 312, 336, 368, 376, 408, 416, 448, 456, 488, 496, 504 | 21 |
| 128, 176, 216, 232, 240, 280, 320, 328, 344, 352, 384, 392, 424, 432, 440, 464, 472, 480 | 22 |

The lifting factor Z may be determined by a communications apparatus based on the length K of the input sequence, or may be obtained by a communications apparatus from another entity (for example, a processor).

Part 602: Obtain an LDPC matrix based on the lifting factor and a base matrix.

The base matrix is any base matrix described in the foregoing implementations, or an offset matrix obtained by offsetting at least one column in any base matrix described above, or a base matrix obtained by performing row permutation, or column permutation, or row permutation and column permutation on any base matrix or offset matrix described above. A base graph of the base matrix includes at least a submatrix A and a submatrix B. Optionally, the base graph of the base matrix may further include a submatrix C, a submatrix D, and a submatrix E. For the submatrices, refer to the descriptions in the foregoing embodiments, and details are not redundantly described herein again.

In a possible implementation, a corresponding base matrix is determined based on the lifting factor Z, and the base matrix is permutated based on the lifting factor Z to obtain the LDPC matrix.

In an implementation, a correspondence between a lifting factor and a base matrix may be stored, and a corresponding base matrix is determined based on the lifting factor Z obtained in part 601.

For example, when Z is 26, and a=13, the base matrix may include row 0 to row 4 and column 0 to column 26 in a matrix 30b-70; or the base matrix includes row 0 to row 4 and some of column 0 to column 26 in a matrix 30b-70. Alternatively, the base matrix may include row 0 to row (m−1) and column 0 to column (n−1) in a matrix 30b-70, where $5 \leq m \leq 46$, m is an integer, $27 \leq n \leq 68$, and n is an integer; or the base matrix includes row 0 to row (m−1) and column 0 to column (n−1) in a matrix 30b-70, where $5 \leq m \leq 46$, m is integer, $27 \leq n \leq 68$, and n is an integer. Further, the base matrix may include one or more rows in row 5 to row 45 and one or more columns in column 27 to column 67 in the matrix 30b-70. The LDPC matrix is obtained by permutating the base matrix based on the lifting factor Z.

It should be noted that Z=26, a=13, and the matrix shown in FIG. 3b-7 are merely used as an example herein. Only examples are provided herein, and the present application is not limited thereto. It may be understood that, if lifting factors are different, base matrices are also different.

In a possible implementation, the correspondence between a lifting factor and a base matrix may be shown in Table 5. An index of a base matrix corresponding to a lifting factor is determined based on Table 5. In a possible design, PCM1 may be a matrix 30b-10 shown in FIG. 3b-1, or is a matrix 30b-11 shown in FIG. 3b-2; PCM2 may be a matrix 30b-20 shown in FIG. 3b-3, or is a matrix 30b-21 shown in FIG. 3b-4; PCM3 may be a matrix 30b-30 shown in FIG. 3b-5; PCM4 may be a matrix 30b-40 shown in FIG. 3b-6; PCM5 may be a matrix 30b-50 shown in FIG. 3b-7; PCM6 may be a matrix 30b-60 shown in FIG. 3b-8; PCM7 may be a matrix 30b-70 shown in FIG. 3b-9; and PCM8 may be a matrix 30b-80 shown in FIG. 3b-80. Only examples are provided herein, and the examples do not constitute a limitation.

TABLE 5

| Base matrix index | Lifting factor Z | | | | | | | |
|---|---|---|---|---|---|---|---|---|
| PCM1 | 2 | 4 | 8 | 16 | 32 | 64 | 128 | 256 |
| PCM2 | 3 | 6 | 12 | 24 | 48 | 96 | 192 | 384 |
| PCM3 | 5 | 10 | 20 | 40 | 80 | 160 | 320 | |
| PCM4 | 7 | 14 | 28 | 56 | 112 | 224 | | |
| PCM5 | 9 | 18 | 36 | 72 | 144 | 288 | | |
| PCM6 | 11 | 22 | 44 | 88 | 176 | 352 | | |
| PCM7 | 13 | 26 | 52 | 104 | 208 | | | |
| PCM8 | 15 | 30 | 60 | 120 | 240 | | | |

In a possible design, as shown in Table 6, set indexes are set for the eight lifting factor sets in Table 5.

TABLE 6

| Set index (Set index ($i_{LS}$)) | Lifting factor set Set of lifting sizes |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

Each set index is corresponding to one PCM. For example, 1 is corresponding to PCM1, 2 is corresponding to PCM2, 3 is corresponding to PCM3, . . . , and 8 is corresponding to PCM8, and so on.

Optionally, in a possible design, for the lifting factor Z, an element $P_{i,j}$ in row i and column j in the base matrix may meet the following relationship:

$$P_{i,j} = \begin{cases} -1 & V_{i,j} = -1 \\ \mod(V_{i,j}, Z) & V_{i,j} \geq 0 \end{cases},$$

where $V_{i,j}$ is a shift value of an element in row i and column j in a base matrix of a set to which the lifting factor Z belongs, or a shift value of a non-zero element in row i and column j in a base matrix of a maximum lifting factor in a set to which the lifting factor Z belongs.

For example, for Z is equal to 13, and an element V, in row i and column j in a base matrix of Z meets the following relationship:

$$P_{i,j} = \begin{cases} -1 & V_{i,j} = -1 \\ \mod(V_{i,j}, Z) & V_{i,j} \geq 0 \end{cases},$$

where $V_{i,j}$ is a shift value of a non-zero-element in row i and column j in PCM7, in other words, in the matrix 30b-70, where when Z=13, a modulo operation needs to be performed by taking the shift value $V_{i,j}$ of the non-zero-element in row i and column j in the matrix 30b-70 modulo Z, where Z=13.

It should be noted that only examples are provided herein, and the present application is not limited thereto.

Part 603: Encode/decode an input sequence based on the LDPC matrix.

In an implementation, an input sequence for encoding may be an information bit sequence. In another implementation, an input sequence for decoding may be a soft value sequence of the LDPC code. For details, refer to related descriptions in FIG. 5.

In a possible implementation, an input sequence for encoding is c={$c_0$, $c_1$, $c_2$, . . . , $c_{K-1}$}, a length of the input sequence c is K, and an output sequence obtained after the input sequence c is encoded is d={$d_0$, $d_1$, $d_2$, . . . , $d_{N-1}$}. K is an integer greater than 0, and K may be an integer multiple of the lifting factor Z.

The output sequence d includes $K_0$ bits in the input sequence c and parity bits in a parity bit sequence w, where $K_0$ is an integer greater than 0 and less than or equal to K, a length of the parity-check sequence w is N–$K_0$, and w={$w_0$, $w_1$, $w_2$, . . . , $w_{N-K_0-1}$}.

The parity bit sequence w and the input sequence c meet a formula (1):

$$H \times \begin{bmatrix} c^T \\ w^T \end{bmatrix} = 0^T \quad (1)$$

where $c^T$=[$c_0$, $c_1$, $c_2$, . . . , $c_{K-1}$]$^T$, $c^T$ is a transposed vector of a vector including bits in the input sequence, $w^T$=[$w_0$, $w_1$, $w_2$, . . . , $w_{N-K_0-1}$]$^T$, $w^T$ is a transposed vector of a vector including bits in the parity bit sequence, $0^T$ is a column vector, and values of all elements of $0^T$ are 0.

H is an LDPC matrix obtained based on any base graph or base matrix described in the foregoing embodiments. A base graph of H has m rows and n columns, and may be any graph described in the foregoing embodiments, for example, the base graph 30a.

In a design, the base graph of H includes p columns corresponding to built-in puncture bits, p is an integer greater than or equal to 0, information bits corresponding to the p columns corresponding to built-in puncture bits are not output, and the output sequence does not include the information bits corresponding to the p columns corresponding to built-in puncture bits. In this case, $K_0$=K–p·Z. For example, if p=2, $K_0$=K–2·Z, and the length of the parity bit sequence w is N+2·Z–K. If the p columns corresponding to built-in puncture bits participate in encoding, $K_0$=K, and the length of the parity bit sequence w is N–K.

Correspondingly, H may have M rows and (N+p·Z) columns or M rows and N columns, and a size of the base graph of H is: m=M/Z and $$n = \left(\frac{N + p \cdot Z}{Z}\right).$$

The base graph of the LDPC matrix H may be represented by [$H_{BG}$ $H_{BG,EXT}$], where $$H_{BG,EXT} = \begin{bmatrix} 0_{m_c \times n_c} \\ I_{n_c \times n_c} \end{bmatrix},$$

$0_{m_c \times n_c}$ represents an all zero matrix of size $m_c \times n_c$, and $I_{n_c \times n_c}$ represents an identity matrix of size $n_c \times n_c$.

In a possible design, if $0_{m_c \times n_c}$ is the submatrix C in the base graph in the foregoing embodiments, and $I_{n_c \times n_c}$ is the submatrix E in the foregoing embodiments, $$H_{BG} = \begin{bmatrix} [A \ B] \\ D \end{bmatrix},$$

where A, B, and D are respectively the submatrix A, the submatrix B, and the submatrix D in the base graph in the foregoing embodiments, $m_c=5$, $0 \le n_c \le 41$, a row count of $H_{BG}$ is less than or equal to 46 and greater than or equal to 5, and a column count of $H_{BG}$ is equal to 27.

In another possible design, because column 26 is a weight-1 column, and a non-zero-element in column 26 is located in row 5, $0_{m_c \times n_c}$ may also include the first four rows in column 26 in the base graph in the foregoing embodiments and the first four rows in the submatrix C in the foregoing embodiments, and $I_{n_c \times n_c}$ may also include the submatrix E in the base graph in the foregoing embodiments, row 5 to row 46 in column 26, and a last row in the submatrix C, where $m_c=4$, $0 \le n_c \le 42$, $H_{BG}$ is a matrix obtained after the last column is removed from a part including the submatrix A, the submatrix B, and the submatrix D in the base graph in the foregoing embodiments, a row count of $H_{BG}$ is less than or equal to 46 and greater than or equal to 5, and a column count of $H_{BG}$ is equal to 26. Optionally, if a code rate needs to be further increased, $H_{BG}$ may have four rows: row 0 to row 3.

Correspondingly, the LDPC matrix H may be represented by $H=[H_1 \ H_2]$.

$H_1$ may be obtained by replacing each zero-element in $H_{BG}$ with an all zero matrix of size $Z \times Z$ and replacing each non-zero-element with a circular permutation matrix $h_{i,j}$ of size $Z \times Z$. The circular permutation matrix $h_{i,j}$ is obtained by circularly shifting an identity matrix of size $Z \times Z$ to the right $P_{i,j}$ times, and is sometimes represented by $I(P_{i,j})$, where i is a row index, and j is a column index. In a possible design, $P_{i,j}=\text{mod}(V_{i,j}, Z)$, and $V_{i,j}$ is a non-zero element in row i and column in a base matrix corresponding to a lifting factor set index $i_{LS}$ corresponding to Z.

$H_2$ may be obtained by replacing each zero-element in $H_{BG,EXT}$ with an all zero matrix of size $Z \times Z$ and replacing each non-zero-element with an identity matrix of size $Z \times Z$.

An encoder may perform encoding and outputting in a plurality of manners. The base graph 30a and the base matrix 30b-50 described in the foregoing embodiment are used as an example for description below. The base graph and the base matrix each have a maximum of 46 rows and a maximum of 68 columns and each include two columns corresponding to built-in puncture bits. For ease of description, in the present application, a base graph that has a maximum quantity of rows and a maximum quantity of columns is sometimes referred to as a complete base graph, and a base matrix that has a maximum quantity of rows and a maximum quantity of columns is sometimes referred to as a complete base matrix.

Manner 1:

Encoding is performed based on the complete base graph or the complete base matrix, so that as many parity bits as possible can be obtained. In this case, m=46, and n=68, which are corresponding to row 0 to row 45 and column 0 to column 67 in the base graph 30a, or shift values in row 0 to row 45 and column 0 to column 67 in the base matrix 30b-50.

Correspondingly, $M=46 \cdot Z$ for the LDPC matrix H. If an output sequence includes information bits corresponding to the columns corresponding to built-in puncture bits, $N=68 \cdot Z$; or if an output sequence does not include $2 \cdot Z$ information bits which are built-in puncture bits, $N=66 \cdot Z$.

During subsequent processing, information bits and parity bits that need to be sent may be determined from the output sequence generated by the encoder.

Manner 2:

Encoding is performed based on some rows and some columns in the complete base graph or the complete base matrix. Rows and columns may be selected, based on a code rate for a transmission, or a quantity of information bits and a quantity of parity bits, or the like, from the complete base graph or the complete base matrix for encoding.

For example, the code rate is 8/9, m=5, and n=27. In other words, encoding is performed based on row 0 to row 4 and column 0 to column 26 in the base graph 30a, or encoding is performed based on shift values of row 0 to row 4 and column 0 to column 26 in the base matrix 30b-50.

Correspondingly, $M=5 \cdot Z$ for the LDPC matrix H. If an output sequence includes information bits corresponding to the columns corresponding to built-in puncture bits, $N=27 \cdot Z$; or if an output sequence does not include information bits corresponding to the columns corresponding to built-in puncture bits, $N=25 \cdot Z$.

For another example, the code rate is 1/3, m=46, and n=68.

It can be learned that, in this manner, sizes of the base graph of H or the base matrix meet $5 \le m \le 46$ and $27 \le n \le 68$, and correspondingly, for the LDPC matrix H, $5 \cdot Z \le M \le 46 \cdot Z$ and $27 \cdot Z \le N \le 68 \cdot Z$.

In a possible design, column 26 in the base graph 30a is a weight-1 column, and puncturing may be performed on the weight-1 column in a core matrix, so that one row and one column are removed from the core matrix accordingly, and m=4 and n=26. In other words, encoding is performed based on row 0 to row 3 and column 0 to column 25 in the base graph 30a or base matrix 30b-50. A higher code rate can be obtained in this manner. Therefore, sizes of the base graph or the base matrix meet $4 \le m \le 46$ and $26 \le n \le 68$, and correspondingly, for the LDPC matrix H, $4 \cdot Z \le M \le 46 \cdot Z$ and $26 \cdot Z \le N \le 68 \cdot Z$.

Because decoding is an inverse process of encoding, for descriptions of the LDPC matrix H and the base graph and the base matrix of the LDPC matrix H, refer to the foregoing encoding method. Decoding may be performed based on a complete base graph or a complete base matrix, or decoding may be performed based on some rows or some columns in a complete base graph or a complete base matrix.

When the input sequence is to be encoded/decoded, the base matrix may be lifted based on Z to obtain the LDPC matrix H. A circular permutation matrix $h_{i,j}$ of size $Z \times Z$ is determined for each non-zero-element $P_{i,j}$ in the base matrix, where $h_{i,j}$ is a circular permutation matrix obtained by circularly shifting an identity matrix $P_{i,j}$ times. A non-zero-element $P_{i,j}$ is replaced with $h_{i,j}$, and a zero-element in a base matrix $H_B$ is replaced with an all zero matrix of size $Z \times Z$, to obtain the parity check matrix H.

In a possible implementation, the base matrix of the LDPC code may be stored in a memory, and the communications apparatus obtains the LDPC matrix corresponding to the lifting factor Z, to encode/decode the input sequence.

In a possible implementation, because there are a plurality of base matrices of the LDPC code, and relatively large storage space is occupied if the base matrices are stored based on a matrix structure, a base graph of the LDPC code may be stored in a memory, shift values of non-zero-elements in each base matrix may be stored by row or by column, and then the LDPC matrix may be obtained based on the base graph and shift values of the base matrix corresponding to the lifting factor Z.

A base graph may indicate positions of non-zero-elements of each base matrix. The obtaining the LDPC matrix based on the base graph and shift values of the base matrix corresponding to the lifting factor Z may further be: obtaining the LDPC matrix based on positions of non-zero-element and shift values of the base matrix corresponding to the lifting factor Z.

In another possible implementation, storing a base graph may be storing positions of non-zero-elements in the base graph. A position of a non-zero-element may be indicated by a row index and a column index in which the non-zero element is located. For example, positions of non-zero-elements may be column positions of non-zero-elements in each row, or row positions of non-zero-elements in each column. In another possible implementation, storing a base graph may be storing positions of zero-elements in the base graph. Likewise, a position of a zero-element may also be indicated by a row index and a column index in which the zero element is located. For example, positions of zero-elements may be column positions of zero-elements in each row, or row positions of zero-elements in each column is located, and corresponding positions of non-zero-elements may be obtained by excluding the positions of the zero-elements. It should be noted that only examples are provided herein, and the present application is not limited thereto.

In a possible implementation, shift values of non-zero-elements of each base matrix may be stored in manners of Table 2-10, Table 2-11, Table 3-10 to Table 3-80, Table 3-90, and Table 3-91, and used as parameters of the LDPC matrix. A column of "row weight" in Table 2-10, Table 2-11, Table 3-10 to Table 3-80, Table 3-90, and Table 3-91 is optional. In other words, optionally, the column of "row weight" may be stored or not stored. A quantity of non-zero-elements in a row is learned by using column positions of the non-zero-elements in the row. Therefore, a row weight is learned. In a possible implementation, parameter values in "column index of non-zero-element" in Table 2-10, Table 2-11, Table 3-10 to Table 3-80, Table 3-90, and Table 3-91 may not be sorted in ascending order provided that column positions of non-zero-elements can be retrieved by using the parameter values. In addition, parameter values in "shift values of non-zero-elements" in Table 2-10, Table 2-11, Table 3-10 to Table 3-80, Table 3-90, and Table 3-91 are not necessarily sorted based on a column order either provided that the parameter values in "shift values of non-zero-elements" are in one-to-one correspondence with the parameter values in "column positions of non-zero-elements" and provided that the communications apparatus can learn which row and which column a non-zero-element is in based on a shift value of the non-zero element. For example:

In a possible implementation, the related parameters of the LDPC matrix may be stored with reference to related descriptions in FIG. 5.

In a possible implementation, when the related parameters of the LDPC matrix are stored, the stored parameters may not comprises all of rows of the matrices shown in FIG. 1 to FIG. 3a, FIG. 3b-1 to FIG. 3b-10, or Table 2-10, Table 2-11, Table 3-10 to Table 3-80, Table 3-90, and Table 3-91, and a parameter indicated by a corresponding row in a table may be stored based on rows included in the base matrix. For example, a matrix including rows and columns included in the base matrix of the LDPC matrix described in the foregoing embodiment may be stored, or parameters related to the matrix including the rows and columns are stored.

For example, if the base matrix includes row 0 to row 4 and column 0 to column 26 in any one of the matrices 30b-10 to 30b-80 and the matrices shown in Table 3-90 and Table 3-91, a matrix including row 0 to row 4 and column 0 to column 26 may be stored, and/or parameters related to the matrix including row 0 to row 4 and column 0 to column 26 are stored. For details, refer to the parameters shown in Table 3-10 to Table 3-80, Table 3-90, and Table 3-91 and descriptions in the foregoing part.

If the base matrix includes row 0 to row (m−1) and column 0 to column (n−1) in any one of the matrices 30b-10 to 30b-80 and the matrices shown in Table 3-90 and Table 3-91, where 5≤m≤46, m is an integer, 27≤n≤68, n is an integer, a matrix including row 0 to row (m−1) and column 0 to column (n−1) may be stored, and/or parameters related to the matrix including row 0 to row (m−1) and column 0 to column (n−1) are stored. For details, refer to the parameters shown in Table 3-10 to Table 3-80, Table 3-90, and Table 3-91 and descriptions in the foregoing part.

In a possible implementation, each shift value greater than or equal to 0 and indicated by at least one position s of "column index of non-zero-element" in any one of Table 3-10 to Table 3-80, Table 3-90, and Table 3-91 may be increased or decreased by an offset $Offset_s$.

In a possible implementation, one or more transformed shift values described in the foregoing embodiment may be stored in "shift value of non-zero-element" in any one of Table 3-10 to Table 3-80, Table 3-90, and Table 3-91, for example, one or more shift values shown in FIG. 9.

In another design, the base graph of the LDPC matrix and the shift values of the LDPC matrix may be separately stored. Information about the shift values of the LDPC matrix may be stored by using row indexes and shift values of non-zero-elements in Table 3-10 to Table 3-91. The base graph of the LDPC may be stored in a plurality of manners, for example, may be stored in a matrix form of the base graph 30a shown in FIG. 3a, or may be stored based on the row indexes and positions of the non-zero-elements in Table 3-10 to Table 3-91, or may be stored in a manner in which 1 and 0 in each row or each column in a base graph may be considered as binary digits, and the base graph is stored in a form of decimal numbers or hexadecimal numbers to save storage space. The base graph 30a is used as an example. Positions of non-zero-elements in the first 26 columns or the first 27 columns may be stored in four hexadecimal numbers in each row. For example, if the first 26 columns in row 0 are 11110110 01111101 10111111 00, positions of non-zero-elements in row 0 may be denoted as 0xF6, 0x7D, 0xBF, and 0x00. To be specific, every eight columns form one hexadecimal number. 0 may be padded into the last two or three columns to obtain eight digits, so that a corresponding hexadecimal number is obtained. The same is true for another row, and details are not redundantly described herein again. It should be noted that only examples are provided herein, and the examples do not constitute a limitation.

FIG. 1 is used as an example. After the base matrix $H_B$ is determined, parity bits corresponding to column 22 to column 25 may be first obtained by using the input sequence and row 0 to row 3 and column 0 to column 25 in the base matrix, in other words, $H_{core\text{-}dual}$. Then, parity bits corresponding to column 26, in other words, a weight-1 column, may be obtained based on the input sequence and parity bits corresponding to $H_{core\text{-}dual}$, and then encoding may be performed based on the input sequence, the parity bits corresponding to column 22 to column 26, and the submatrix D, to obtain parity bits corresponding to the submatrix E. In this way, encoding is completed. For an encoding process of the LDPC code, refer to the descriptions in the foregoing implementations, and details are not redundantly described herein again.

In a possible implementation, the LDPC matrix H may be lifted with respect to the lifting factor based on the lifting factor Z before encoding, in other words, each shift value is replaced with a corresponding circular permutation matrix based on each shift value.

In another possible implementation, a shift value corresponding to a non-zero-element is obtained based on a position of the non-zero-element corresponding to bits to be encoded during encoding, and the non-zero-element is replaced with a corresponding circular permutation matrix and processing is performed.

In another possible implementation, the LDPC matrix H is not directly lifted during use, and bits in an input sequence is processed based on a connection relationship that is between rows and columns of an equivalent matrix and that is calculated based on shift values.

In another possible implementation, encoding may be performed by using a QSN method. For each to-be-processed non-zero-element, based on a shift value of the non-zero-element, a shift operation is performed on a to-be-encoded bit segment corresponding to the non-zero-element; and then, an encoding operation is performed on all bit segments on which the shift operation is performed.

In another possible implementation, a generator matrix G of the LDPC matrix H may also be stored, and the input sequence c and the output sequence d meet a formula (2):

$$d = c \cdot G \qquad (2)$$

If row/column permutation is performed on the LDPC matrix H to obtain H', where the right side of H' is an identity matrix I, and a left side matrix is P, H'=[P I], and the generator matrix G meet the following formula (3):

$$G = [I P^T] \qquad (3)$$

It should be noted that the foregoing description is an example, and the present application is not limited thereto.

Optionally, in a communications system, the LDPC code may be obtained after encoding is performed by using the foregoing method. After the LDPC code is obtained, the communications apparatus may further perform one or more of the following operations: performing rate matching on the LDPC code; performing, based on an interleaving scheme, interleaving on a rate-matched LDPC code; modulating, based on a modulation scheme, an interleaved LDPC code, to obtain a bit sequence X; and sending the bit sequence X.

Decoding is an inverse process of encoding, and the base matrix used during decoding and the base matrix during encoding have a same characteristic. For the encoding process of the LDPC code, refer to the descriptions in the foregoing implementations, and details are not redundantly described herein again. In an implementation, before decoding, the communications apparatus may further perform one or more of the following operations: receiving a signal obtained after LDPC code encoding; and performing demodulation, deinterleaving, and de-rate matching on the signal to obtain a soft value sequence of an LDPC code; and decoding the soft value sequence of the LDPC code.

The storing in this application may be storing in one or more memories. The one or more memories may be separately disposed, or may be integrated into the encoder, the decoder, a processor, a chip, the communications apparatus, or a terminal. Some of the one or more memories may be separately disposed, and the others may be integrated into the decoder, the processor, the chip, the communications apparatus, or the terminal. A type of the memory may be any form of storage medium, and this application is not limited thereto.

Figure 7:
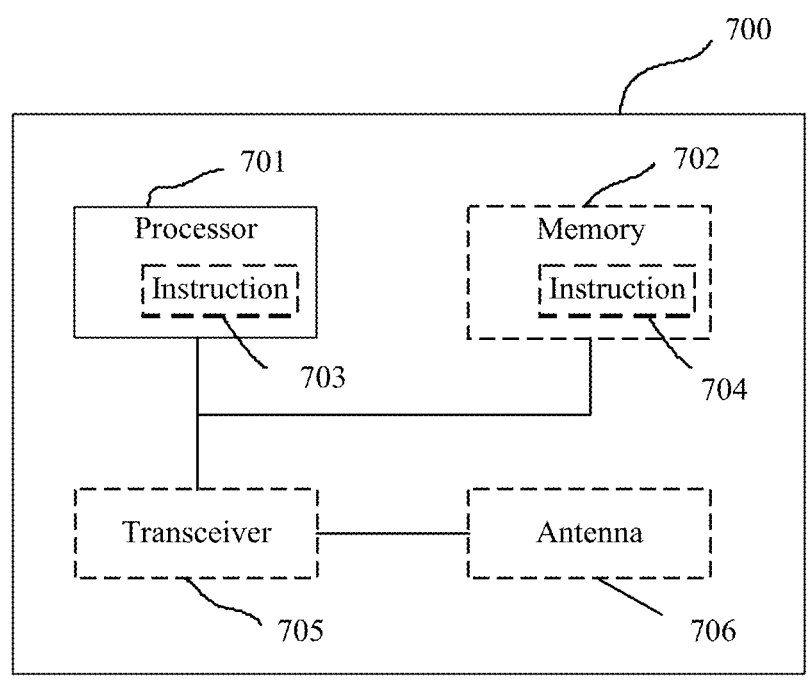

Corresponding to the designs of the data processing processes in FIG. 5 and FIG. 6, an embodiment of the present application further provides a corresponding communications apparatus. The communications apparatus includes modules configured to perform each part in FIG. 5 or FIG. 6. The module may be software, or may be hardware, or may be a combination of software and hardware. For example, the modules may include a memory, an electronic device, an electronic component, a logic circuit, or the like, or any combination thereof. FIG. 7 is a schematic structural diagram of a communications apparatus 700. The apparatus 700 may be configured to implement the method described in the foregoing method embodiment. For details, refer to the descriptions in the foregoing method embodiment. The communications apparatus 700 may be a chip, a base station, a terminal, or another network device.

The communications apparatus 700 includes one or more processors 701. The processor 701 may be a general-purpose processor, a special-purpose processor, or the like. For example, the processor 701 may be a baseband processor or a central processing unit. The baseband processor may be configured to process a communication protocol and communication data. The central processing unit may be configured to control the communications apparatus (such as the base station, the terminal, or the chip), execute a software program, and process data of the software program.

In a possible design, the one or more modules in FIG. 5 and FIG. 6 may be implemented by using one or more processors, or may be implemented by using one or more processors and one or more memories.

In a possible design, the communications apparatus 700 includes the one or more processors 701. The one or more processors 701 may implement functions of encoding/decoding. For example, the communications apparatus may be an encoder or a decoder. In another possible design, the processor 701 may implement other functions in addition to the functions of encoding/decoding.

The communications apparatus 700 encodes/decodes an input sequence based on an LDPC matrix. A base matrix of the LDPC matrix may be any base matrix in the foregoing examples, or a base matrix obtained by performing row permutation, or column permutation, or row permutation and column permutation on any base matrix in the foregoing examples, or a base matrix obtained by performing shortening or puncturing on any base matrix in the foregoing examples, or a matrix obtained by lifting any base matrix in the foregoing examples. For processing of encoding/decoding, refer to descriptions of related parts in FIG. 5 and FIG. 6, and details are not redundantly described herein again.

Optionally, in a design, the processor 701 may include an instruction 703 (sometimes also referred to as code or a program). The instruction may be run on the processor, so that the communications apparatus 700 performs the method described in the foregoing method embodiment. In another possible design, the communications apparatus 700 may also include a circuit, and the circuit may implement the functions of encoding/decoding in the foregoing embodiment.

Optionally, in a design, the communications apparatus 700 may include one or more memories 702. The memory stores an instruction 704, and the instruction may be run on the processor, so that the communications apparatus 700 performs the method described in the foregoing method embodiment.

Optionally, the memory may further store data. Optionally, the processor may further store an instruction and/or data. The processor and the memory may be separately disposed, or may be integrated together.

Optionally, the "storage" in the foregoing embodiment may be storing data in the memory 702, or may be storing data in another peripheral memory or storage device.

For example, the one or more memories 702 may store one or more parameters related to the LDPC matrix in the foregoing example, for example, the one or more parameters related to a base matrix such as shift values, a base graph, a lifted matrix based on a base graph, rows in the base matrix, a lifting factor, the base matrix, or a lifted matrix based on the base matrix. For details, refer to related descriptions in FIG. 5.

Optionally, the communications apparatus 700 may further include a transceiver 705 and an antenna 706. The processor 701 may be referred to as a processing unit, and control the communications apparatus (the terminal or the base station). The transceiver 705 may be referred to as a transceiver unit or a transceiver circuit, and is configured to implement a transceiving function of the communications apparatus by using the antenna 706.

Optionally, the communications apparatus 700 may further include a component configured to generate a transport block CRC, a component configured to perform code block segmentation and CRC check, an interleaver configured to perform interleaving, a component configured to perform rate matching, a modulator configured to perform modulation processing, or the like. Functions of these components may be implemented by the one or more processors 701.

Optionally, the communications apparatus 700 may further include a demodulator configured to perform demodulation, a deinterleaver configured to perform deinterleaving, a component configured to perform de-rate matching, a component configured to perform code block concatenation and CRC check, or the like. Functions of these components may be implemented by the one or more processors 701.

Figure 8:
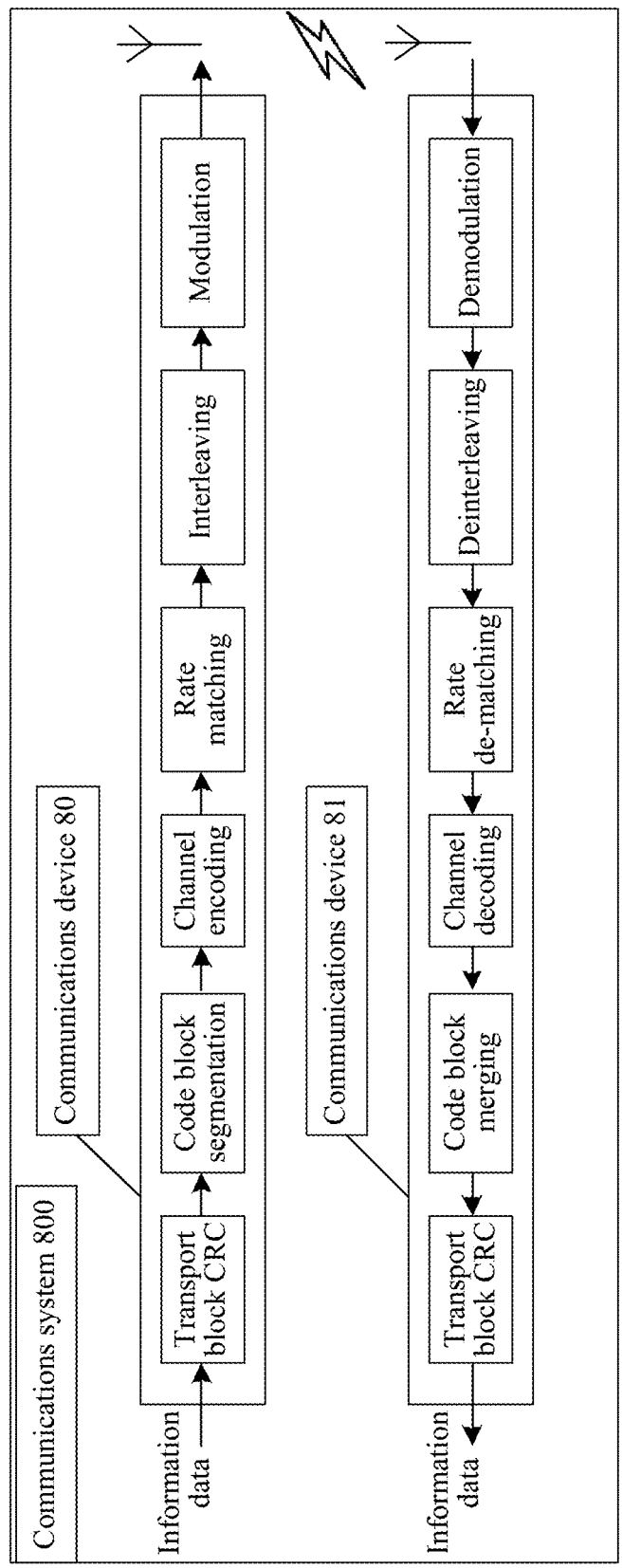

FIG. 8 is a schematic diagram of a communications system 800. The communications system 800 includes a communications device 80 and a communications device 81. The communications device 80 and the communications device 81 receive information data from each other and send information data to each other. The communications device 80 and the communications device 81 may be the communications apparatus 700, or the communications device 80 and the communications device 81 each include the communications apparatus 700, and receive and/or send information data. For example, the communications device 80 may be a terminal, and correspondingly, the communications device 81 may be a base station. For another example, the communications device 80 is a base station, and correspondingly, the communications device 81 may be a terminal.

A person skilled in the art may further understand that various illustrative logical blocks and steps that are listed in the embodiments of the present application may be implemented by using electronic hardware, computer software, or a combination thereof. Whether the functions are implemented by using hardware or software depends on particular applications and a design requirement of the entire system. A person skilled in the art may use various methods to implement the described functions for each particular application, but it should not be considered that the implementation goes beyond the scope of the present application.

The technologies described in this application may be implemented in various manners. For example, these technologies may be implemented by using hardware, software, or a combination thereof. For implementation by hardware, a processing unit configured to perform these technologies in a communications apparatus (for example, a base station, a terminal, a network entity, or a chip) may be implemented in one or more general-purpose processors, digital signal processors (DSP), digital signal processing devices (DSPD), application-specific integrated circuits (ASIC), Programmable Logic Devices (PLD), field programmable gate arrays (FPGA) or other programmable logical apparatuses, discrete gates or transistor logic, discrete hardware components, or any combination thereof. The general-purpose processor may be a microprocessor. Optionally, the general-purpose processor may be any conventional processor, controller, microcontroller, or state machine. The processor may be implemented by a combination of computing apparatuses, such as a digital signal processor and a microprocessor, a plurality of microprocessors, one or more microprocessors with a digital signal processor core, or any other similar configuration.

Steps of the methods or algorithms described in the embodiments of the present application may be directly embedded into hardware, an instruction executed by a processor, or a combination thereof. The memory may be a random access memory (RAM), a flash memory, a read-only memory (ROM), an erasable programmable read-only memory (EPROM), an electrically erasable programmable read-only memory (EEPROM), a register, a hard disk, a removable magnetic disk, a CD-ROM, or a storage medium of any other form in the art. For example, the memory may be connected to the processor, so that the processor can read information from the memory and write information to the memory. Optionally, the memory may be integrated into the processor. The processor and the memory may be disposed in an ASIC, and the ASIC may be disposed in a user equipment (UE). Optionally, the processor and the memory may be disposed in different components of UE.

Based on descriptions of the foregoing implementations, a person skilled in the art may clearly understand that exemplary embodiments may be implemented by hardware, firmware, or a combination thereof. For implementation by a software program, the implementation may be fully or partially in a form of a computer program product. The computer program product includes one or more computer instructions. When the computer instructions are loaded and executed on the computer, the procedure or functions according to the embodiments of the present application are all or partially generated. When the present application is implemented by a software program, the foregoing functions may be stored in a computer-readable medium or transmitted as one or more instructions or code in the computer-readable medium. The computer may be a general-purpose computer, a dedicated computer, a computer network, or another programmable apparatus. The computer instruction may be stored in a computer-readable storage medium, or may be transmitted from one computer-readable storage medium to another. The computer-readable medium includes a computer storage medium and a communications medium. The communications medium includes any medium that causes a computer program to be transmitted from one place to another. The storage medium may be any available medium accessible to a computer. The following provides an example but does not impose a limitation: The computer-readable medium may include a RAM, a ROM, an EEPROM, a CD-ROM or another optical disc storage, a disk storage medium or another magnetic storage device, or any other medium that can carry or store expected program code in a form of an instruction or a data structure and can be accessed by a computer. In addition, any connection may be appropriately defined as a computer-readable medium. For example, if software is transmitted from a website, a server, or another remote source by using a coaxial cable, an optical fiber/cable, a twisted pair, a digital subscriber line (DSL), or wireless technologies such as infrared ray, radio, and microwave, the coaxial cable, optical fiber/cable, twisted pair, DSL, or wireless technologies such as infrared ray, radio, and microwave are included in a definition of a medium to which they belong. For example, a disk and a disc used in the present application include a compact disc (CD), a laser disc, an optical disc, a digital versatile disc (DVD), a floppy disk, and a Blu-ray disc, where the disk generally copies data by a magnetic means, and the disc copies data optically by a laser means. The foregoing combination should also be included in the protection scope of the computer-readable medium.

It should be noted that, in this application, "/" indicates "and/or". For example, "encoding/decoding (encoding and/or decoding)" indicates encoding, or decoding, or encoding and decoding.

Described herein are merely exemplary embodiments of technical solutions of the present application, and the description of the exemplary embodiments is not intended to limit the protection scope of the present application. Any modification, equivalent replacement, or improvement made without departing from the spirit and principle of the present application may fall within the protection scope of the present application.

What is claimed is:

1. A method for channel coding in wireless communication, comprising:
   obtaining, by a communication apparatus, an input sequence, wherein the input sequence comprises K bits, and wherein K>1;
   encoding, by the communication apparatus, the input sequence using a matrix H to obtain an encoded sequence, wherein the encoded sequence comprises N bits, and wherein N>1; and
   outputting, by the communication apparatus, the encoded sequence;
   wherein the matrix H is determined according to a base matrix and a lifting factor Z, and wherein Z is a positive integer;
   wherein the base matrix comprises m rows and n columns, wherein m and n are integers;
   wherein each element in the base matrix corresponds to a respective row index i and a respective column index j, where $0 \le i < m$ and $0 \le j < n$;
   wherein each element in the base matrix is either a zero-element or a non-zero-element;
   wherein each zero-element in the base matrix corresponds to an all-zero matrix of size $Z \times Z$ in the matrix H, and each non-zero-element at row i and column j corresponds to a circular permutation matrix of size $Z \times Z$, wherein the circular permutation matrix is equal to a matrix obtained by circularly shifting an identity matrix of size $Z \times Z$ to the right for $P_{i,j}$ times, wherein $P_{i,j}=\mathrm{mod}(V_{i,j}, Z)$,
   wherein $V_{i,j}$ is a value corresponding to a non-zero-element at row i and column j, and wherein:
   with respect to row index i=0, for column indexes j=0, 1, 2, 3, 5, 6, 9, 10, 11, 12, 13, 15, 16, 18, 19, 20, 21, 22, 23, $V_{i,j}$ is respectively 211, 198, 188, 186, 219, 4, 29, 144, 116, 216, 115, 233, 144, 95, 216, 73, 261, 1, 0;
   with respect to row index i=1, for column indexes j=0, 2, 3, 4, 5, 7, 8, 9, 11, 12, 14, 15, 16, 17, 19, 21, 22, 23, 24, $V_{i,j}$ is respectively 179, 162, 223, 256, 160, 76, 202, 117, 109, 15, 72, 152, 158, 147, 156, 119, 0, 0, 0;
   with respect to row index i=2, for column indexes j=0, 1, 2, 4, 5, 6, 7, 8, 9, 10, 13, 14, 15, 17, 18, 19, 20, 24, 25, $V_{i,j}$ is respectively 258, 167, 220, 133, 243, 202, 218, 63, 0, 3, 74, 229, 0, 216, 269, 200, 234, 0, 0;
   with respect to row index i=3, for column indexes j=0, 1, 3, 4, 6, 7, 8, 10, 11, 12, 13, 14, 16, 17, 18, 20, 21, 22, 25, $V_{i,j}$ is respectively 187, 145, 166, 108, 82, 132, 197, 41, 162, 57, 36, 115, 242, 165, 0, 113, 108, 1, 0; and
   with respect to row index i=4, for column indexes j=0, 1, 26, $V_{i,j}$ is respectively 246, 235, 0.

2. The method according to claim 1, wherein N is equal to $66 \times Z$.

3. The method according to claim 1, wherein the input sequence is represented as $c=\{c_0, c_1, c_2, \ldots, c_{K-1}\}$, the encoded sequence is represented as $d=\{d_0, d_1, d_2, \ldots, d_{N-1}\}$, the encoded sequence d comprises $K_0$ bits from the input sequence c and $(N-K_0)$ parity bits in a parity sequence, and the parity sequence is represented as $w=\{w_0, w_1, w_2, \ldots, w_{N-K_0-1}\}$, wherein $K_0$ is an integer greater than 0 and less than or equal to K; and
   wherein the matrix H, the parity sequence w and the input sequence c meet:

$$H \times \begin{bmatrix} c^T \\ w^T \end{bmatrix} = 0^T,$$

wherein $c^T=[c_0, c_1, c_2, \ldots, c_{K-1}]^T$, $w^T=[w_0, w_1, w_2, \ldots, w_{N-K_0-1}]^T$, $0^T$ is a column vector, and values of all elements of $0^T$ are 0.

4. The method according to claim 3, wherein $K_0=K-2 \times Z$.

5. The method according to claim 1, wherein m=46 and n=68, and wherein:
   with respect to row index i=5, for column indexes j=0, 1, 3, 12, 16, 21, 22, 27, $V_{i,j}$ is respectively 261, 181, 72, 283, 254, 79, 144, 0;
   with respect to row index i=6, for column indexes j=0, 6, 10, 11, 13, 17, 18, 20, 28, $V_{i,j}$ is respectively 80, 144, 169, 90, 59, 177, 151, 108, 0;
   with respect to row index i=7, for column indexes j=0, 1, 4, 7, 8, 14, 29, $V_{i,j}$ is respectively 169, 189, 154, 184, 104, 164, 0;
   with respect to row index i=8, for column indexes j=0, 1, 3, 12, 16, 19, 21, 22, 24, 30, $V_{i,j}$ is respectively 54, 0, 252, 41, 98, 46, 15, 230, 54, 0;
   with respect to row index i=9, for column indexes j=0, 1, 10, 11, 13, 17, 18, 20, 31, $V_{i,j}$ is respectively 162, 159, 93, 134, 45, 132, 76, 209, 0;

with respect to row index i=10, for column indexes j=1, 2, 4, 7, 8, 14, 32, $V_{i,j}$ is respectively 178, 1, 28, 267, 234, 201, 0;

with respect to row index i=11, for column indexes j=0, 1, 12, 16, 21, 22, 23, 33, $V_{i,j}$ is respectively 55, 23, 274, 181, 273, 39, 26, 0;

with respect to row index i=12, for column indexes j=0, 1, 10, 11, 13, 18, 34, $V_{i,j}$ is respectively 225, 162, 244, 151, 238, 243, 0;

with respect to row index i=13, for column indexes j=0, 3, 7, 20, 23, 35, $V_{i,j}$ is respectively 231, 0, 216, 47, 36, 0;

with respect to row index i=14, for column indexes j=0, 12, 15, 16, 17, 21, 36, $V_{i,j}$ is respectively 0, 186, 253, 16, 0, 79, 0;

with respect to row index i=15, for column indexes j=0, 1, 10, 13, 18, 25, 37, $V_{i,j}$ is respectively 170, 0, 183, 108, 68, 64, 0;

with respect to row index i=16, for column indexes j=1, 3, 11, 20, 22, 38, $V_{i,j}$ is respectively 270, 13, 99, 54, 0, 0;

with respect to row index i=17, for column indexes j=0, 14, 16, 17, 21, 39, $V_{i,j}$ is respectively 153, 137, 0, 0, 162, 0;

with respect to row index i=18, for column indexes j=1, 12, 13, 18, 19, 40, $V_{i,j}$ is respectively 161, 151, 0, 241, 144, 0;

with respect to row index i=19, for column indexes j=0, 1, 7, 8, 10, 41, $V_{i,j}$ is respectively 0, 0, 118, 144, 0, 0;

with respect to row index i=20, for column indexes j=0, 3, 9, 11, 22, 42, $V_{i,j}$ is respectively 265, 81, 90, 144, 228, 0;

with respect to row index i=21, for column indexes j=1, 5, 16, 20, 21, 43, $V_{i,j}$ is respectively 64, 46, 266, 9, 18, 0;

with respect to row index i=22, for column indexes j=0, 12, 13, 17, 44, $V_{i,j}$ is respectively 72, 189, 72, 257, 0;

with respect to row index i=23, for column indexes j=1, 2, 10, 18, 45, $V_{i,j}$ is respectively 180, 0, 0, 165, 0;

with respect to row index i=24, for column indexes j=0, 3, 4, 11, 22, 46, $V_{i,j}$ is respectively 236, 199, 0, 266, 0, 0;

with respect to row index i=25, for column indexes j=1, 6, 7, 14, 47, $V_{i,j}$ is respectively 205, 0, 0, 183, 0;

with respect to row index i=26, for column indexes j=0, 2, 4, 15, 48, $V_{i,j}$ is respectively 0, 0, 0, 277, 0;

with respect to row index i=27, for column indexes j=1, 6, 8, 49, $V_{i,j}$ is respectively 45, 36, 72, 0;

with respect to row index i=28, for column indexes j=0, 4, 19, 21, 50, $V_{i,j}$ is respectively 275, 0, 155, 62, 0;

with respect to row index i=29, for column indexes j=1, 14, 18, 25, 51, $V_{i,j}$ is respectively 0, 180, 0, 42, 0;

with respect to row index i=30, for column indexes j=0, 10, 13, 24, 52, $V_{i,j}$ is respectively 0, 90, 252, 173, 0;

with respect to row index i=31, for column indexes j=1, 7, 22, 25, 53, $V_{i,j}$ is respectively 144, 144, 166, 19, 0;

with respect to row index i=32, for column indexes j=0, 12, 14, 24, 54, $V_{i,j}$ is respectively 0, 211, 36, 162, 0;

with respect to row index i=33, for column indexes j=1, 2, 11, 21, 55, $V_{i,j}$ is respectively 0, 0, 76, 18, 0;

with respect to row index i=34, for column indexes j=0, 7, 15, 17, 56, $V_{i,j}$ is respectively 197, 0, 108, 0, 0;

with respect to row index i=35, for column indexes j=1, 6, 12, 22, 57, $V_{i,j}$ is respectively 199, 278, 0, 205, 0;

with respect to row index i=36, for column indexes j=0, 14, 15, 18, 58, $V_{i,j}$ is respectively 216, 16, 0, 0, 0;

with respect to row index i=37, for column indexes j=1, 13, 23, 59, $V_{i,j}$ is respectively 72, 144, 0, 0;

with respect to row index i=38, for column indexes j=0, 9, 10, 12, 60, $V_{i,j}$ is respectively 190, 0, 0, 0, 0;

with respect to row index i=39, for column indexes j=1, 3, 7, 19, 61, $V_{i,j}$ is respectively 153, 0, 165, 117, 0;

with respect to row index i=40, for column indexes j=0, 8, 17, 62, $V_{i,j}$ is respectively 216, 144, 2, 0;

with respect to row index i=41, for column indexes j=1, 3, 9, 18, 63, $V_{i,j}$ is respectively 0, 0, 0, 183, 0;

with respect to row index i=42, for column indexes j=0, 4, 24, 64, $V_{i,j}$ is respectively 27, 0, 35, 0;

with respect to row index i=43, for column indexes j=1, 16, 18, 25, 65, $V_{i,j}$ is respectively 52, 243, 0, 270, 0;

with respect to row index i=44, for column indexes j=0, 7, 9, 22, 66, $V_{i,j}$ is respectively 18, 0, 0, 57, 0; and with respect to row index i=45, for column indexes j=1, 6, 10, 67, $V_{i,j}$ is respectively 168, 0, 144, 0.

6. The method according to claim 1, wherein Z is 9, 18, 36, 72, 144, or 288.

7. The method according to claim 1, wherein the matrix H is determined according to a transformed matrix of the base matrix, and wherein the transformed matrix is obtained by performing row transformation and/or column transformation on the base matrix.

8. The method according to claim 1, wherein 5≤m≤46, and 27≤n≤68.

9. A communication apparatus comprising at least one processor configured to:

obtain an input sequence, wherein the input sequence comprises K bits, and wherein K>1:

encode the input sequence using a matrix H to obtain an encoded sequence, wherein the encoded sequence comprises N bits, and wherein N>1; and output the encoded sequence;

wherein the matrix H is determined according to a base matrix and a lifting factor Z, and wherein Z is a positive integer;

wherein the base matrix comprises m rows and n columns, wherein m and n are integers;

wherein each element in the base matrix corresponds to a respective row index i and a respective column index j, where 0≤i<m and 0≤j<n;

wherein each element in the base matrix is either a zero-element or a non-zero-element;

wherein each zero-element in the base matrix corresponds to an all-zero matrix of size Z×Z in the matrix H, and each non-zero-element at row i and column j corresponds to a circular permutation matrix of size Z×Z, wherein the circular permutation matrix is equal to a matrix obtained by circularly shifting an identity matrix of size Z×Z to the right for $P_{i,j}$ times, wherein $P_{i,j}$=mod ($V_{i,j}$,Z), wherein $V_{i,j}$ is a value corresponding to a non-zero-element at row i and column j, and wherein:

with respect to row index i=0, for column indexes j=0, 1, 2, 3, 5, 6, 9, 10, 11, 12, 13, 15, 16, 18, 19, 20, 21, 22, 23, $V_{i,j}$ is respectively 211, 198, 188, 186, 219, 4, 29, 144, 116, 216, 115, 233, 144, 95, 216, 73, 261, 1, 0;

with respect to row index i=1, for column indexes j=0, 2, 3, 4, 5, 7, 8, 9, 11, 12, 14, 15, 16, 17, 19, 21, 22, 23, 24, $V_{i,j}$ is respectively 179, 162, 223, 256, 160, 76, 202, 117, 109, 15, 72, 152, 158, 147, 156, 119, 0, 0, 0;

with respect to row index i=2, for column indexes j=0, 1, 2, 4, 5, 6, 7, 8, 9, 10, 13, 14, 15, 17, 18, 19, 20, 24, 25, $V_{i,j}$ is respectively 258, 167, 220, 133, 243, 202, 218, 63, 0, 3, 74, 229, 0, 216, 269, 200, 234, 0, 0;

with respect to row index i=3, for column indexes j=0, 1, 3, 4, 6, 7, 8, 10, 11, 12, 13, 14, 16, 17, 18, 20, 21, 22, 25, $V_{i,j}$ is respectively 187, 145, 166, 108, 82, 132, 197, 41, 162, 57, 36, 115, 242, 165, 0, 113, 108, 1, 0; and with respect to row index i=4, for column indexes j=0, 1, 26, $V_{i,j}$ is respectively 246, 235, 0.

10. The apparatus according to claim 9, wherein N is equal to 66×Z.

11. The apparatus according to claim 9, the input sequence is represented as c={$c_0$, $c_1$, $c_2$, . . . , $c_{K-1}$}, the encoded sequence is represented as d={$d_0$, $d_1$, $d_2$, . . . , $d_{N-1}$}, the encoded sequence d comprises $K_0$ bits in the input sequence c and (N−$K_0$) parity bits in a parity sequence, and the parity sequence is represented as w={$w_0$, $w_1$, $w_2$, . . . , $w_{N-K_0-1}$}, wherein $K_0$ is an integer and 0<$K_0$≤K; and wherein the matrix H, the parity sequence w and the input sequence c meet:

$$H \times \begin{bmatrix} c^T \\ w^T \end{bmatrix} = 0^T,$$

wherein $c^T$=[$c_0$, $c_1$, $c_2$, . . . , $C_{K-1}$]$^T$, $w^T$=[$w_0$, $w_1$, $w_2$, . . . ,$w_{N-K_0-1}$]$^T$, $0^T$ is a column vector, and values of all elements of $0^T$ are 0.

12. The apparatus according to claim 11, wherein $K_0$=K−2×Z.

13. The apparatus according to claim 9, wherein m=46 and n=68, and wherein:

with respect to row index i=5, for column indexes j=0, 1, 3, 12, 16, 21, 22, 27, $V_{i,j}$ is respectively 261, 181, 72, 283, 254, 79, 144, 0;

with respect to row index i=6, for column indexes j=0, 6, 10, 11, 13, 17, 18, 20, 28, $V_{i,j}$ is respectively 80, 144, 169, 90, 59, 177, 151, 108, 0;

with respect to row index i=7, for column indexes j=0, 1, 4, 7, 8, 14, 29, $V_{i,j}$ is respectively 169, 189, 154, 184, 104, 164, 0;

with respect to row index i=8, for column indexes j=0, 1, 3, 12, 16, 19, 21, 22, 24, 30, $V_{i,j}$ is respectively 54, 0, 252, 41, 98, 46, 15, 230, 54, 0;

with respect to row index i=9, for column indexes j=0, 1, 10, 11, 13, 17, 18, 20, 31, $V_{i,j}$ is respectively 162, 159, 93, 134, 45, 132, 76, 209, 0;

with respect to row index i=10, for column indexes j=1, 2, 4, 7, 8, 14, 32, $V_{i,j}$ is respectively 178, 1, 28, 267, 234, 201, 0;

with respect to row index i=11, for column indexes j=0, 1, 12, 16, 21, 22, 23, 33, $V_{i,j}$ is respectively 55, 23, 274, 181, 273, 39, 26, 0;

with respect to row index i=12, for column indexes j=0, 1, 10, 11, 13, 18, 34, $V_{i,j}$ is respectively 225, 162, 244, 151, 238, 243, 0;

with respect to row index i=13, for column indexes j=0, 3, 7, 20, 23, 35, $V_{i,j}$ is respectively 231, 0, 216, 47, 36, 0;

with respect to row index i=14, for column indexes j=0, 12, 15, 16, 17, 21, 36, $V_{i,j}$ is respectively 0, 186, 253, 16, 0, 79, 0;

with respect to row index i=15, for column indexes j=0, 1, 10, 13, 18, 25, 37, $V_{i,j}$ is respectively 170, 0, 183, 108, 68, 64, 0;

with respect to row index i=16, for column indexes j=1, 3, 11, 20, 22, 38, $V_{i,j}$ is respectively 270, 13, 99, 54, 0, 0;

with respect to row index i=17, for column indexes j=0, 14, 16, 17, 21, 39, $V_{i,j}$ is respectively 153, 137, 0, 0, 162, 0;

with respect to row index i=18, for column indexes j=1, 12, 13, 18, 19, 40, $V_{i,j}$ is respectively 161, 151, 0, 241, 144, 0;

with respect to row index i=19, for column indexes j=0, 1, 7, 8, 10, 41, $V_1$, is respectively 0, 0, 118, 144, 0, 0;

with respect to row index i=20, for column indexes j=0, 3, 9, 11, 22, 42, $V_{i,j}$ is respectively 265, 81, 90, 144, 228, 0;

with respect to row index i=21, for column indexes j=1, 5, 16, 20, 21, 43, $V_{i,j}$ is respectively 64, 46, 266, 9, 18, 0;

with respect to row index i=22, for column indexes j=0, 12, 13, 17, 44, $V_{i,j}$ is respectively 72, 189, 72, 257, 0;

with respect to row index i=23, for column indexes j=1, 2, 10, 18, 45, $V_{i,j}$ is respectively 180, 0, 0, 165, 0;

with respect to row index i=24, for column indexes j=0, 3, 4, 11, 22, 46, $V_{i,j}$ is respectively 236, 199, 0, 266, 0, 0;

with respect to row index i=25, for column indexes j=1, 6, 7, 14, 47, $V_{i,j}$ is respectively 205, 0, 0, 183, 0;

with respect to row index i=26, for column indexes j=0, 2, 4, 15, 48, $V_{i,j}$ is respectively 0, 0, 0, 277, 0;

with respect to row index i=27, for column indexes j=1, 6, 8, 49, $V_{i,j}$ is respectively 45, 36, 72, 0;

with respect to row index i=28, for column indexes j=0, 4, 19, 21, 50, $V_{i,j}$ is respectively 275, 0, 155, 62, 0;

with respect to row index i=29, for column indexes j=1, 14, 18, 25, 51, $V_{i,j}$ is respectively 0, 180, 0, 42, 0;

with respect to row index i=30, for column indexes j=0, 10, 13, 24, 52, $V_{i,j}$ is respectively 0, 90, 252, 173, 0;

with respect to row index i=31, for column indexes j=1, 7, 22, 25, 53, $V_{i,j}$ is respectively 144, 144, 166, 19, 0;

with respect to row index i=32, for column indexes j=0, 12, 14, 24, 54, $V_{i,j}$ is respectively 0, 211, 36, 162, 0;

with respect to row index i=33, for column indexes j=1, 2, 11, 21, 55, $V_{i,j}$ is respectively 0, 0, 76, 18, 0;

with respect to row index i=34, for column indexes j=0, 7, 15, 17, 56, $V_{i,j}$ is respectively 197, 0, 108, 0, 0;

with respect to row index i=35, for column indexes j=1, 6, 12, 22, 57, $V_{i,j}$ is respectively 199, 278, 0, 205, 0;

with respect to row index i=36, for column indexes j=0, 14, 15, 18, 58, $V_{i,j}$ is respectively 216, 16, 0, 0, 0;

with respect to row index i=37, for column indexes j=1, 13, 23, 59, $V_{i,j}$ is respectively 72, 144, 0, 0;

with respect to row index i=38, for column indexes j=0, 9, 10, 12, 60, $V_{i,j}$ is respectively 190, 0, 0, 0, 0;

with respect to row index i=39, for column indexes j=1, 3, 7, 19, 61, $V_{i,j}$ is respectively 153, 0, 165, 117, 0;

with respect to row index i=40, for column indexes j=0, 8, 17, 62, $V_{i,j}$ is respectively 216, 144, 2, 0;

with respect to row index i=41, for column indexes j=1, 3, 9, 18, 63, $V_{i,j}$ is respectively 0, 0, 0, 183, 0;

with respect to row index i=42, for column indexes j=0, 4, 24, 64, $V_{i,j}$ is respectively 27, 0, 35, 0;

with respect to row index i=43, for column indexes j=1, 16, 18, 25, 65, $V_{i,j}$ is respectively 52, 243, 0, 270, 0;

with respect to row index i=44, for column indexes j=0, 7, 9, 22, 66, $V_{i,j}$ is respectively 18, 0, 0, 57, 0; and with respect to row index i=45, for column indexes j=1, 6, 10, 67, $V_{i,j}$ is respectively 168, 0, 144, 0.

14. The apparatus according to claim 9, wherein Z is 9, 18, 36, 72, 144, or 288.

15. The apparatus according to claim 9, wherein the matrix H is determined according to a transformed matrix of the base matrix, and wherein the transformed matrix is obtained by performing row transformation and/or column transformation on the base matrix.

16. The apparatus according to claim 9, wherein the at least one processor comprises one or more of the following:
   a central processing unit configured to execute instructions from a memory;
   a general-purpose processor;
   a digital signal processor;
   a digital signal processing device;
   an application-specific integrated circuit;
   a programmable logic device;
   a field programmable gate array; or
   a programmable logical apparatus.

17. The apparatus according to claim 9, further comprising:
   at least one memory configured to store the base matrix, the lifting factor Z or one or more circular permutation matrices.

18. The apparatus according to claim 9, further comprising:
   one or more memories configured to store parameters associated with the matrix H.

19. The apparatus according to claim 9, further comprising:
   a transceiver configured to transmit a signal comprising the encoded sequence.

20. The apparatus according to claim 9, wherein the apparatus is a network device or a terminal.

21. The apparatus according to claim 9, wherein 5≤m≤46, and 27≤n≤68.

22. A non-transitory computer-readable storage medium having processor-executable instructions stored thereon, wherein the processor-executable instructions, when executed by a processor, facilitate performance of the following:
   obtaining an input sequence, wherein the input sequence comprises K bits, and wherein K>1;
   encoding the input sequence using a matrix H to obtain an encoded sequence, wherein the encoded sequence comprises N bits, and wherein N>1; and
   outputting the encoded sequence;
   wherein the matrix H is determined according to a base matrix and a lifting factor Z, wherein Z is a positive integer;
   wherein the base matrix comprises m rows and n columns, wherein m and n are integers;
   wherein each element in the base matrix corresponds to a respective row index i and a respective column index j, where 0≤i<m and 0≤j<n;
   wherein each element in the base matrix is either a zero-element or a non-zero-element;
   wherein each zero-element in the base matrix corresponds to an all-zero matrix of size Z×Z in the matrix H, and each non-zero-element at row i and column j corresponds to a circular permutation matrix of size Z×Z, wherein the circular permutation matrix is equal to a matrix obtained by circularly shifting an identity matrix of size Z×Z to the right for $P_{i,j}$ times, wherein $P_{i,j}$=mod($V_{i,j}$, Z),
   wherein $V_{i,j}$ is a value corresponding to a non-zero-element at row i and column j, and wherein:
   with respect to row index i=0, for column indexes j=0, 1, 2, 3, 5, 6, 9, 10, 11, 12, 13, 15, 16, 18, 19, 20, 21, 22, 23, $V_{i,j}$ is respectively 211, 198, 188, 186, 219, 4, 29, 144, 116, 216, 115, 233, 144, 95, 216, 73, 261, 1, 0;
   with respect to row index i=1, for column indexes j=0, 2, 3, 4, 5, 7, 8, 9, 11, 12, 14, 15, 16, 17, 19, 21, 22, 23, 24, $V_{i,j}$ is respectively 179, 162, 223, 256, 160, 76, 202, 117, 109, 15, 72, 152, 158, 147, 156, 119, 0, 0, 0;
   with respect to row index i=2, for column indexes j=0, 1, 2, 4, 5, 6, 7, 8, 9, 10, 13, 14, 15, 17, 18, 19, 20, 24, 25, $V_{i,j}$ is respectively 258, 167, 220, 133, 243, 202, 218, 63, 0, 3, 74, 229, 0, 216, 269, 200, 234, 0, 0;
   with respect to row index i=3, for column indexes j=0, 1, 3, 4, 6, 7, 8, 10, 11, 12, 13, 14, 16, 17, 18, 20, 21, 22, 25, $V_{i,j}$ is respectively 187, 145, 166, 108, 82, 132, 197, 41, 162, 57, 36, 115, 242, 165, 0, 113, 108, 1, 0; and
   with respect to row index i=4, for column indexes j=0, 1, 26, $V_{i,j}$ is respectively 246, 235, 0.

23. The non-transitory computer-readable storage medium according to claim 22, wherein N is equal to 66×Z.

24. The non-transitory computer-readable storage medium according to claim 22, wherein the input sequence is represented as $c=\{c_0, c_1, c_2, \ldots, c_{K-1}\}$, the encoded sequence is represented as $d=\{d_0, d_1, d_2, \ldots, d_{N-1}\}$, the encoded sequence d comprises $K_0$ bits in the input sequence c and $(N-K_0)$ parity bits in a parity sequence, and the parity sequence is represented as $w=\{w_0, w_1, w_2, \ldots, w_{N-K_0-1}\}$, wherein $K_0$ is an integer and $0<K_0<K$; and
   wherein the matrix H, the parity sequence w and the input sequence c meet:

$$H \times \begin{bmatrix} c^T \\ w^T \end{bmatrix} = 0^T,$$

wherein $c^T=[c_0, c_1, c_2, \ldots, c_{N-K_0-1}]^T$, $w^T=[w_0, w_1, w_2, \ldots, w_{N-K_0-1}]^T$, $0^T$ is a column vector, and values of all elements of $0^T$ are 0.

25. The non-transitory computer-readable storage medium according to claim 24, wherein $K_0=K-2\times Z$.

26. The non-transitory computer-readable storage medium according to claim 22, wherein m=46 and n=68, and wherein:
   with respect to row index i=5, for column indexes j=0, 1, 3, 12, 16, 21, 22, 27, $V_{i,j}$ is respectively 261, 181, 72, 283, 254, 79, 144, 0;
   with respect to row index i=6, for column indexes j=0, 6, 10, 11, 13, 17, 18, 20, 28, $V_{i,j}$ is respectively 80, 144, 169, 90, 59, 177, 151, 108, 0;
   with respect to row index i=7, for column indexes j=0, 1, 4, 7, 8, 14, 29, $V_{i,j}$ is respectively 169, 189, 154, 184, 104, 164, 0;
   with respect to row index i=8, for column indexes j=0, 1, 3, 12, 16, 19, 21, 22, 24, 30, $V_{i,j}$ is respectively 54, 0, 252, 41, 98, 46, 15, 230, 54, 0;
   with respect to row index i=9, for column indexes j=0, 1, 10, 11, 13, 17, 18, 20, 31, $V_{i,j}$ is respectively 162, 159, 93, 134, 45, 132, 76, 209, 0;
   with respect to row index i=10, for column indexes j=1, 2, 4, 7, 8, 14, 32, $V_{i,j}$ is respectively 178, 1, 28, 267, 234, 201, 0;
   with respect to row index i=11, for column indexes j=0, 1, 12, 16, 21, 22, 23, 33, $V_{i,j}$ is respectively 55, 23, 274, 181, 273, 39, 26, 0;
   with respect to row index i=12, for column indexes j=0, 1, 10, 11, 13, 18, 34, $V_{i,j}$ is respectively 225, 162, 244, 151, 238, 243, 0;
   with respect to row index i=13, for column indexes j=0, 3, 7, 20, 23, 35, $V_{i,j}$ is respectively 231, 0, 216, 47, 36, 0;

with respect to row index i=14, for column indexes j=0, 12, 15, 16, 17, 21, 36, $V_{i,j}$ is respectively 0, 186, 253, 16, 0, 79, 0;

with respect to row index i=15, for column indexes j=0, 1, 10, 13, 18, 25, 37, $V_{i,j}$ is respectively 170, 0, 183, 108, 68, 64, 0;

with respect to row index i=16, for column indexes j=1, 3, 11, 20, 22, 38, $V_{i,j}$ is respectively 270, 13, 99, 54, 0, 0;

with respect to row index i=17, for column indexes j=0, 14, 16, 17, 21, 39, $V_{i,j}$ is respectively 153, 137, 0, 0, 162, 0;

with respect to row index i=18, for column indexes j=1, 12, 13, 18, 19, 40, $V_{i,j}$ is respectively 161, 151, 0, 241, 144, 0;

with respect to row index i=19, for column indexes j=0, 1, 7, 8, 10, 41, $V_{i,j}$ is respectively 0, 0, 118, 144, 0, 0;

with respect to row index i=20, for column indexes j=0, 3, 9, 11, 22, 42, $V_{i,j}$ is respectively 265, 81, 90, 144, 228, 0;

with respect to row index i=21, for column indexes j=1, 5, 16, 20, 21, 43, $V_{i,j}$ is respectively 64, 46, 266, 9, 18, 0;

with respect to row index i=22, for column indexes j=0, 12, 13, 17, 44, $V_{i,j}$ is respectively 72, 189, 72, 257, 0;

with respect to row index i=23, for column indexes j=1, 2, 10, 18, 45, $V_{i,j}$ is respectively 180, 0, 0, 165, 0;

with respect to row index i=24, for column indexes j=0, 3, 4, 11, 22, 46, $V_{i,j}$ is respectively 236, 199, 0, 266, 0, 0;

with respect to row index i=25, for column indexes j=1, 6, 7, 14, 47, $V_{i,j}$ is respectively 205, 0, 0, 183, 0;

with respect to row index i=26, for column indexes j=0, 2, 4, 15, 48, $V_{i,j}$ is respectively 0, 0, 0, 277, 0;

with respect to row index i=27, for column indexes j=1, 6, 8, 49, $V_{i,j}$ is respectively 45, 36, 72, 0;

with respect to row index i=28, for column indexes j=0, 4, 19, 21, 50, $V_{i,j}$ is respectively 275, 0, 155, 62, 0;

with respect to row index i=29, for column indexes j=1, 14, 18, 25, 51, $V_{i,j}$ is respectively 0, 180, 0, 42, 0;

with respect to row index i=30, for column indexes j=0, 10, 13, 24, 52, $V_{i,j}$ is respectively 0, 90, 252, 173, 0;

with respect to row index i=31, for column indexes j=1, 7, 22, 25, 53, $V_{i,j}$ is respectively 144, 144, 166, 19, 0;

with respect to row index i=32, for column indexes j=0, 12, 14, 24, 54, $V_{i,j}$ is respectively 0, 211, 36, 162, 0;

with respect to row index i=33, for column indexes j=1, 2, 11, 21, 55, $V_{i,j}$ is respectively 0, 0, 76, 18, 0;

with respect to row index i=34, for column indexes j=0, 7, 15, 17, 56, $V_{i,j}$ is respectively 197, 0, 108, 0, 0;

with respect to row index i=35, for column indexes j=1, 6, 12, 22, 57, $V_{i,j}$ is respectively 199, 278, 0, 205, 0;

with respect to row index i=36, for column indexes j=0, 14, 15, 18, 58, $V_{i,j}$ is respectively 216, 16, 0, 0, 0;

with respect to row index i=37, for column indexes j=1, 13, 23, 59, $V_{i,j}$ is respectively 72, 144, 0, 0;

with respect to row index i=38, for column indexes j=0, 9, 10, 12, 60, $V_{i,j}$ is respectively 190, 0, 0, 0, 0;

with respect to row index i=39, for column indexes j=1, 3, 7, 19, 61, $V_{i,j}$ is respectively 153, 0, 165, 117, 0;

with respect to row index i=40, for column indexes j=0, 8, 17, 62, $V_{i,j}$ is respectively 216, 144, 2, 0;

with respect to row index i=41, for column indexes j=1, 3, 9, 18, 63, $V_{i,j}$ is respectively 0, 0, 0, 183, 0;

with respect to row index i=42, for column indexes j=0, 4, 24, 64, $V_{i,j}$ is respectively 27, 0, 35, 0;

with respect to row index i=43, for column indexes j=1, 16, 18, 25, 65, $V_{i,j}$ is respectively 52, 243, 0, 270, 0;

with respect to row index i=44, for column indexes j=0, 7, 9, 22, 66, $V_{i,j}$ is respectively 18, 0, 0, 57, 0; and with respect to row index i=45, for column indexes j=1, 6, 10, 67, $V_{i,j}$ is respectively 168, 0, 144, 0.

27. The non-transitory computer-readable storage medium according to claim 22, wherein Z is 9, 18, 36, 72, 144, or 288.

28. The non-transitory computer-readable storage medium according to claim 22, wherein 5≤m≤46, and 27≤n≤68.

* * * * *

UNITED STATES PATENT AND TRADEMARK OFFICE
CERTIFICATE OF CORRECTION

PATENT NO. : 10,784,893 B2
APPLICATION NO. : 16/525076
DATED : September 22, 2020
INVENTOR(S) : Ma et al.

Page 1 of 1

It is certified that error appears in the above-identified patent and that said Letters Patent is hereby corrected as shown below:

On the Title Page

Other Publications: -- "On NR LDPC design and performance," 3GPP TSG-RAN WG1 Meeting NR#2, Qingdao, China, R1-1710829, pp. 1-6, 3rd Generation Partnership Project, Valbonne, France (June 27-30, 2017). -- should be listed as a reference.

Other Publications: -- "LDPC design for base graph 1," 3GPP TSG RAN WG1 Meeting AH#2, Qingdao, China, R1-1711727, pp. 1-4, 3rd Generation Partnership Project, Valbonne, France (June 27-30, 2017). -- should be listed as a reference.

Other Publications: -- "3rd Generation Partnership Project; Technical Specification Group Radio Access Network; NR; Multiplexing and channel coding (Release 15)," 3GPP TS 38.212 V15.0.1, pp. 1-86, 3rd Generation Partnership Project, Valbonne, France (February 2018). -- should be listed as a reference.

Other Publications: -- "PCM for BG1_alt1," XP55705524A, pp. 1-20, pp. 1-20, 3rd Generation Partnership Project, Valbonne France (June 2017). -- should be listed as a reference.

Other Publications: -- "Merged LDPC BG1 alternative PCM," XP055705338, pp. 1-19, 3rd Generation Partnership Project, Valbonne France (June 2017). -- should be listed as a reference.

In the Claims

Claim 9: Column 50, Line 31: "comprises K bits, and wherein K>1:" should read -- comprises K bits, and wherein K>1; --.

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*